(12) United States Patent
Huynh

(10) Patent No.: US 12,308,851 B2
(45) Date of Patent: *May 20, 2025

(54) COMPANDING ANALOG CURRENT TO DIGITAL CONVERTER

(71) Applicant: SIGMASENSE, LLC., Wilmington, DE (US)

(72) Inventor: Phuong Huynh, Fairfax, VA (US)

(73) Assignee: SIGMASENSE, LLC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/529,134

(22) Filed: Dec. 5, 2023

(65) Prior Publication Data

US 2024/0113719 A1 Apr. 4, 2024

Related U.S. Application Data

(63) Continuation of application No. 18/092,959, filed on Jan. 4, 2023, now Pat. No. 11,863,197, which is a
(Continued)

(51) Int. Cl.
*H03M 1/06* (2006.01)
*H03M 1/12* (2006.01)
(Continued)

(52) U.S. Cl.
CPC ....... *H03M 1/0626* (2013.01); *H03M 1/1245* (2013.01); *H03M 1/462* (2013.01);
(Continued)

(58) Field of Classification Search
CPC .... H03M 1/0626; H03M 1/464; H03M 1/462; H03M 1/1245; H03M 3/32; H03M 3/476;
(Continued)

(56) References Cited

U.S. PATENT DOCUMENTS

| 5,437,178 A | 8/1995 | Esin et al. |
|---|---|---|
| 6,218,972 B1 | 4/2001 | Groshong |

(Continued)

FOREIGN PATENT DOCUMENTS

| CN | 104536627 A | 4/2015 |
|---|---|---|
| CN | 107771273 A | 3/2018 |

(Continued)

OTHER PUBLICATIONS

Baker; How delta-sigma ADCs work, Part 1; Analog Applications Journal; Oct. 1, 2011; 6 pgs.

(Continued)

*Primary Examiner* — Khai M Nguyen
(74) *Attorney, Agent, or Firm* — Garlick & Markison; Timothy W. Markison; Shayne X. Short

(57) ABSTRACT

An analog to digital converter (ADC) senses an analog signal (e.g., a load current) to generate a digital signal. The ADC operates based on a load voltage produced based on charging of an element (e.g., a capacitor) by a load current and a digital to analog converter (DAC) output current (e.g., from a N-bit DAC). The ADC generates a digital output signal representative of a difference between the load voltage and a reference voltage. This digital output signal is used directly, or after digital signal processing, to operate an N-bit DAC to generate a DAC output current that tracks the load current. The digital output signal provided to the N-bit DAC is an inverse function of the load current. The ADC is operative to sense very low currents (e.g., currents as low as is of pico-amps) and consume very little power (e.g., less than 2 µW).

20 Claims, 35 Drawing Sheets

Related U.S. Application Data continuation of application No. 17/503,435, filed on Oct. 18, 2021, now Pat. No. 11,569,828, which is a continuation of application No. 17/083,463, filed on Oct. 29, 2020, now Pat. No. 11,152,948, which is a continuation of application No. 16/678,793, filed on Nov. 8, 2019, now Pat. No. 10,862,492.

(51) Int. Cl.
    *H03M 1/46*     (2006.01)
    *H03M 1/84*     (2006.01)
    *H03M 3/00*     (2006.01)

(52) U.S. Cl.
    CPC .............. *H03M 1/464* (2013.01); *H03M 1/84* (2013.01); *H03M 3/32* (2013.01); *H03M 3/43* (2013.01); *H03M 3/462* (2013.01); *H03M 3/476* (2013.01)

(58) Field of Classification Search
    CPC .......... H03M 1/84; H03M 3/43; H03M 3/462; G06F 3/044; G06F 2203/041
    USPC .................................................. 341/143, 172
    See application file for complete search history.

(56) References Cited

U.S. PATENT DOCUMENTS

| | | | |
|---|---|---|---|
| 6,665,013 B1 | 12/2003 | Fossum et al. | |
| 7,301,350 B2 * | 11/2007 | Hargreaves | G01R 27/2605 |
| | | | 324/678 |
| 7,476,233 B1 | 1/2009 | Wiener et al. | |
| 7,528,755 B2 | 5/2009 | Hammerschmidt | |
| 8,031,094 B2 | 10/2011 | Hotelling | |
| 8,089,289 B1 * | 1/2012 | Kremin | G01D 5/24 |
| | | | 324/678 |
| 8,279,180 B2 | 10/2012 | Hotelling et al. | |
| 8,547,114 B2 | 10/2013 | Kremin | |
| 8,625,726 B2 | 1/2014 | Kuan | |
| 9,201,547 B2 | 12/2015 | Elias | |
| 2003/0052657 A1 | 3/2003 | Koernle et al. | |
| 2005/0235758 A1 | 10/2005 | Kowal et al. | |
| 2011/0063154 A1 | 3/2011 | Hotelling et al. | |
| 2011/0298745 A1 | 12/2011 | Souchkov | |
| 2012/0319878 A1 | 12/2012 | Bogner et al. | |
| 2013/0278447 A1 | 10/2013 | Kremin | |
| 2014/0085985 A1 | 3/2014 | Pan et al. | |
| 2016/0013804 A1 | 1/2016 | Peluso | |
| 2016/0188049 A1 | 6/2016 | Yang et al. | |
| 2018/0157354 A1 | 6/2018 | Blondin et al. | |
| 2018/0275824 A1 | 9/2018 | Li | |
| 2019/0296755 A1 | 9/2019 | Mirhaj et al. | |

FOREIGN PATENT DOCUMENTS

| | | |
|---|---|---|
| EP | 2284637 A1 | 2/2011 |
| KR | 20180058204 A | 5/2018 |

OTHER PUBLICATIONS

Brian Pisani, Digital Filter Types in Delta-Sigma ADCs, Application Report SBAA230, May 2017, pp. 1-8, Texas Instruments Incorporated, Dallas, Texas.

European Patent Office; Extended European Search Report; Application No. 19853507.2; Jun. 13, 2023; 7 pgs.

International Searching Authority; International Search Report; International Application No. PCT/US2020/058790; Feb. 22, 2021; 7 pgs.

* cited by examiner computing device 12

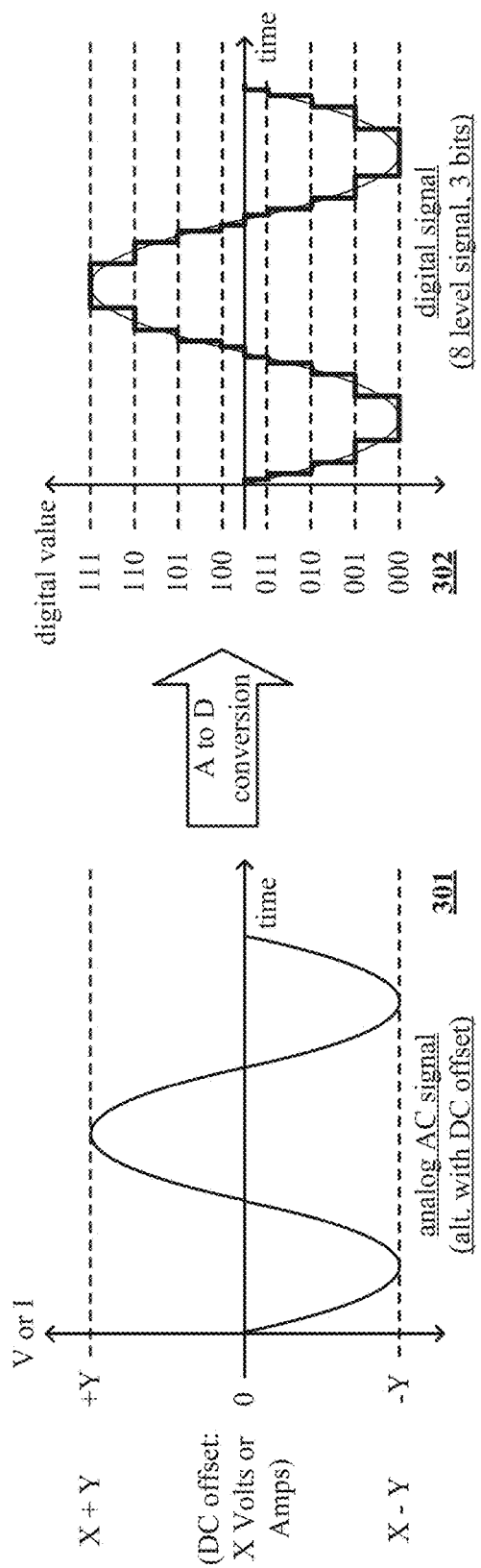
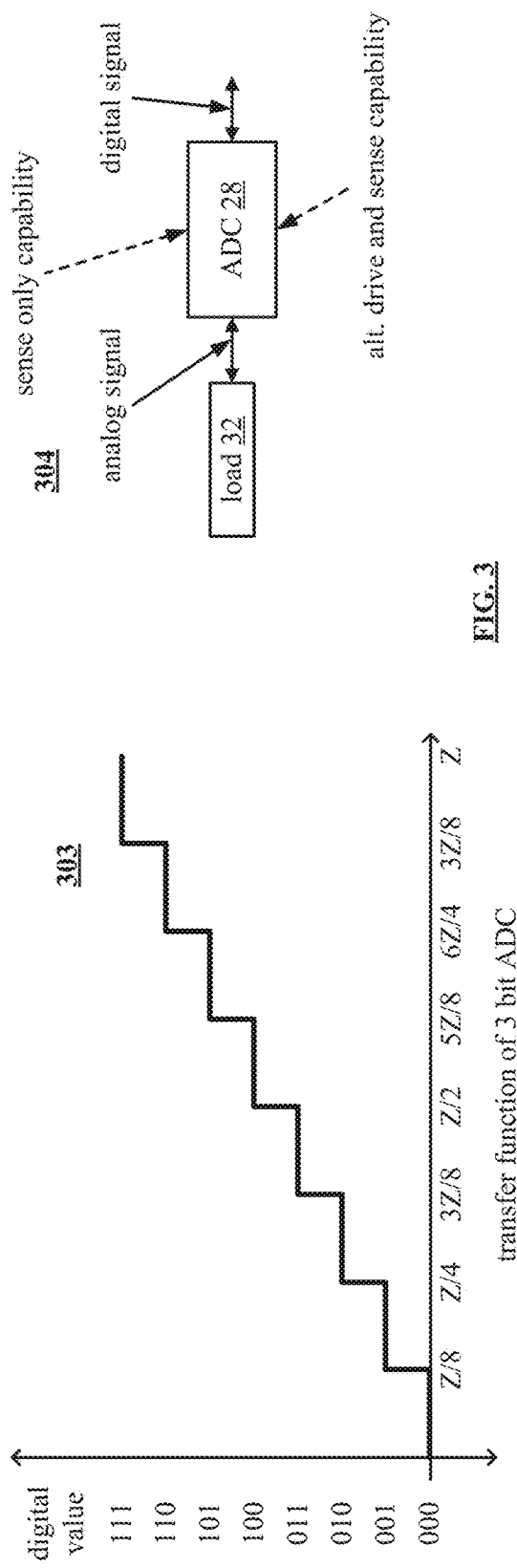
FIG. 3

400

600

800

1000

1100

1300

1401

1402

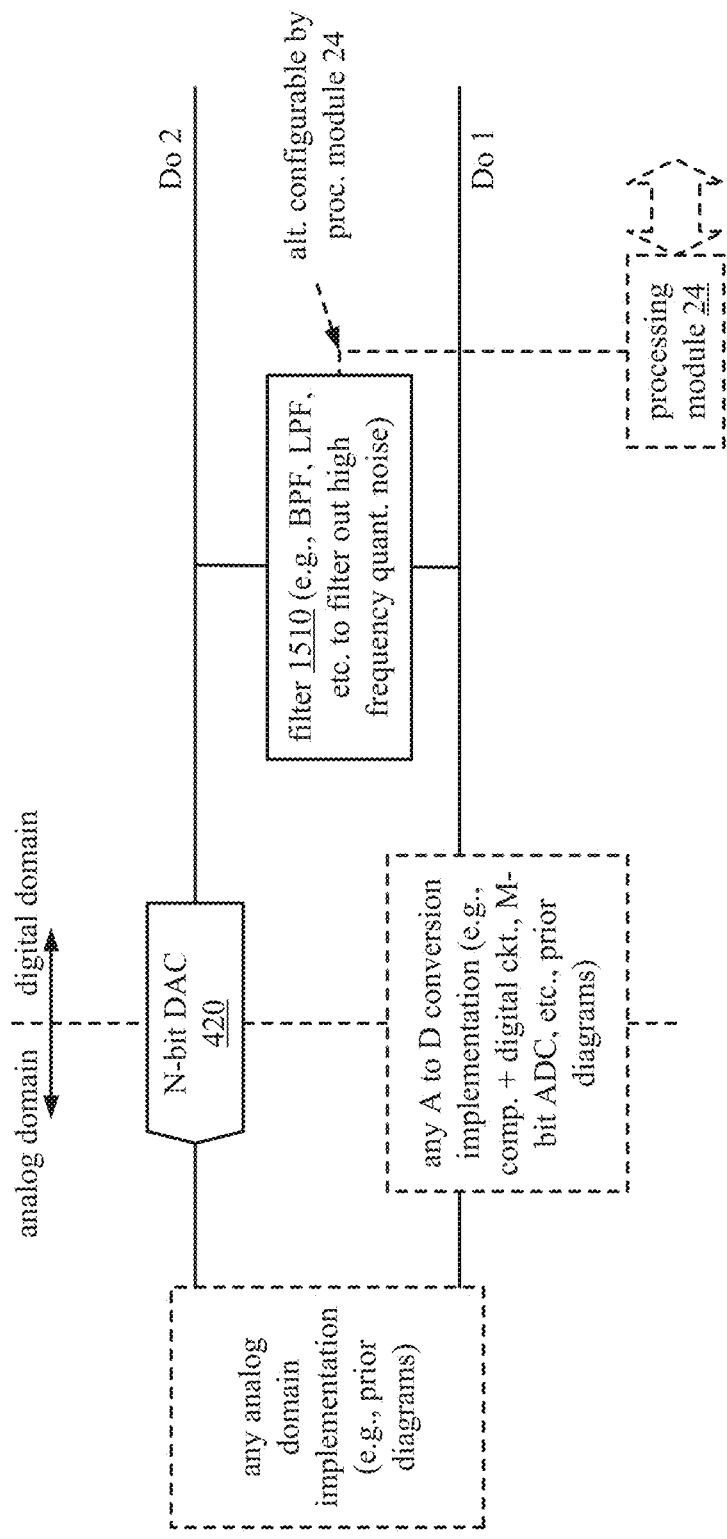

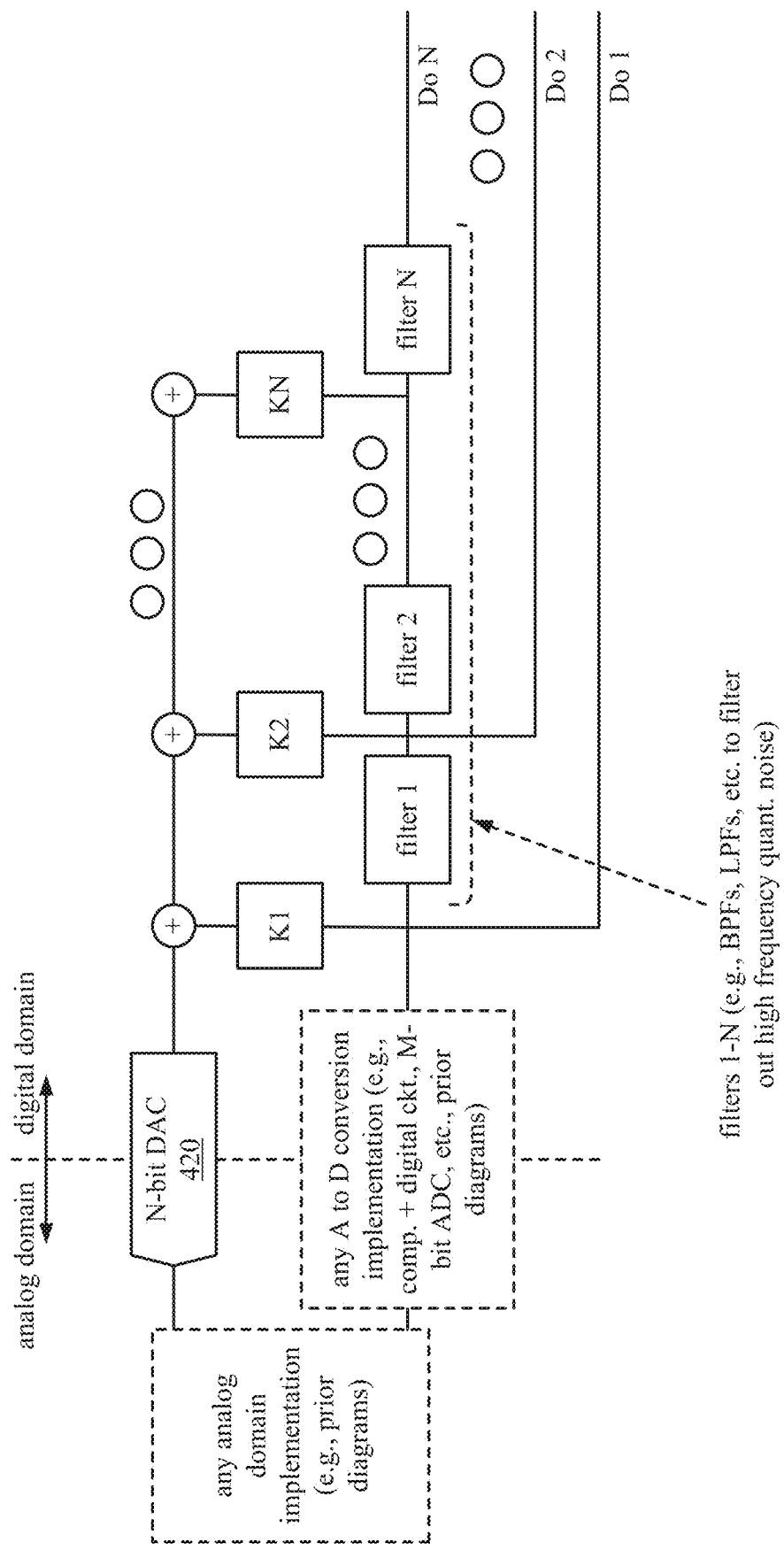

1700

1900

2000

2100

2200

2300

2400

2500

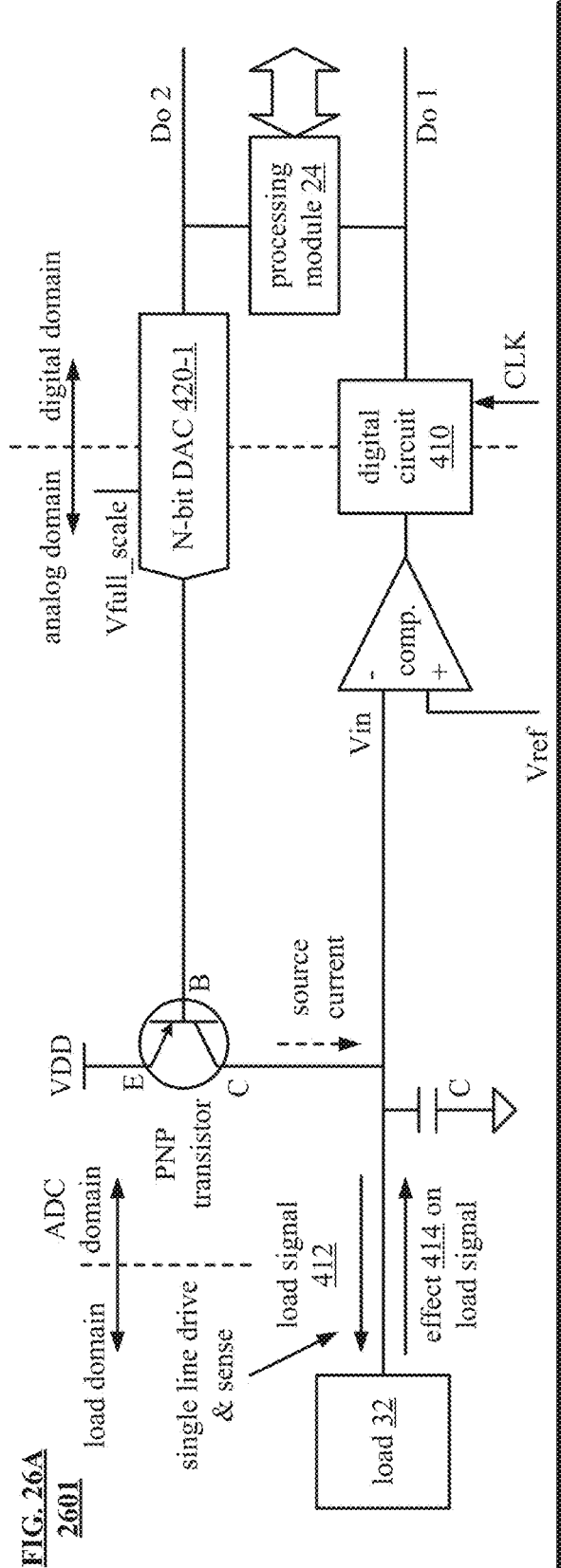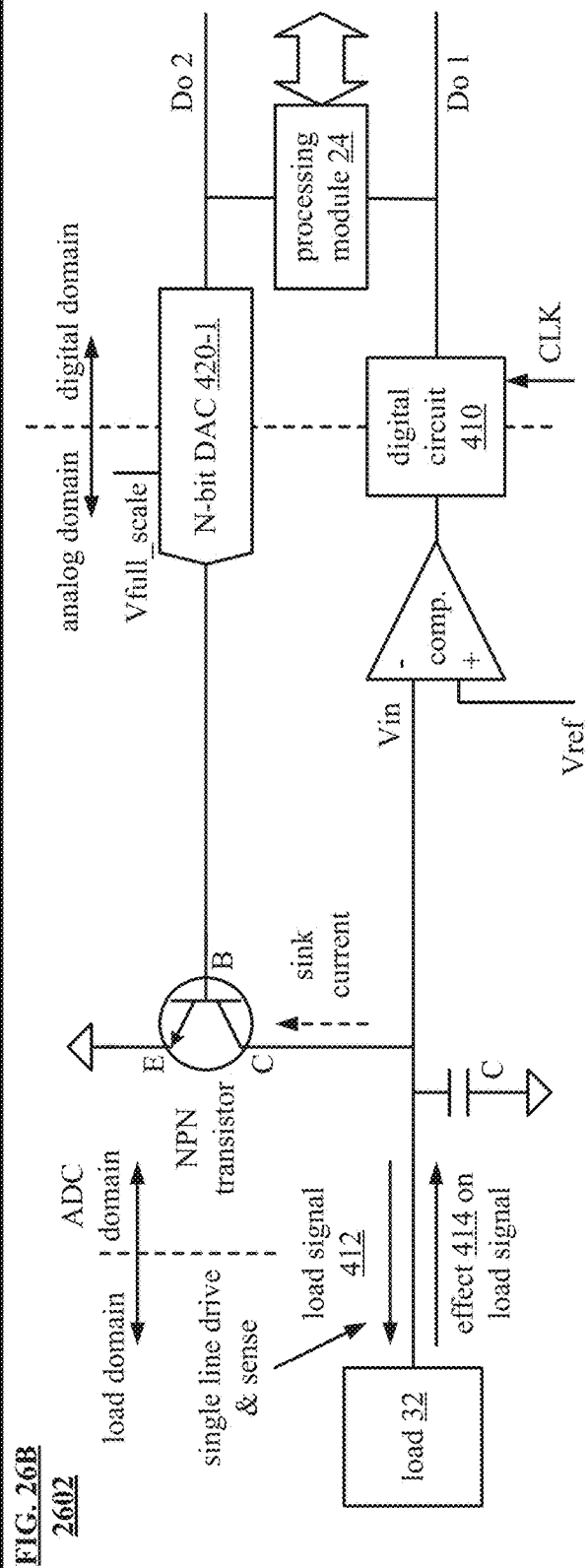
FIG. 26A 2601
FIG. 26B 2602

2700

2801

2803

2802

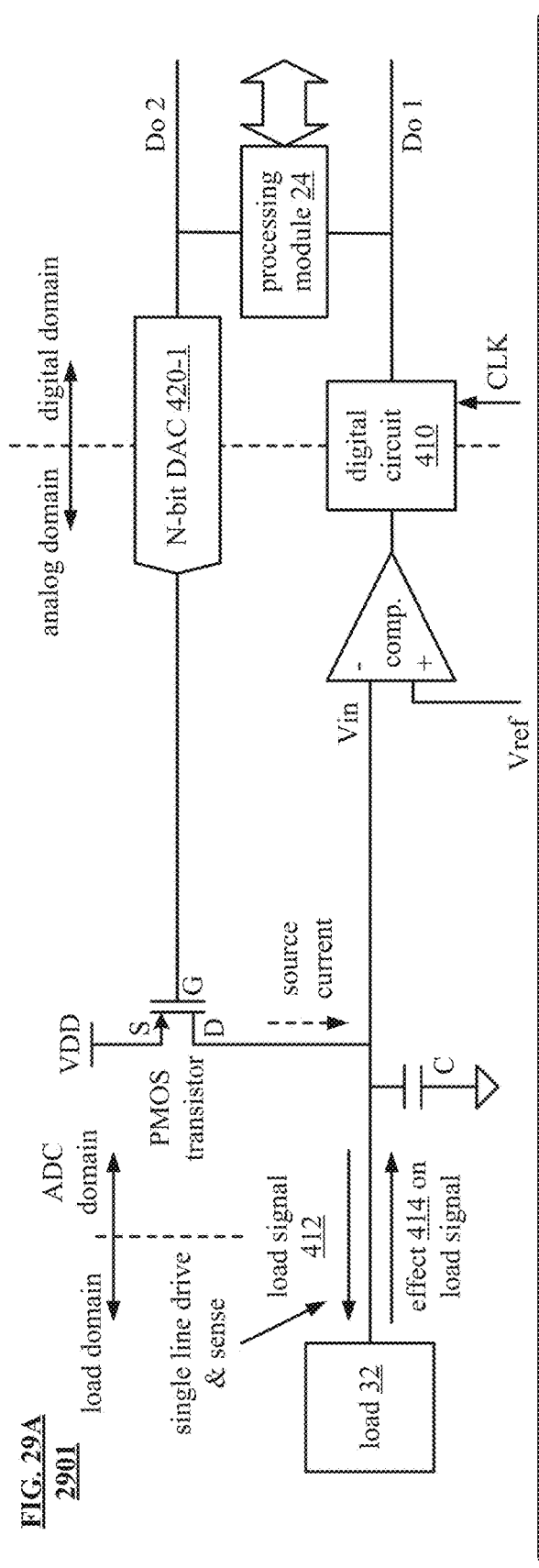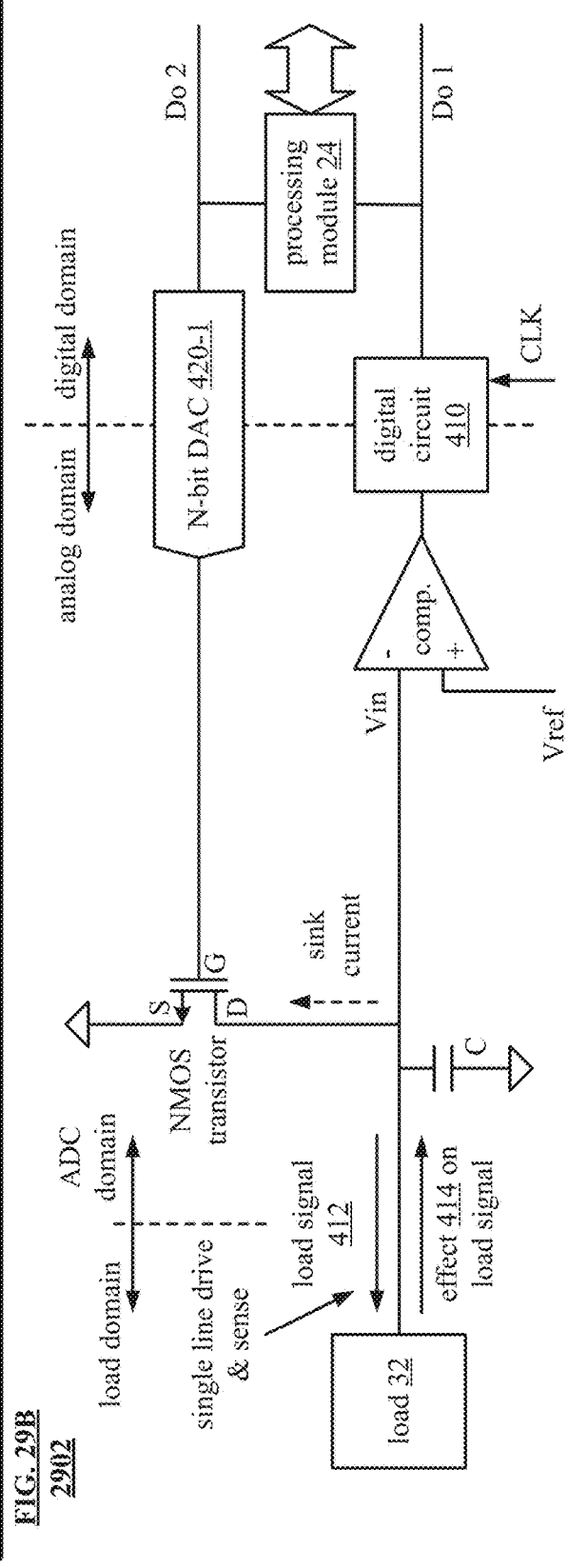

COMPANDING ANALOG CURRENT TO DIGITAL CONVERTER

CROSS REFERENCE TO RELATED PATENTS

The present U.S. Utility Patent application claims priority pursuant to 35 U.S.C. § 120 as a continuation of U.S. Utility application Ser. No. 18/092,959, entitled "Current Operative Analog to Digital Converter (ADC)," filed Jan. 4, 2023, pending, which claims priority pursuant to 35 U.S.C. § 120 as a continuation of U.S. Utility application Ser. No. 17/503,435, entitled "Current Operative Analog to Digital Converter (ADC)," filed Oct. 18, 2021, now issued as U.S. Pat. No. 11,569,828 on Jan. 31, 2023, which is a continuation of U.S. Utility application Ser. No. 17/083,463, entitled "Current Operative Analog to Digital Converter (ADC)," filed Oct. 29, 2020, now issued as U.S. Pat. No. 11,152,948 on Oct. 19, 2021, which is a continuation of U.S. Utility application Ser. No. 16/678,793, entitled "Current Operative Analog to Digital Converter (ADC)," filed Nov. 8, 2019, now issued as U.S. Pat. No. 10,862,492 on Dec. 8, 2020, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to analog to digital conversion and more particularly to analog to digital converters (ADCs) and associated circuits, and architectures.

Description of Related Art

Within many electrical and electronic systems, conversion of signals between the analog domain and the digital domain, and vice versa, is performed. For example, sensors may be implemented to detect one or more conditions such as environmental conditions, operating conditions, device conditions, etc. Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touchscreen. As yet another example, the computing device processes the sensor signals to determine various data points in a production line of a product.

In addition, within the operation of many devices and systems, conversion between the analog domain and the digital domain, and vice versa, is performed in accordance with the operation of such devices and systems. For example, many devices and systems operate using one or more digital signal processors (DSPs), microcontrollers, processors, etc. that operate within the digital domain. However, within certain devices and systems, one or more signals are received being in analog or continuous-time format. In order to utilize such one or more signals, they must be converted to being in digital or discrete-time format. Prior art analog to digital converters (ADCs) have many deficiencies including being highly consumptive of power, providing relatively low resolution, etc. There continues to be many applications that may not be appropriately service and provide high levels of performance using prior art ADCs. For example, certain applications do not have adequate power budget to facilitate effective operation of prior art ADCs. Also, certain applications cannot operate with high levels of performance based on the level of resolution and accuracy provided by prior art ADCs.

BRIEF DESCRIPTION OF THE SEVERAL VIEWS OF THE DRAWING(S)

FIG. 3 is a schematic block diagram showing various embodiments of analog to digital conversion as may be performed in accordance with the present invention;

FIG. 15 is a schematic block diagram showing an embodiment of digital domain filtering within an ADC in accordance with the present invention;

FIG. 16 is a schematic block diagram showing an embodiment of digital domain filtering using cascaded filters within an ADC in accordance with the present invention;

FIG. 26A is a schematic block diagram of an embodiment an ADC that includes a PNP transistor (alternatively, Positive-Negative-Positive Bipolar Junction Transistor (BJT)) implemented to source current in accordance with the present invention;

FIG. 26B is a schematic block diagram of an embodiment an ADC that includes an NPN transistor (alternatively, Negative-Positive-Positive BJT) implemented to sink current in accordance with the present invention;

FIG. 29A is a schematic block diagram of an embodiment an ADC that includes a P-channel or P-type metal-oxide-semiconductor field-effect transistor (MOSFET) (alternatively, PMOS transistor) implemented to source current in accordance with the present invention;

FIG. 29B is a schematic block diagram of an embodiment an ADC that includes an N-channel or N-type metal-oxide-semiconductor field-effect transistor (MOSFET) (alternatively, NMOS transistor) implemented to sink current in accordance with the present invention;

FIG. 32 is a schematic block diagram showing an embodiment of digital domain filtering using cascaded filters within an ADC that includes a non-linear N-bit DAC in accordance with the present invention;

Figure 33:
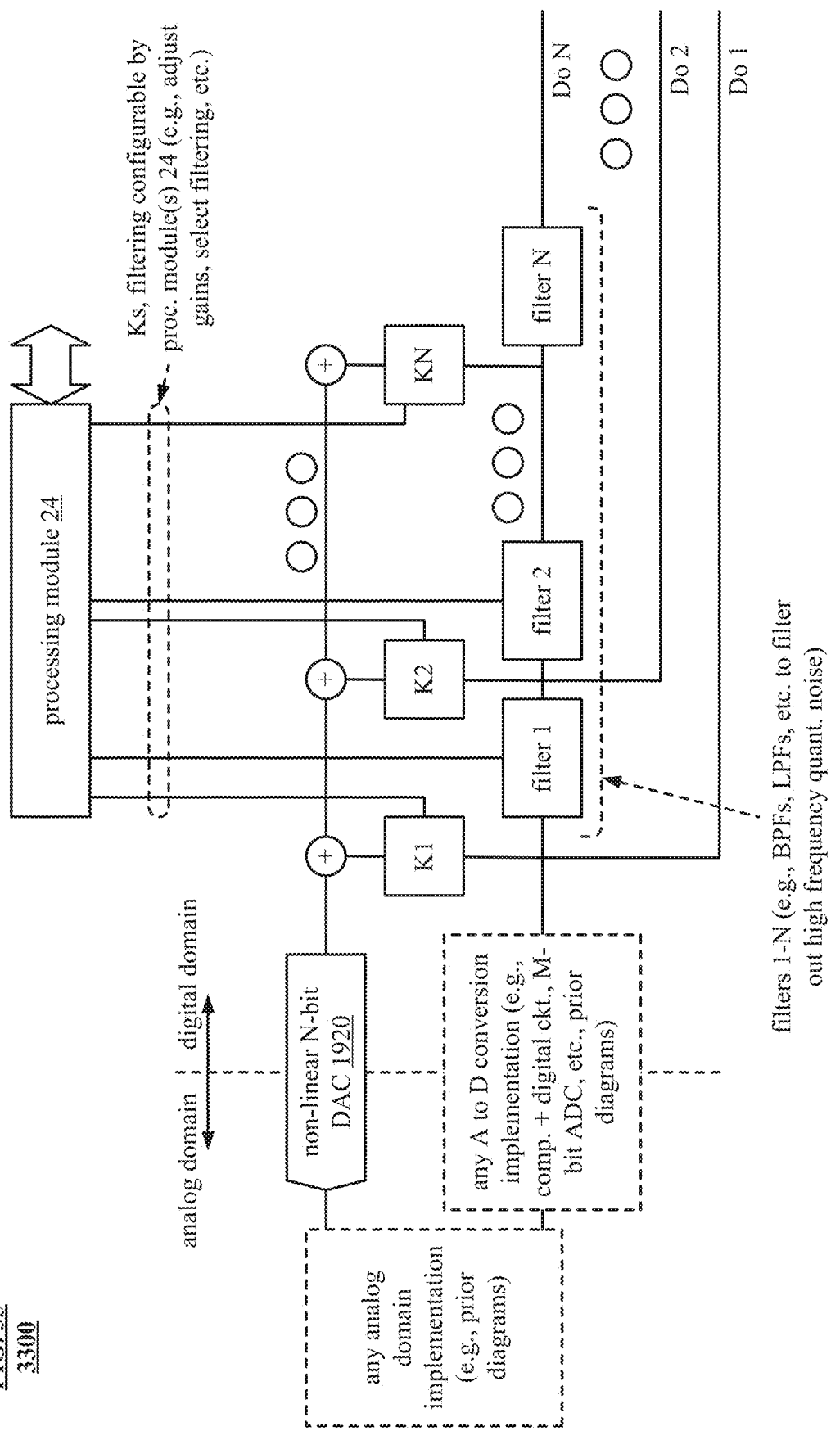
Figure 34:
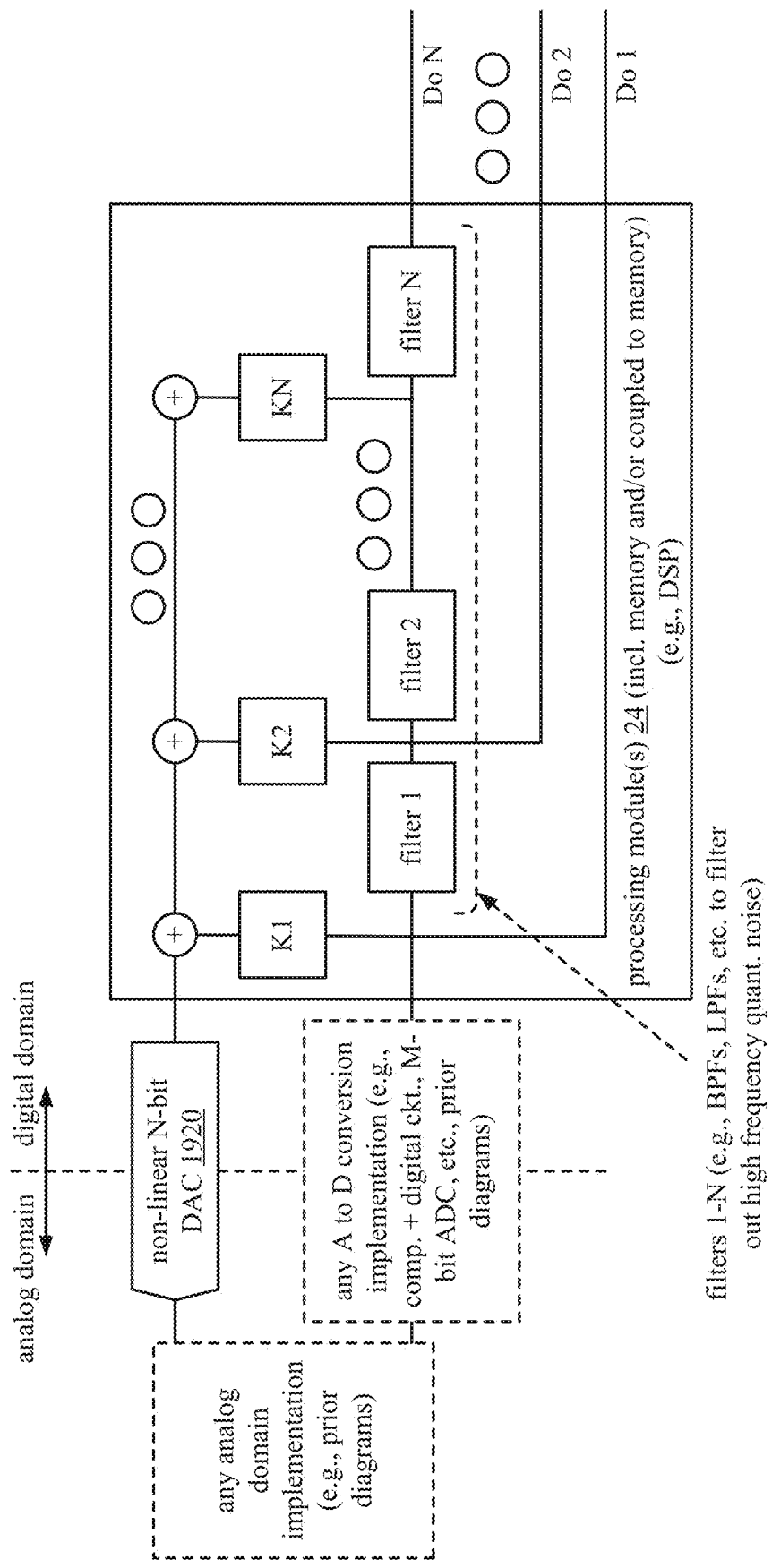

FIG. 33 is a schematic block diagram showing another embodiment of digital domain filtering using configurable/adjustable cascaded filters within an ADC that includes a non-linear N-bit DAC in accordance with the present invention; and FIG. 34 is a schematic block diagram showing an embodiment of one or more processing modules implemented to perform digital domain filtering within an ADC that includes a non-linear N-bit DAC in accordance with the present invention.

DETAILED DESCRIPTION OF THE INVENTION

Figure 1:
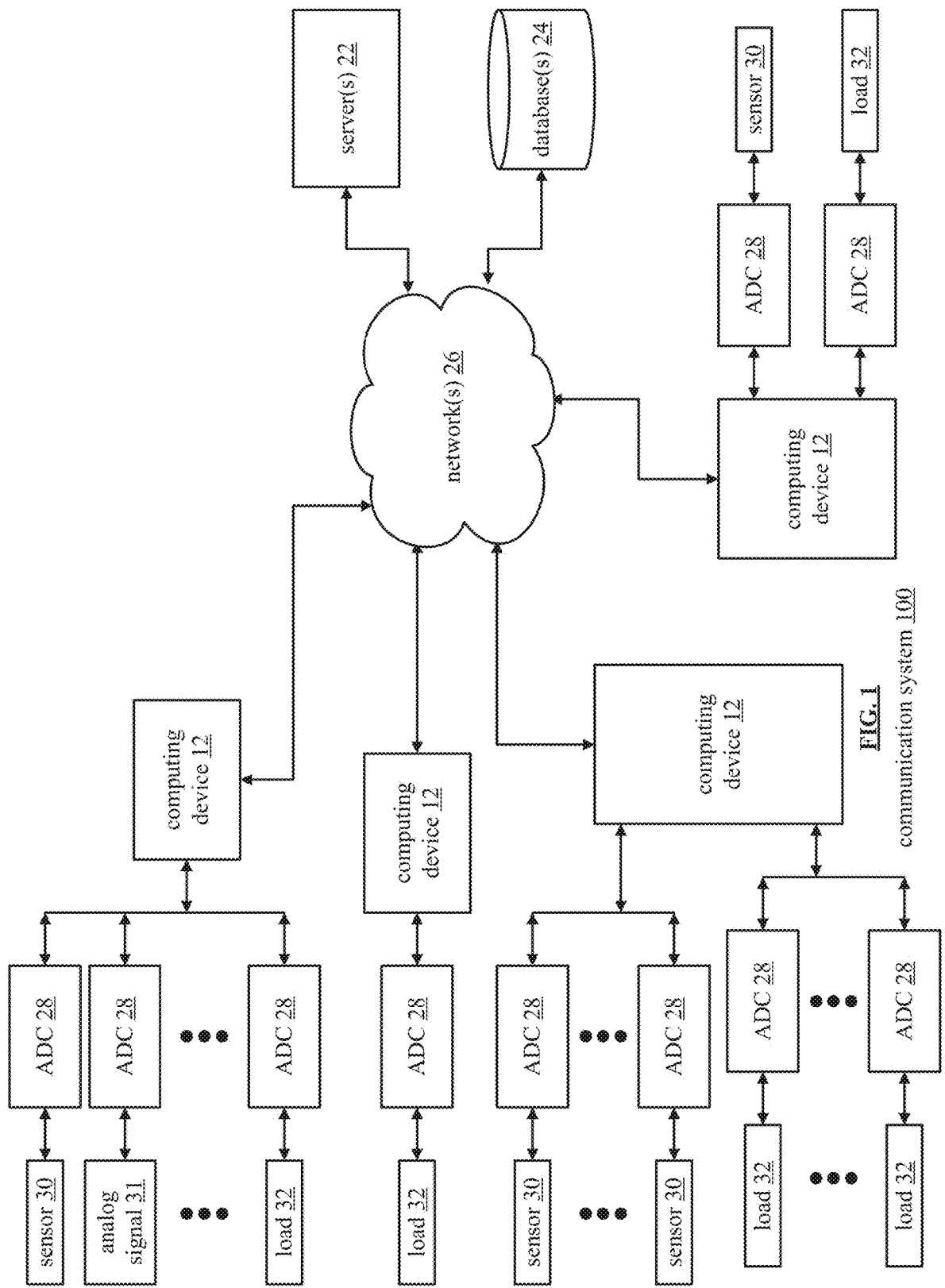
FIG. 1 is a schematic block diagram of an embodiment of a communication system in accordance with the present invention.

FIG. 1 is a schematic block diagram of an embodiment of a communication system 100 that includes a plurality of computing devices 12, one or more servers 22, one or more databases 24, one or more networks 26, a plurality of analog to digital converters (ADCs) 28, a plurality of sensors 30, and a plurality of loads 32. Generally speaking, an ADC 28 is configured to convert an analog signal 31 into a digital signal. In some examples, such an analog signal may be provided from and/or correspond a signal associated with a sensor 30, or generally speaking, a load 32 (e.g., such as which is consumptive of current, voltage, and/or power, and/or such as which produces a current, voltage, and/or power signal). Also, in some examples, note that any one of the computing devices 12 includes a touch screen with sensors 30, a touch & tactic screen that includes sensors 30, loads 32, and/or other components.

A sensor 30 functions to convert a physical input into an output signal (e.g., an electrical output, an optical output, etc.). The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, eclectic field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an eclectic signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

Any of the computing devices 12 may be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. An example of the computing devices 12 is discussed in greater detail with reference to one or more of FIG. 2.

A server 22 is a special type of computing device that is optimized for processing large amounts of data requests in parallel. A server 22 includes similar components to that of the computing devices 12 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12 communicates with ADCs 28, that are in communication with a plurality of sensors 30. In some examples, the sensors 30 and/or ADCs 28 are within the computing device 12 and/or external to it. For example, the sensors 30 may be external to the computing device 12 and the ADCs 28 are within the computing device 12. As another example, both the sensors 30 and the ADCs 28 are external to the computing device 12. In some examples, when the ADCs 28 are external to the computing device, they are coupled to the computing device 12 via wired and/or wireless communication links.

The computing device 12 communicates with the ADCs 28 to; (a) turn them on, (b) obtain data from the sensors 30, loads 32, one or more analog signals 31, etc. individually and/or collectively), (c) instruct the ADC 28 on how to process the analog signals associated with the sensors 30, loads 32, one or more analog signals 31, etc. and to provide digital signals and/or information to the computing device 12, and/or (d) provide other commands and/or instructions.

In an example of operation and implementation, a computing device 12 is coupled to ADC 28 that is coupled to a senor 30. The sensor 30 and/or the ADC 28 may be internal and/or external to the computing device 12. In this example, the sensor 30 is sensing a condition that is particular to the computing device 12. For example, the sensor 30 may be a temperature sensor, an ambient light sensor, an ambient noise sensor, etc. As described above, when instructed by the computing device 12 (which may be a default setting for continuous sensing or at regular intervals), the ADC 28 is configured to generate a digital signal and/or information associated with the sensor 30 and to provide that digital signal and/or information to the computing device 12.

Figure 2:
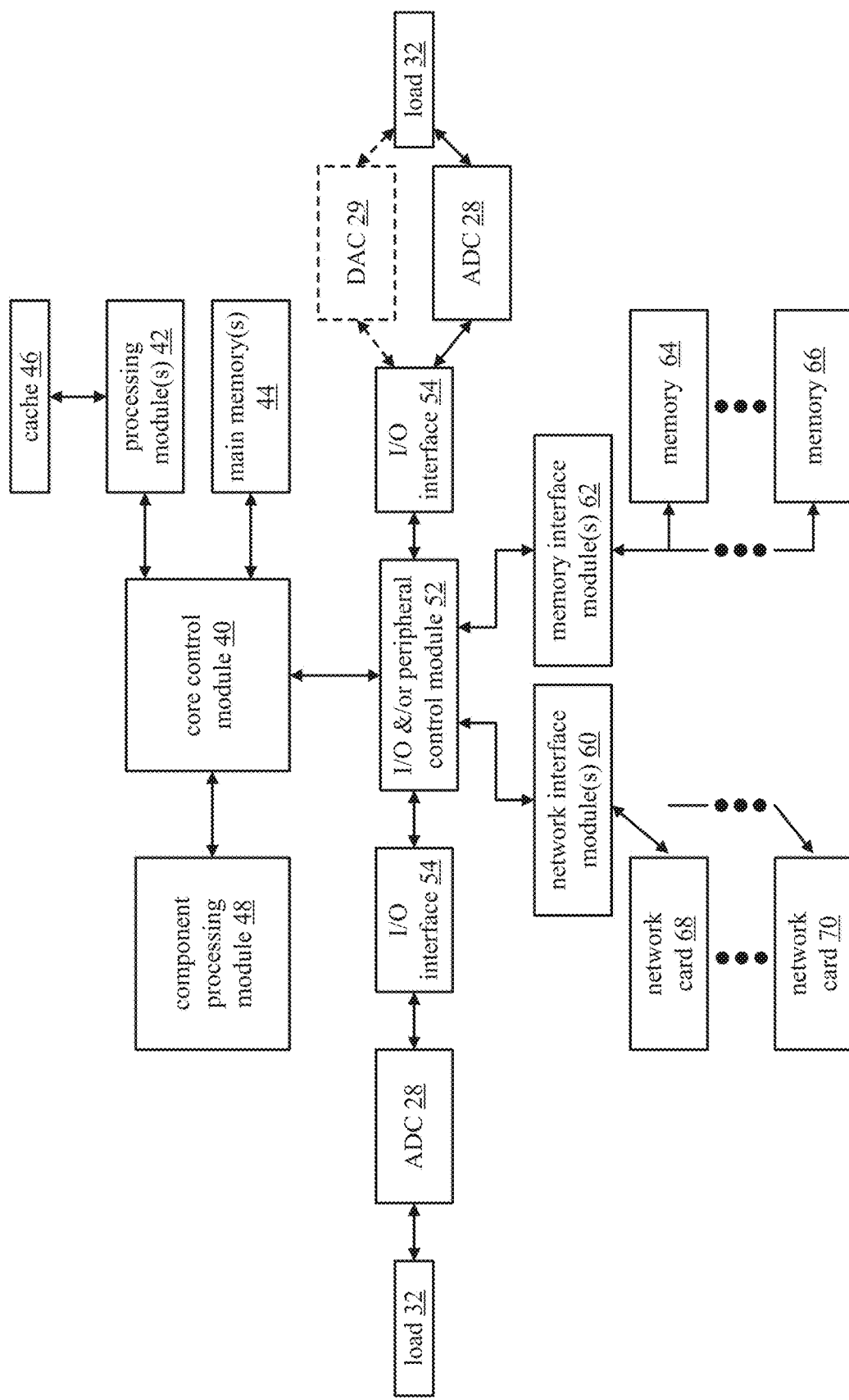
FIG. 2 is a schematic block diagram of an embodiment of a computing device in accordance with the present invention.

FIG. 2 is a schematic block diagram of an embodiment of a computing device 12 (e.g., any of the computing devices 12 in FIG. 1). The computing device 12 includes a core control module 40, one or more processing modules 42, one or more main memories 44, cache memory 46, an Input-Output (I/O) peripheral control module 52, one or more I/O interfaces 54, one or more ADCs 28 coupled to the one or more I/O interfaces 54 and one or more loads 32, optionally one or more digital to analog converters (DACs) 29 one or more I/O interfaces 54, one or more input interface modules 56, one or more output interface modules 58, one or more network interface modules 60, and one or more memory interface modules 62. In some examples, the computing device 12 also includes a component processing module 48. In an example of operation and implementation, such a component processing module 48 is implemented to facilitate operations associated with video graphics that may include any one or more of video graphics, display, a touch screen, a camera, audio output, audio input, and/or any other one or more computing device components, etc.

A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 ($4^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

This disclosure presents novel analog to digital converter (ADC) designs, architectures, circuits, etc. that provide much improved performance in comparison to prior art ADCs. Various aspects, embodiments, and/or examples of the invention (and/or their equivalents) that may be used to perform analog to digital conversion of signals provide very high resolution digital format data. Certain examples of such analog-to-digital conversion is performed based on sensing an analog current signal associated with a sensor, a load, etc. or any source of an analog signal. In many examples provided herein, a load 32 is employed as the element having an associated analog signal that is sensed and converted to a digital signal. Generally speaking, such a load 32 may be any of a variety of types of sources, devices, systems, etc. that has an associated analog signal that may be sensed and converted to a digital signal including a sensor, a computing device, a circuit, etc. within any type of application context including industrial, medical, communication system, computing device, etc.

In addition, various aspects, embodiments, and/or examples of the invention (and/or their equivalents) that may be used to perform analog to digital conversion of signals may be implemented in accordance with providing both drive and sense capabilities such that a signal is driven from the ADC 28 to the load 32 to facilitate sensing of the analog signal associated with the load 32. In some examples, the signal is driven from the ADC 28 to energize the load 32 and to facilitate its effective operation. Consider an example in which the load 32 is a sensor 30. In such an example, the signal provided from the ADC 28 is operative to provide power to the sensor 30 and also simultaneously to sense the analog signal associated with the sensor 30 simultaneously via a single line. Alternatively, note that certain examples may operate such that the load 32 is provided power or energy from an alternative source. In such instances, the ADC 28 need not specifically be implemented to provide power or energy to the load 32 but merely to sense the analog signal associated with the sensor 30. In some examples, a sensing signal is provided from the ADC 28 to the load 32 such that detection of any change of the sensing signal is used and interpreted to determine one or more characteristics of the analog signal associated with the load 32. In certain examples, the providing of the sensing signal from the ADC 28 to the load 32 and the sensing of the analog signal associated with the load 32 are performed simultaneously via a single line that couples or connects the ADC 28 to the load 32.

FIG. 3 is a schematic block diagram showing various embodiments 301, 302, 303, and 304 of analog to digital conversion as may be performed in accordance with the present invention. In the upper left portion of the diagram, with respect to reference numeral 301, and analog AC signal is shown. Note that the analog AC signal may or may not have a DC offset. Consider an example in which the DC offset is X volts, and consider a sinusoidal analog AC signal oscillates and varies between a maximum of +Y volts to a minimum of —Y volts as a function of time based on a particular frequency of the analog AC signal. Note that this example of an analog AC signal is not exhaustive, and generally speaking, such an analog AC signal may have any variety of shapes, frequencies, characteristics, etc. Examples of such analog signals may include any one or more of a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component).

Note also that such an analog signal may alternatively have only a DC component with no AC component. Note that any of the respective implementations of an ADC has described herein, or their equivalents, is also operative to detect an analog signal having only a DC component. Note that a totally non-varying analog signal having only a DC component, after undergoing analog-to-digital conversion, would produce a digital signal having a constant digital value as a function of time. That is to say, such a discrete-time signal generated based on a DC signal.

In the upper right hand portion of the diagram, with respect reference numeral 302, the analog AC signal shown with respect to reference numeral 301 is shown as undergoing analog-to-digital conversion in accordance with generating a digital signal. Generally speaking, the resolution and granularity of such a digital signal may be of any desired format including performing analog-to-digital conversion based on a range spanning any number of desired levels and generating a digital signal having any number of desired bits, N, where N is a positive integer. This particular example shows generation of additional signal in accordance with a range having 8 levels such that the digital signal includes 3 bits. For example, consider an analog AC signal having no DC offset and varying between a range spanning +Y/−Y volts, then that range is divided into 8 respective sub-range is, and when the value of the analog AC signal crosses from one sub-range into another sub-range as a function of time, then the value of the digital signal correspondingly changes as a function of time. With respect to reference numeral 302, a digital representation of the analog AC signal shown with respect to reference numeral 301 is shown as a function of time.

In the lower left-hand portion of the diagram, with respect to reference numeral 303, a transfer function of a three bit ADC is shown with respect to a Z volt reference. As the magnitude of the analog AC signal varies as a function of time, a corresponding digital value is generated based on where the magnitude of the analog AC signal is within the range from zero to a Z volt reference. Note that this particular example shown with respect to reference numeral 303 is shown as varying between zero and a Z volt reference.

In another example, such a transfer function may be implemented based on using −Y volts as a baseline such that, along the horizontal axis, 0 corresponds to −Y volts, and Z is twice the magnitude of Y (e.g., $Z=2 \times MAG[Y]$). For example, consider the analog AC signal shown with respect to reference 301 as being an analog AC signal having no DC offset and varying between a range spanning +Y/−Y volts, then the Z volt reference could correspond to Y (or alternatively some value greater than Y to facilitate detection of the analog AC signal bearing outside of a particular or expected range), then such an 8 level, 3 bit digital signal may be generated such as shown with respect to reference numeral 302.

In the lower right hand portion of the diagram, with respect to reference numeral 304, and ADC 28 is shown as being coupled or connected to a load 32. The ADC 28 is configured to sense an analog signal associated with the load 32 and to generate a digital signal based thereon. Note that the ADC 28 may be implemented to facilitate both drive and sense capabilities such that the ADC 28 is configured to drive an analog current and/or voltage signal to the load 32 while concurrently or simultaneously sensing the analog signal associated with the load 32. In alternative examples, the ADC 28 is also operative to perform simultaneous driving and sensing of the analog signal associated with the load 32 when the load 32 is energized from another source such as from a battery, an external power source, etc.

Note that the ADC 28 includes capability and functionality to perform sensing only or alternatively, to perform both drive and sense. In some examples, the ADC 28 is configured to perform sensing only of an analog signal (e.g., having AC and/or DC components) associated with the load 32. In other example, the ADC 28 is configured to drive an analog current and/or voltage signal to the load 32 while concurrently and/or simultaneously sensing an analog signal (e.g., having AC and/or DC components) associated with the load 32. For example, the ADC 28 is configured to provide power to or energize the load 32 while also concurrently and/or simultaneously sensing an analog signal (e.g., having AC and/or DC components) associated with the load 32. Also, in certain alternative examples, the ADC 28 is also operative to perform simultaneous driving and sensing of the analog signal associated with the load 32 when the load 32 is energized from another source such as from a battery, an external power source, etc.

Various aspects, embodiments, and/or examples of the invention (and/or their equivalents) include an ADC that is operative to sense an analog current signal. The ADC is implemented to convert the sensed analog current signal into a very high resolution digital format of a desired resolution (e.g., of a certain sampling rate, resolution or number of bits, etc.).

Figure 4:
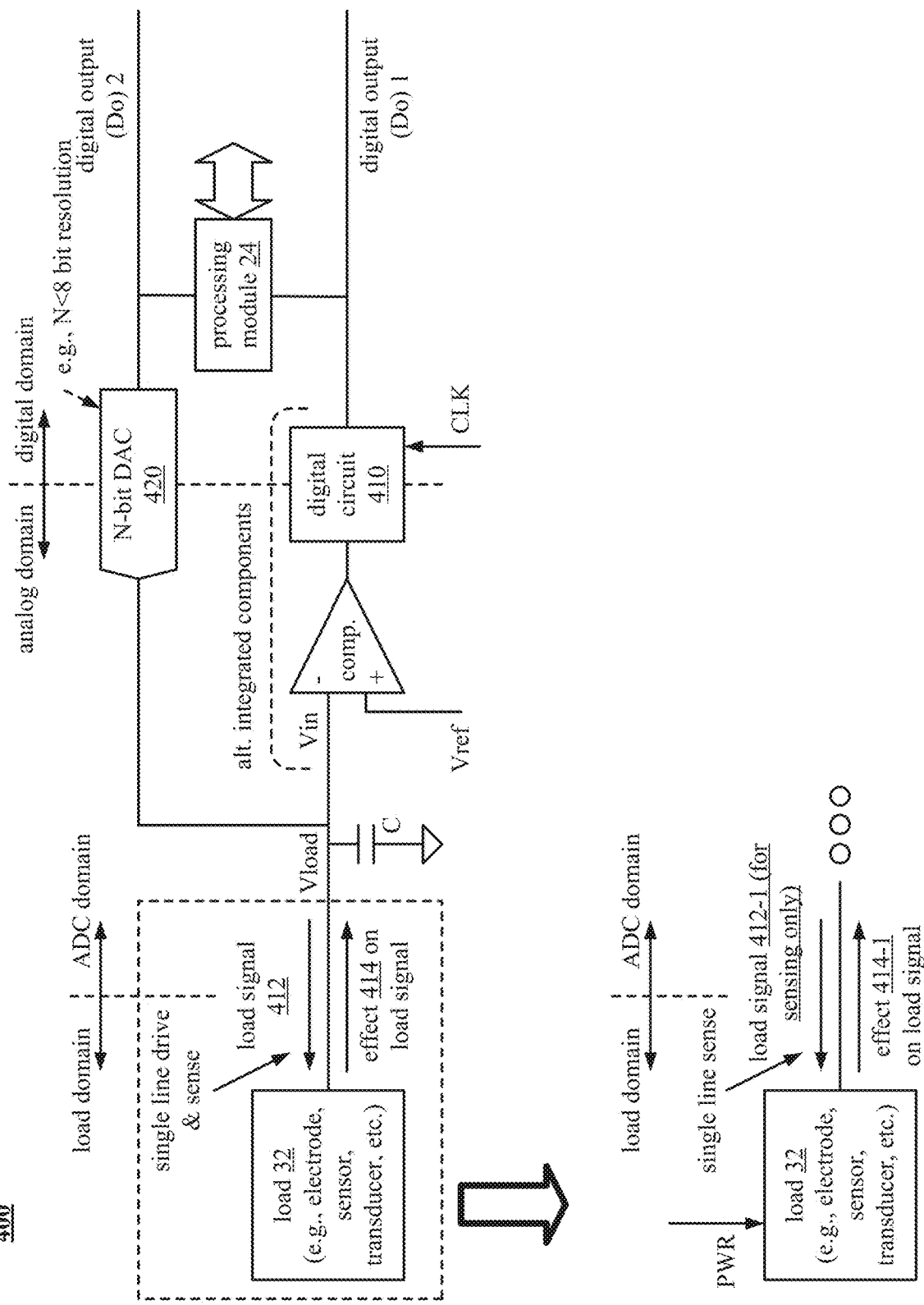
FIG. 4 is a schematic block diagram of an embodiment of an analog to digital converter (ADC) in accordance with the present invention.

FIG. 4 is a schematic block diagram of an embodiment 400 of an analog to digital converter (ADC) in accordance with the present invention. In this diagram, and ADC is connected to are coupled to a load 32 via a single line such that the ADC is configured to provide a load signal 412 via that single line and simultaneously to detect any effect 414 on that load signal via a single line. In certain examples, the ADC is configured to perform single line drive and sense of that load signal 412, including any effect 414 thereon, a that single line.

Note that certain of the following diagrams show one or more processing modules 24. In certain instances, the one or more processing modules 24 is configured to communicate with and interact with one or more other devices including one or more of ADCs, one or more components implemented within an ADC (e.g., filters of various types including low pass filters, bandpass filters, decimation filters, etc., gain or amplification elements, digital circuits, digital to analog converters (DACs) of varying types include N-bit DACs, analog to digital converters (ADCs) of varying types include M-bit ADCs, etc. Note that any such implementation of one or more processing modules 24 may include integrated memory and/or be coupled to other memory. At least some of the memory stores operational instructions to be executed by the one or more processing modules 24. In addition, note that the one or more processing modules 24 may interface with one or more other devices, components, elements, etc. via one or more communication links, networks, communication pathways, channels, etc. (e.g., such as via one or more communication interfaces of the device, such as may be integrated into the one or more processing modules 24 or be implemented as a separate component, circuitry, etc.).

Also, within certain of the following diagrams, there is a demarcation shown between the analog domain and the digital domain (e.g., showing the portion of the diagram that operates in the analog domain based on continuous-time signaling, and the portion of the diagram that operates in the digital domain that operates in the digital domain based on discrete-time signaling). Moreover, within certain of the following diagrams, there is a demarcation shown between the load domain and the ADC domain (e.g., Showing the connection or coupling between a load and/or an analog signal that is being sensed and the ADC that is sensing the analog signal, which may be associated with the load). In certain examples, an ADC is connected to or coupled to a load via a single line.

Also, such an ADC may be implemented to perform simultaneous driving and sensing of a signal via that single line that connects or couples to the load. For example, such an ADC is operative to drive an analog signal (e.g., current and/or voltage) of the load 32. With respect to implementations that operate in accordance with sensing analog current signals, such an ADC is operative to sense current signals within an extremely broad range including very low currents (e.g., currents below the 1 pico-amp range, within the 10 s of pico-amps range, below the 1 nano-amp range, within the 10 s of nano-amps range, below the 1 micro-amp range, within the 10 s of micro-amps range, etc.) and also up to relatively much larger currents (e.g., currents in the 10 s milli-amps range, 100 s milli-amps range, or even higher values of amps range, etc.). In some examples, such as with respect to detecting currents that are provided from a photodetection or photodiode component, such an ADC is operative to sense current signals below the 1 pico-amp range, currents within the 100 s of micro-amps range, etc.

Also, in some examples, when using appropriately provisioned components (e.g., higher current, higher power, etc.), much higher currents can also be sensed using architectures and topologies in accordance with an ADC as described herein. For example, such an ADC implemented based on architectures and topologies, as described herein, using appropriately provisioned components be operative to sense even higher currents (e.g., is of amps, 10 s of amps, or even higher values of amps range, etc.).

In addition, such an ADC may be implemented to provide for extremely low power consumption (e.g., less than 2 µW). Such an ADC may be particularly well-suited for low-power applications such as remote sensors, battery operated applications, etc. The architecture and design of such an ADC requires very few analog components. this provides a number of advantages and improve performance over prior art ADCs including very little continuous static current being consumed. In certain examples, such an ADC is described herein provides for a 10× lower power consumption in comparison to prior art ADC technologies. Such extremely low power consumption implementations may be particularly well-suited for certain applications such as bio-medical applications including sensing of vital signs on the patient, low current sensors, remote sensors, etc.

In addition, note that while such an ADC as described herein provides for significant improvement in a reduction in power consumption in comparison to prior art ADCs (e.g., including prior art ADCs such as successive approximation resolution (SAR) ADCs, D-sigma modulator ADCs, pipeline ADCs, etc.), such an ADC is described herein may be implemented as a general-purpose ADC in any of a variety of applications. Moreover, the bandwidth of analog signals that may be sensed using such an ADC is described herein is extremely broad, ranging from DC up to and over 10 MHz. In certain particular examples, such an ADC has described herein is implemented for very low frequency measurements, such as from DC up to 1 kHz.

Note also that an ADC as described herein may be designed and tailored particularly for a desired digital signal resolution to be generated based on a particular bandwidth to be sampled. In general, there may be a trade-off between bandwidth and power consumption within a particularly designed ADC. Consider an example in which a very high resolution digital signal is desired for a relatively low sampling bandwidth versus another example in which a relatively low resolution digital signal is desired for a relatively high sampling bandwidth. For example, consider a particularly designed ADC to provide a digital signal having 16-bit resolution for a sampling bandwidth below 100 kHz, then such an ADC may be implemented to consume less than 1 µW of energy.

Such an ADC may be appropriately designed to meet criteria for a particular application. Consider an example in which a 24-bit digital signal is desired for a relatively low sampling bandwidth from DC up to 100 kHz. Consider another example in which a 12 bit digital signal desired for a relatively higher sampling bandwidth from DC up to 1 MHz. In comparing these two examples, as the sampling bandwidth is extended higher and higher, the ADC will consume more current and thereby be more power consumptive. Depending on the particular application at hand, a relatively low sampling bandwidth may be acceptable for the particular application at hand, and very significant power consumption savings may be achieved. Generally speaking, a trade-off in design implementation may be viewed as higher resolution/lower sampling bandwidth/lower power consumption versus higher resolution/higher sampling bandwidth/higher power consumption.

In addition, note that many of the examples of an ADC included herein operate based on sensing a current signal as opposed to a voltage signal. In addition, when the ADC is implemented in an application to sense a voltage signal, an appropriately implemented voltage to current transforming element, such as the trans-impedance amplifier that is operative to transform voltage to current, or vice versa, may be implemented to generate a current signal from a voltage signal in any particular desired application.

In any of the various diagrams, note that such a load 32 may be of any of a variety of types including electrode, a sensor, a transducer, etc. Generally speaking, such a load 32 may be any of a variety of types of components. Examples of such components may include any one or more of sources, devices, systems, etc. that has an associated analog signal that may be sensed and converted to a digital signal including a sensor, a computing device, a circuit, etc. within any type of application context including industrial, medical, communication system, computing device, etc.

Also, note that such a load 32 as depicted within any diagram herein may be energized or powered based on the signal provided from the ADC or alternatively powered by another source such as a battery, external power source, etc. For example, consider the lower left-hand portion of the diagram and need demarcation between the load domain and the ADC domain, such that the load 32 is connected to the ADC via a single line. In certain examples, the ADC is implemented to facilitate single-line sense functionality such that a load signal 412-1 is provided to the load 32 for sensing only, and any effect 414-1 on that load signal is sensed and detected by the ADC. In such an example is this, power is provided to the load 32 from an external source.

Referring again to the top portion of the diagram, the ADC is connected to are coupled to a load 32 via a single line such that the ADC is configured to provide a load signal 412 via that single line and simultaneously to detect any effect 414 on that load signal via a single line. For example, the load signal 412 is an analog current signal. An analog capacitor, C, is implemented to be charged in accordance with the load signal 412. Note that such an analog capacitor may alternatively be a load capacitance from the load 32 itself, such that a separate analog capacitor, C, is not needed when the load 32 itself provides a sufficient load capacitance.

In an example of operation and implementation, a load voltage, Vload, is generated based on any effect 414 on that load signal charging the capacitor. This load voltage, Vload, serves as an input voltage, Vin, to one of the inputs of a comparator that also receives a reference signal, Vref (e.g., a voltage reference signal). Note that the reference signal, Vref, may be internally generated, provided from an external source, provided from a processing module 24, etc. The comparator compares the input voltage, Vin, to the reference signal, Vref, and outputs a signal that is based on any difference between the input voltage, Vin, to the reference signal, Vref, that gets processed by a digital circuit 410 to generate a digital output (Do) 1 signal that may be viewed as being a digital stream of 0s and/or 1s at a clock rate (CLK) at which the digital circuit 410 is clocked.

For example, consider that the input voltage, Vin, is greater than the reference signal, Vref, then the comparator output signal would be positive (e.g., such as a positive rail or power supply voltage of the ADC). Alternatively, consider that the input voltage, Vin, is less than or equal to the reference signal, Vref, then the comparator output signal would be negative (e.g., such as a negative rail or power supply voltage of the ADC).

In another example, consider that the input voltage, Vin, is greater than the reference signal, Vref, then the comparator output signal would be positive or negative (e.g., such as a positive or negative rail or power supply voltage of the ADC). Alternatively, consider that the input voltage, Vin, is less than or equal to the reference signal, Vref, then the comparator output signal would be zero (e.g., such as a ground voltage potential).

Generally speaking, the combined operation of the comparator and the digital circuit 410 may be viewed as performing the analog to digital conversion of a signal that is the difference (e.g., and error voltage, Ve) between the input voltage, Vin, and the reference signal, Vref (e.g., Ve=Vref−Vin) to generate a digital signal of a particularly desired resolution, which may be viewed as M bits, where M is a positive integer greater than or equal to 1.

A processing module 24 is operative to process the Do 1 to generate a digital output (Do) 2. Note that the processing module 24 may be implemented in any of a variety of examples to perform any desired digital signal processing on the Do 1 to generate the Do 2. Examples of such digital signal processing may be increasing the output resolution (e.g., consider Do 1 having a resolution of M bits and Do 2 having a resolution of N bits, where N and M are both positive integers, where M is a positive integer greater than or equal to 1, and N is greater than M), performing filtering on the Do 1 to generate the Do 2 (e.g., such as low pass filtering or bandpass filtering based on certain parameters such as a particular frequency cut off for low pass filtering or a particular frequency range for bandpass filtering).

The processing module 24 provides the Do 2 to an N-bit digital to analog converter (DAC) 420. In some examples, the N-bit DAC 420 has a resolution of N<8 bits. This N-bit DAC 420, based on the Do 2 provided from the processing module 24, forces and output current to the load 32 that follows or tracks the load signal 412 due to the operation of the comparator that compares the input voltage, Vin, to the reference signal, Vref, and, in conjunction with the digital circuit 410, generates Do 1.

From certain perspectives, considering the Do 1 and the Do 2, the Do 1 may be viewed as a digital signal corresponding to the unfiltered load current signal including quantization noise, and the Do 2 may be viewed as another digital signal corresponding to a filtered load current signal.

In this diagram, the positive input of the comparator is driven by the reference signal, Vref. The load voltage, Vload, will follow the reference signal, Vref, based on the comparator output signal that corresponds to the difference or error between the input voltage, Vin, and the reference signal, Vref. In many examples, the difference between the input voltage, Vin, and the reference signal, Vref, is very small (e.g., approaching 0, very close to 0, or actually 0) based on the Delta-sigma modulation operation of the comparator and the digital circuit 410. For example, when there is any difference between the input voltage, Vin, and the reference signal, Vref, the ADC adapts/modifies the output current from the N-bit DAC 420 to match the current of the load so that difference or error between the input voltage, Vin, and the reference signal, Vref, will be forced to 0.

Note that the comparator and the digital circuit 410 may be implemented using one or more other components and other examples while still providing the same overall functionality of the ADC. The following diagram shows some alternative possible examples of how the comparator and the digital circuit 410 may be implemented.

Note that this implementation of an ADC includes very few number of analog components. For example, there may be instances in which no capacitors required whatsoever given that the load 32 inherently includes sufficient load capacitance to generate the load voltage, Vload. In certain implementations, the comparator is implemented by a component that performs analog to digital conversion of the load voltage, Vload, directly thereby further reducing the number of analog components within the ADC.

Given the small number of analog components, such an ADC consumes little or no continuous static power thereby facilitating very low power consumption. The only static current being consumed is by the N-bit DAC 420. This N-bit DAC 420 drives and output current that is same as the sensed load current thereby tracking or following the load current. Therefore, within implementations in which the load current is small, so will the corresponding output current from the N-bit DAC 420 be small. The smaller the current provided from the N-bit DAC 420, which is based on the sensed load current, the lower the power consumption of the ADC. Note that there are certainly alternative implementations of an ADC that will consume some static current, such as when an M-bit analog to digital converter (ADC) is used or some other component that is implemented to perform the analog-to-digital conversion of the signal Vin to Do 1.

Also, note that the amount of power consumed by the DAC, particularly the digital power consumed by the DAC, scales with the clock rate, CLK. Note also that applications that are implemented to perform sensing of ADC signal, such as sensing ADC current signal, the clock frequency can be extremely low (e.g., within the range of 1 kHz to 100 kHz) thereby providing for a very small digital power consumption.

Figure 5A:
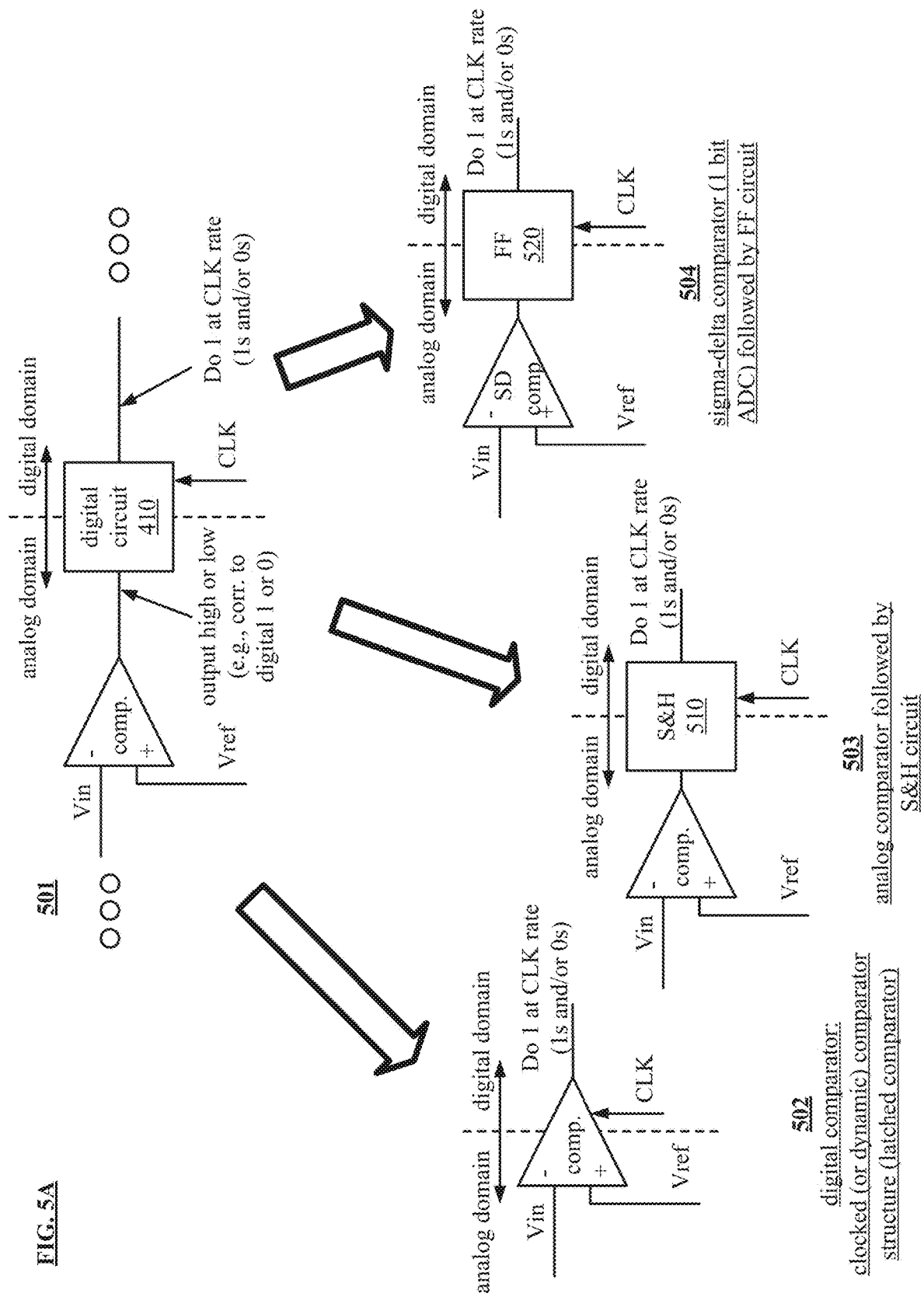
FIG. 5A is a schematic block diagram showing alternative embodiments of various components may be implemented within an ADC in accordance with the present invention.

FIG. 5 is a schematic block diagram showing alternative embodiments 501, 502, 503, and 504 of various components may be implemented within an ADC in accordance with the present invention. Considering reference numeral 501, a comparator operates in cooperation with the digital circuit 410 as described above such that the combined operation of the comparator and the digital circuit 410 may be viewed as performing the analog to digital conversion of a signal that is the difference (e.g., Ve) between the input voltage, Vin, and the reference signal, Vref (e.g., Ve=Vref−Vin) to generate a digital signal of a particularly desired resolution, which may be viewed as M bits, where M is a positive integer greater than or equal to 1.

However, note that comparator and the digital circuit 410 may be implemented using any of a variety of other means while still facilitating proper operation of an ADC. With respect to reference numeral 502, a digital comparator, which may alternatively be described as a clock (or dynamic) comparator structure (latched comparator) is shown. This singular device performs the operation of both a comparator and the digital circuit 410 within a single device. For example, the digital comparator is clocked at a particular clocking frequency (CLK) and outputs a stream of 1s and/or 0s based on the comparison of Vref and Vin. In comparison to a comparator that operates continuously and that will output one of two values, such as either a high signal or low signal, continually as a function of time, a digital comparator outputs a 1 or 0 at each clock cycle based on the comparison of Vref and Vin in accordance with generating the Do 1 (e.g., 1 when Vref>Vin and 0 when Vref<=Vin, or vice versa). Note also that by only clocking such a digital comparator at certain intervals, a higher accuracy and lower power consumption can be achieved in comparison to a comparator that operates continuously.

With respect to reference numeral 503, the output of the comparator is provided to a sample and hold circuit (S&H) 510. Generally speaking, a S&H 510 holds, locks, or freezes its value at a constant level for a specified minimum period of time. This signal may be viewed as interpreted as a digital stream of 1s and/or 0s at the clocking frequency (CLK) in accordance with generating the Do 1. Note that such a S&H 510 may be implemented in a variety of ways including a circuit that stores electric charge and a capacitor and also employs one or more switching elements such that the circuit stores electric charge is built up over each of certain intervals, and the switching element connects the output of the circuit that stores electric charge to the output at certain in the boroughs such as the clocking frequency (CLK) in accordance with generating the Do 1.

With respect to reference numeral 504, the comparator and the digital circuit 410 are replaced with a sigma-delta comparator, such as a one bit ADC, followed by a flip-flop circuit (FF) 520. The sigma-delta comparator provides a high or low signal to the FF 520 based on comparison of Vref and Vin, and the FF 520 outputs a 1 or 0 at each clock cycle such as the clocking frequency (CLK) based on the comparison of Vref and Vin in accordance with generating the Do 1.

Generally speaking, note that the implementation of a comparator and the digital circuit 410 as shown within any of the diagrams herein may be alternatively implemented in a variety of different ways including those shown within this diagram and/or their equivalents.

Figure 5B:
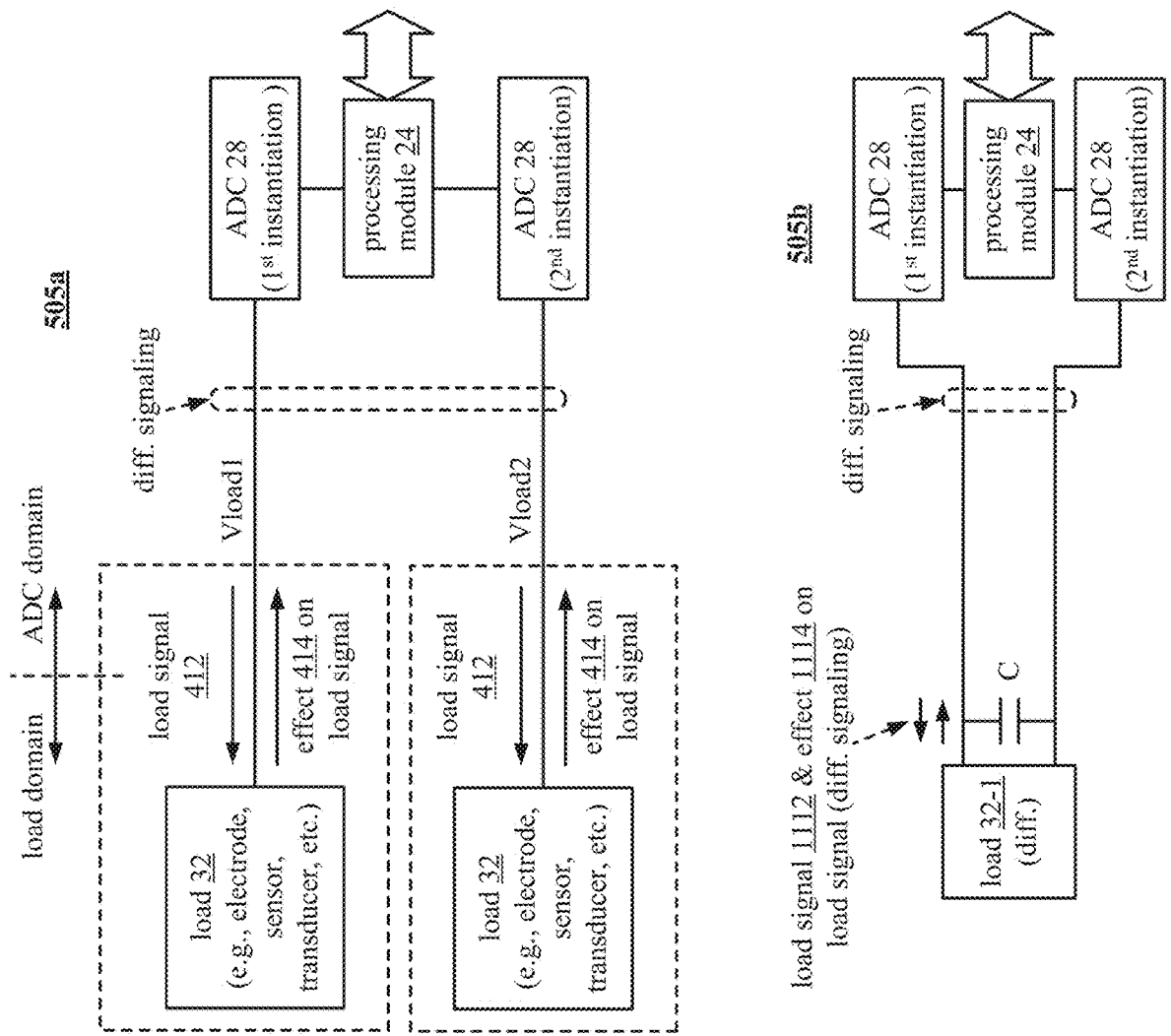
FIG. 5B is a schematic block diagram showing alternative embodiments of servicing differential signaling using ADCs in accordance with the present invention.

FIG. 5B is a schematic block diagram showing alternative embodiments 505a and 505b of servicing differential signaling using ADCs in accordance with the present invention. In addition to servicing and sensing single-ended lines and generating digital signals based thereon using ADCs as described herein, note that servicing and sensing of signals may also be performed. For example, with respect to reference numeral 505a, a first instantiation of an ADC 28 and the second instantiation of an ADC 28 are each respectively coupled via a respective single line to a different perspective load 32. Two respective load voltages, Vload1 and Vload2, are respectively received by the first and second instantiations of an ADC 28. Note that the first and second instantiation of an ADC 28 may be the same or may be different. Each respective instantiation of an ADC 28 in this example is operative to service and sense a respective single-ended line. Together, the first and second instantiations of an ADC 28 are operative to sense a differential signal that is based on the two load voltages, Vload1 and Vload2, and to generate a corresponding digital signal based thereon. In certain examples a processing module 24 is implemented to combine a first digital signal that is based on Vload1 and that is generated by the first instantiation of an ADC 28 and a second digital signal that is based on Vload2 and that is generated by the second instantiation of an ADC 28 to generate a resultant digital signal that corresponds to the differential voltage between the two load voltages, Vload1 and Vload2 (e.g., Vdiff=Vload1−Vload2, or Vdiff=Vload2−Vload1).

As another example, with respect to reference numeral 505b, a differential load 32-1 is serviced such that the two signal lines corresponding to the differential signaling provided by the differential load 32-1 are respectively provided to a first instantiation of an ADC 28 and a second instantiation of an ADC 28. Similarly, a processing module 24 may be implemented to generate a resulting digital signal that corresponds to the differential voltage associated with the differential load 32-1. The first instantiation of an ADC 28 in the second instantiation of an ADC 28 operate cooperatively to provide a load signal 1112 and to detect any effect 1114 on the load signal that is based on the differential load 32-1. A capacitor, C, is also implemented across the differential signal lines of the differential load 32-1.

Note that any example, embodiment, etc. of any ADC described herein that is operative to sense an analog signal via a single line may be implemented within the first instantiation and the second instantiation of an ADC 28 in either of these examples corresponding to reference numerals 505a and 505b and/or their equivalents.

In an example of operation and implementation, an ADC (e.g., consider the ADC of FIG. 4) includes a capacitor that is operably coupled to a load and configured to produce a load voltage based on charging by a load current and a digital to analog converter (DAC) output current. In some examples, the ADC is coupled to the load via a single line. The ADC also includes a comparator. When enabled, the comparator operably coupled and configured to receive the load voltage via a first input of the comparator, receive a reference voltage via a second input of the comparator, and compare the load voltage to the reference voltage to generate a comparator output signal.

The ADC also includes a digital circuit that is operably coupled to the comparator. When enabled, the digital circuit operably coupled and configured to process the comparator output signal to generate a first digital output signal that is representative of a difference between the load voltage and the reference voltage.

The ADC also includes one or more processing module operably coupled to the digital circuit and to memory, which may be included within the ADC or external to the ADC. When enabled, the one or more processing modules is configured to execute the operational instructions to process the first digital output signal to generate a second digital output signal that is representative of the difference between the load voltage and the reference voltage, wherein the second digital output signal includes a higher resolution than the first digital output signal.

The ADC also includes an N-bit digital to analog converter (DAC) that is operably coupled to the one or more processing modules. When enabled, the N-bit DAC operably coupled and configured to generate the DAC output current based on the second digital output signal. Note that N is a positive integer. The DAC output current tracks the load current, and the load voltage tracks the reference voltage.

Also, in some examples, the one or more processing modules, when enabled, is further configured to process the first digital output signal in accordance with performing band pass filtering or low pass filtering to generate the second digital output signal that is representative of the difference between the load voltage and the reference voltage.

In alternative examples, the comparator includes a sigma-delta comparator, and the digital circuit includes a clocked flip flop. In even other examples, a digital comparator includes both the comparator and the digital circuit (e.g., the digital comparator is operative to perform the functionality of both the comparator and the digital circuit). When enabled, the digital comparator operably coupled and configured to receive the load voltage via a first input of the comparator, receive a reference voltage via a second input of the comparator, and compare the load voltage to the reference voltage to generate the first digital output signal that is representative of the difference between the load voltage and the reference voltage.

In addition, in certain examples, the ADC includes a decimation filter coupled to the one or more processing modules. When enabled, the decimation filter is operably coupled and configured to process the second digital output signal to generate another digital output signal having a lower sampling rate and a higher resolution than the second digital output signal. Alternative to or in addition to, another decimation filter is coupled to the digital circuit. When enabled, the other decimation filter the operably coupled and configured to process the first digital output signal to generate another digital output signal having a lower sampling rate and a higher resolution than the first digital output signal.

Figure 6:
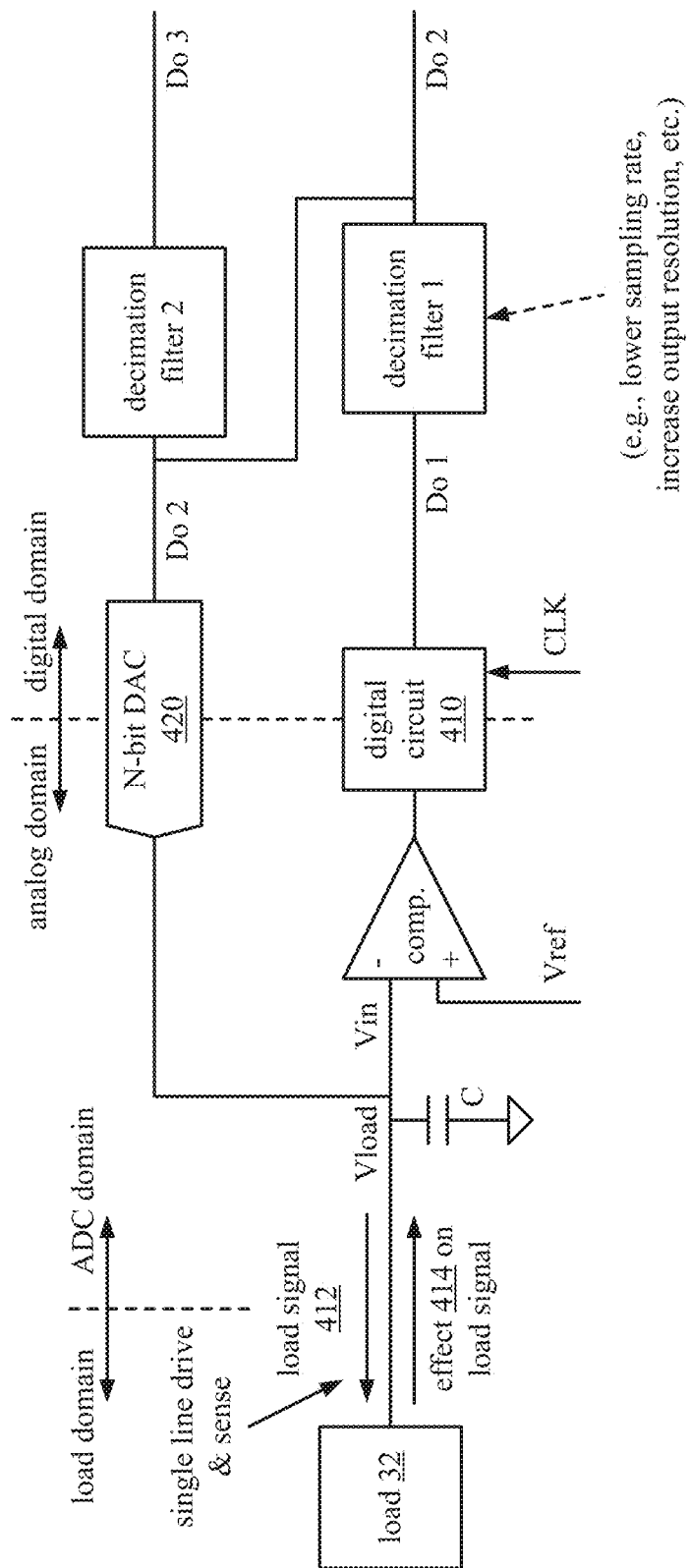
FIG. 6 is a schematic block diagram of another embodiment of an ADC that includes one or more decimation filters in accordance with the present invention.

FIG. 6 is a schematic block diagram of another embodiment 600 of an ADC that includes one or more decimation filters in accordance with the present invention. This diagram has similarities with respect to FIG. 4 with at least one difference being that a decimation filter 1 and/or a decimation filter 2 are implemented to process the Do 1 and the Do 2. For example, a decimation filter may be implemented to process a digital signal thereby lowering the sample rate thereof and increasing the output resolution. Consider a digital signal having a 12 bit resolution and a 100 kHz sampling rate. In one example, a decimation filter may operate to increase the resolution of that digital signal to be 24-bit resolution with a lower sampling rate of 50 kHz. In another example, decimation filter may operate to increase the resolution of that digital signal to be 18-bit resolution with a lower sampling rate of 75 kHz. Generally speaking, any desired transformation of sampling rate and output resolution may be made performed using one or more decimation filters in accordance with any of the various examples of ADCs as described herein. In certain examples, only a decimation filter 1 is included thereby processing the Do 1 to generate the Do 2. In other examples, both a decimation filter 1 is included thereby processing the Do 1 to generate the Do 2 and a decimation filter 2 is included thereby processing the Do 2 to generate a Do 3 (e.g., Do 3 having a lower sampling rate and increased output resolution in comparison to the Do 2).

Figure 7:
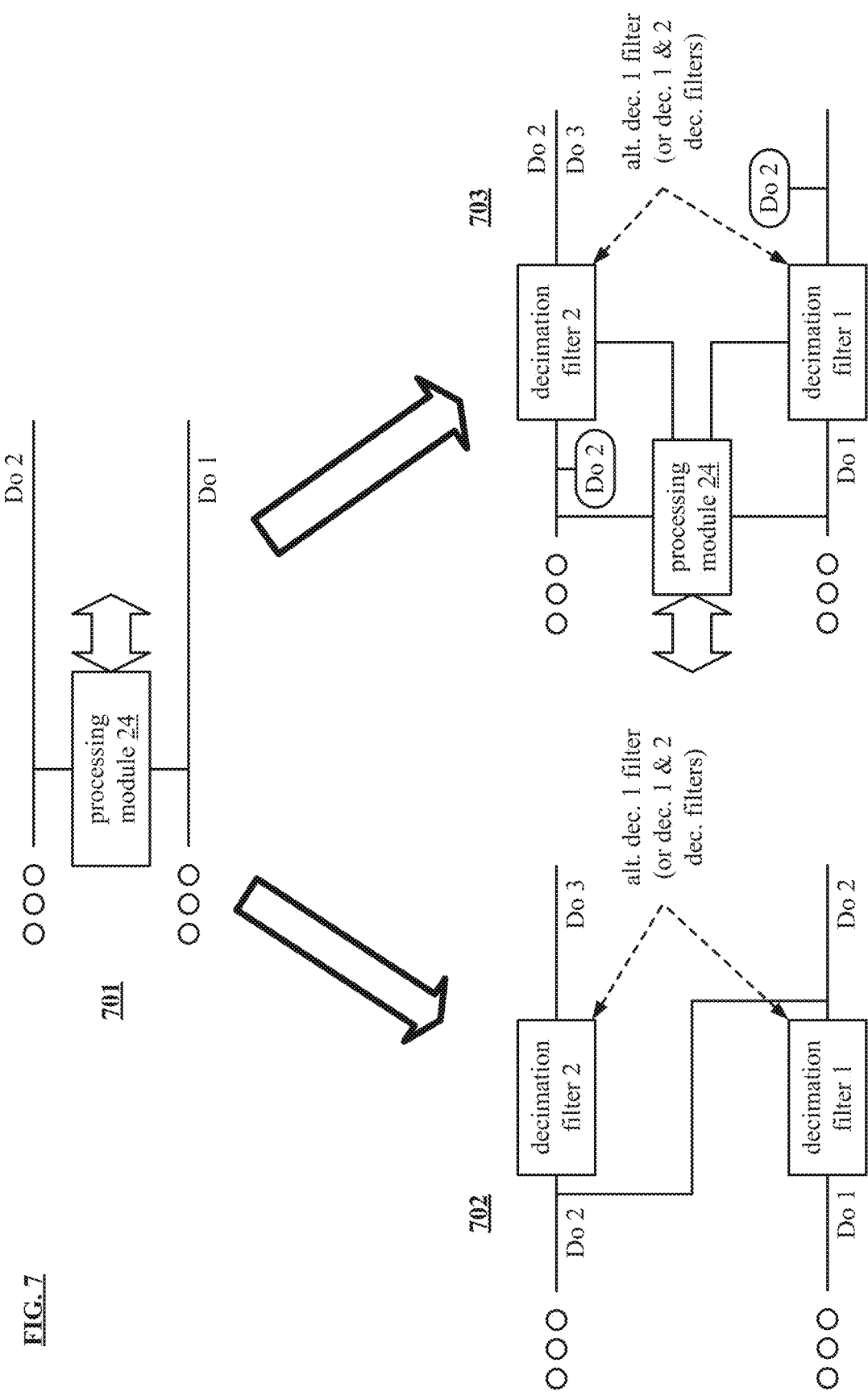
FIG. 7 is a schematic block diagram showing alternative embodiments of one or more decimation filters and/or processing modules that may be implemented to perform digital domain processing within an ADC in accordance with the present invention.

FIG. 7 is a schematic block diagram showing alternative embodiments 701, 702, and 703 of one or more decimation filters and/or processing modules that may be implemented to perform digital domain processing within an ADC in accordance with the present invention. With respect to reference numeral 701, a processing module 24 may be implemented to perform any of a variety of different digital signal processing operations on the Do 1 to generate the Do 2 such as decimation filtering, low pass filtering, bandpass filtering, etc. However, note that such an implementation of the output signals, such as Do 1 and the Do 2 may be implemented in different configurations as desired in particular applications.

For example, with respect to reference numeral 702, a decimation filter 1 and a decimation filter 2 may be implemented. As described above, only a decimation filter 1 may s included thereby processing the Do 1 to generate the Do 2. In other examples, both a decimation filter 1 is included thereby processing the Do 1 to generate the Do 2 and a decimation filter 2 is included thereby processing the Do 2 to generate a Do 3 (e.g., Do 3 having a lower sampling rate and increased output resolution in comparison to the Do 2).

With respect to reference numeral 703, the processing module 24 is configured to control the operation of the decimation filter 1 and decimation filter 2. For example, the processing module 24 is configured to the manner in which decimation filtering may be performed by the decimation filter 1 and/or decimation filter 2 (e.g., including the manner of conversion of digital signal resolution, the modification of sampling rate, etc.).

Note that any of the respective implementations shown within this diagram may be implemented within any other of the appropriate diagrams of an ADC as described herein.

Figure 8:
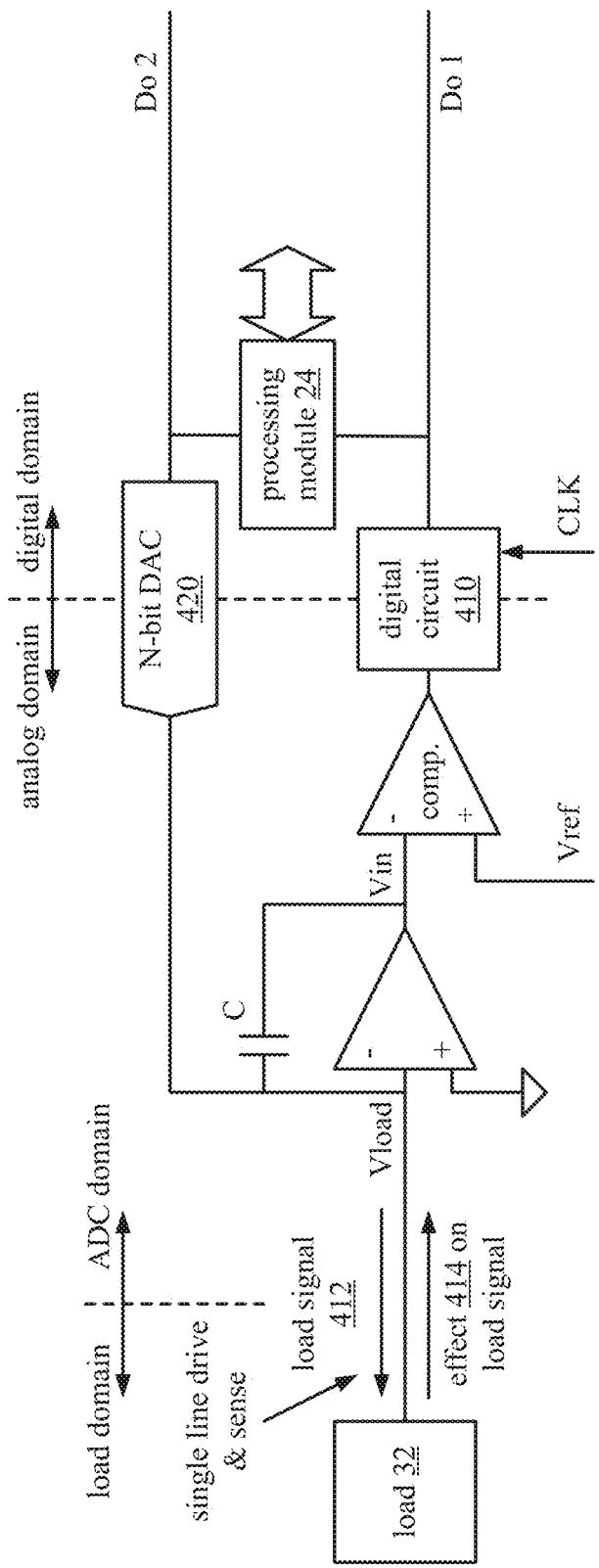
FIG. 8 is a schematic block diagram of another embodiment of an ADC in accordance with the present invention.

FIG. 8 is a schematic block diagram of another embodiment 800 of an ADC in accordance with the present invention. This diagram is similar to that of FIG. 4 with at least one difference being that the capacitor, C, is replaced by an integrator. The integrator is implemented as an operational amplifier with a feedback capacitor, C. The use of the operational amplifier in place of only the capacitor, C, may be used for applications that are tailored to serve greater power than that of FIG. 4. Generally speaking, the feedback capacitor, C, implemented in cooperation with the operational amplifier serves a similar purpose of the capacitor, C, in FIG. 4 of being charged based on the load current and the output current from the N-bit DAC 420 thereby generating the Vin to be provided to the comparator and compared with Vref.

In an example of operation and implementation, an ADC (e.g., consider the ADC of FIG. 800) includes an operational amplifier (op amp) that is operably coupled to a load via a first op amp input. Also, a capacitor is operably coupled to the first op amp input and an op amp output. When enabled, the op amp is operably coupled and configured to generate an output voltage at the op amp output that corresponds to a load voltage that is based on charging of the capacitor by a load current and a digital to analog converter (DAC) output current. In some examples, the ADC is coupled to the load via a single line.

The ADC also includes a comparator that is operably coupled to the op amp. When enabled, the comparator operably coupled and configured to receive the output voltage via a first input of the comparator, receive a reference voltage via a second input of the comparator, and compare the load voltage to the reference voltage to generate a comparator output signal.

The ADC also includes a comparator a digital circuit that is operably coupled to the comparator. When enabled, the digital circuit is operably coupled and configured to process the comparator output signal to generate a first digital output signal that is representative of a difference between the load voltage and the reference voltage.

The ADC also includes a comparator one or more processing modules operably coupled to the digital circuit and to memory, which may be included within the ADC or external to the ADC. When enabled, the one or more processing modules is configured to execute the operational instructions to process the first digital output signal to generate a second digital output signal that is representative of the difference between the load voltage and the reference voltage. Note that the second digital output signal includes a higher resolution than the first digital output signal.

The ADC also includes an N-bit digital to analog converter (DAC) that is operably coupled to the one or more processing modules. When enabled, the N-bit DAC operably coupled and configured to generate the DAC output current based on the second digital output signal. Note that N is a positive integer. Also, the DAC output current tracks the load current, and the load voltage tracks the reference voltage.

In some examples, the one or more processing modules, when enabled, is further configured to process the first digital output signal in accordance with performing band pass filtering or low pass filtering to generate the second digital output signal that is representative of the difference between the load voltage and the reference voltage.

In some examples, the comparator includes a sigma-delta comparator, and the digital circuit includes a clocked flip flop. Also, in some other examples, a digital comparator includes both the comparator and the digital circuit (e.g., the digital comparator is operative to perform the functionality of both the comparator and the digital circuit). When enabled, the digital comparator operably coupled and configured to receive the load voltage via a first input of the comparator, receive a reference voltage via a second input of the comparator, and compare the load voltage to the reference voltage to generate the first digital output signal that is representative of the difference between the load voltage and the reference voltage.

In addition, in certain examples, the ADC includes a decimation filter coupled to the one or more processing modules. When enabled, the decimation filter is operably coupled and configured to process the second digital output signal to generate another digital output signal having a lower sampling rate and a higher resolution than the second digital output signal. Alternative to or in addition to, another decimation filter is coupled to the digital circuit. When enabled, the other decimation filter the operably coupled and configured to process the first digital output signal to generate another digital output signal having a lower sampling rate and a higher resolution than the first digital output signal.

Figure 9:
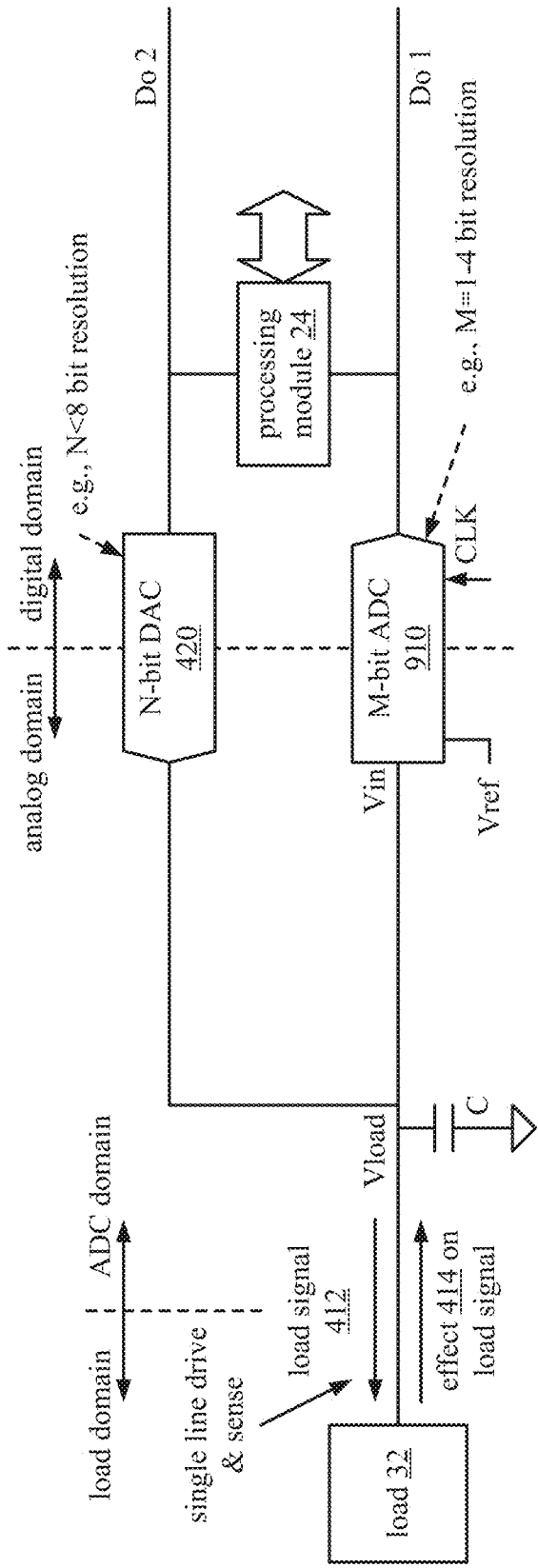
FIG. 9 is a schematic block diagram of another embodiment of an ADC in accordance with the present invention.

FIG. 9 is a schematic block diagram of another embodiment 900 of an ADC in accordance with the present invention. This diagram has certain similarities with one or more of the previous diagrams with at least one difference being that a comparator and the digital circuit 410, or a functionally equivalent component to the comparator and the digital circuit 410, is replaced by a low resolution analog to digital converter (ADC), specifically, an M-bit ADC 910, where M is a positive integer greater than or equal to 1. In certain particular examples, M is a positive integer within the range of 1-4 (e.g., 1, 2, 3, or 4). Also, in certain particular examples, N of the N-bit DAC 420 is less than or equal to M. In certain specific examples, N<8 bit resolution. For example, if N=4, then M=3, 2, or 1. The Do 2 may be viewed as a high-resolution digital signal (N bit resolution) compared to the Do 1 (M bit resolution), such that M<N. In addition, in some examples, the Do 2 is a modified version of the Do 1 after having undergone any desired digital signal processing within the processing module 24.

Note that the M-bit ADC 910 is operative to generate the Do 1 as being an error signal that corresponds to a difference between Vin and Vref and having a resolution of M bits and that is output based on the clocking rate, CLK. For example, the Do 1 is a digital signal that corresponds to corresponds to an error signal, Ve, such that Ve=Vref−Vin or Vin−Vref.

The use of such an M-bit ADC 910 provides many performance improvements for certain applications including a reduction of quantization noise and an increase of the output resolution of the ADC, particularly with respect to the Do 1. For example, instead of Do 1 being a single bit resolution digital signal (e.g., a digital stream of 1s and/or 0s), the Do 1 in this diagram is a digital signal having a higher resolution (e.g., of 2, 3, or 4 bits). In some examples, the Do 1 is then provided to the processing module 24, and the processing module 24 is configured to perform any desired digital signal processing operation on the Do 1 to generate the Do 2 (e.g., increase the output resolution and lower the sampling rate, perform low pass filtering, perform bandpass filtering, etc.).

In this diagram, note that the Do 1 may be passed directly to the N-bit DAC 420 such that the Do 1 is used to drive the N-bit DAC 420. However, in certain examples, the Do 2 is used to drive the N-bit DAC 420 such as when it is a filtered and/or digital signal processed version of the Do 1.

In an example of operation and implementation, an ADC (e.g., the ADC of FIG. 900) includes a capacitor that is operably coupled to a load and configured to produce a load voltage based on charging by a load current and a digital to analog converter (DAC) output current. In some examples, the ADC is coupled to the load via a single line.

The ADC also includes an M-bit analog to digital converter (ADC). When enabled, the M-bit ADC operably coupled and configured to receive the load voltage, receive a reference voltage, and compare the load voltage to the reference voltage and generate a first digital output signal that is representative of a difference between the load voltage and the reference voltage.

The ADC also includes a processing module operably coupled to the digital circuit and to memory, which may be included within the ADC or external to the ADC. When enabled, the processing module is configured to execute the operational instructions to process the first digital output signal to generate a second digital output signal that is representative of the difference between the load voltage and the reference voltage. Note that the second digital output signal includes a higher resolution than the first digital output signal.

The ADC also includes an N-bit digital to analog converter (DAC) that is operably coupled to the processing module. When enabled, the N-bit DAC is operably coupled and configured to generate the DAC output current based on the second digital output signal. Note that the DAC output current tracks the load current, and the load voltage tracks the reference voltage. N is a first positive integer, and M is a second positive integer greater than or equal to 1. In some examples, N is greater than M. In other examples, N is the first positive integer that is less than or equal to 8, and M is the second positive integer that is greater than or equal to 1 and less than or equal to 4.

In even other examples, the one or more processing modules, when enabled, is further configured to process the first digital output signal in accordance with performing band pass filtering or low pass filtering to generate the second digital output signal that is representative of the load voltage.

In addition, in certain examples, the ADC includes a decimation filter coupled to the one or more processing modules. When enabled, the decimation filter is operably coupled and configured to process the second digital output signal to generate another digital output signal having a lower sampling rate and a higher resolution than the second digital output signal. Alternative to or in addition to, another decimation filter is coupled to the digital circuit. When enabled, the other decimation filter the operably coupled and configured to process the first digital output signal to generate another digital output signal having a lower sampling rate and a higher resolution than the first digital output signal.

Figure 10:
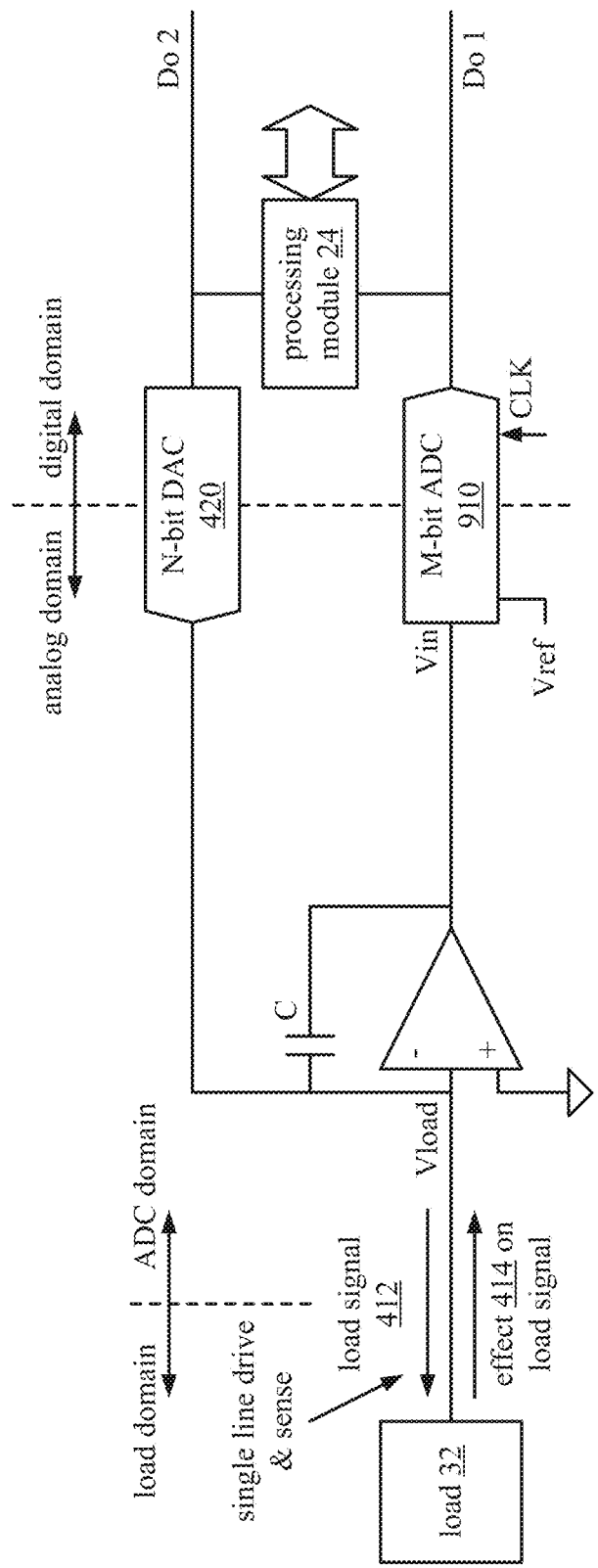
FIG. 10 is a schematic block diagram of another embodiment of an ADC in accordance with the present invention.

FIG. 10 is a schematic block diagram of another embodiment 1000 of an ADC in accordance with the present invention. This diagram is similar to the previous diagram with at least one difference being that the capacitor, C, is replaced by an integrator. The integrator is implemented as an operational amplifier with a feedback capacitor, C. The use of the operational amplifier in place of only the capacitor, C, may be used for applications that are tailored to serve greater power than that of the previous diagram. Generally speaking, the feedback capacitor, C, implemented in cooperation with the operational amplifier serves a similar purpose of the capacitor, C, in the previous diagram of being charged based on the load current and the output current from the N-bit DAC 420 thereby generating the Vin to be provided to the comparator and compared with Vref.

In addition, with respect to all of these examples of an ADC, the ADC operates by providing an output current to the load 32 to cancel out the load current. This may be viewed as providing an output current that is equal to and opposite polarity to the load current. Again, note that such an ADC may be implemented not only to sense an analog signal associated with the load 32 but also to provide power and/or energy to the load 32 within implementations where the load 32 is not energized via another source. In some examples, this providing of power and/or energy from the ADC to the load 32 is performed simultaneously via a single line via which the ADC senses and analog signal associated with the load 32. Also, such an ADC may be implemented to perform sensing only of an analog signal associated with the load 32 without providing power and/or energy to the load 32.

Figure 11:
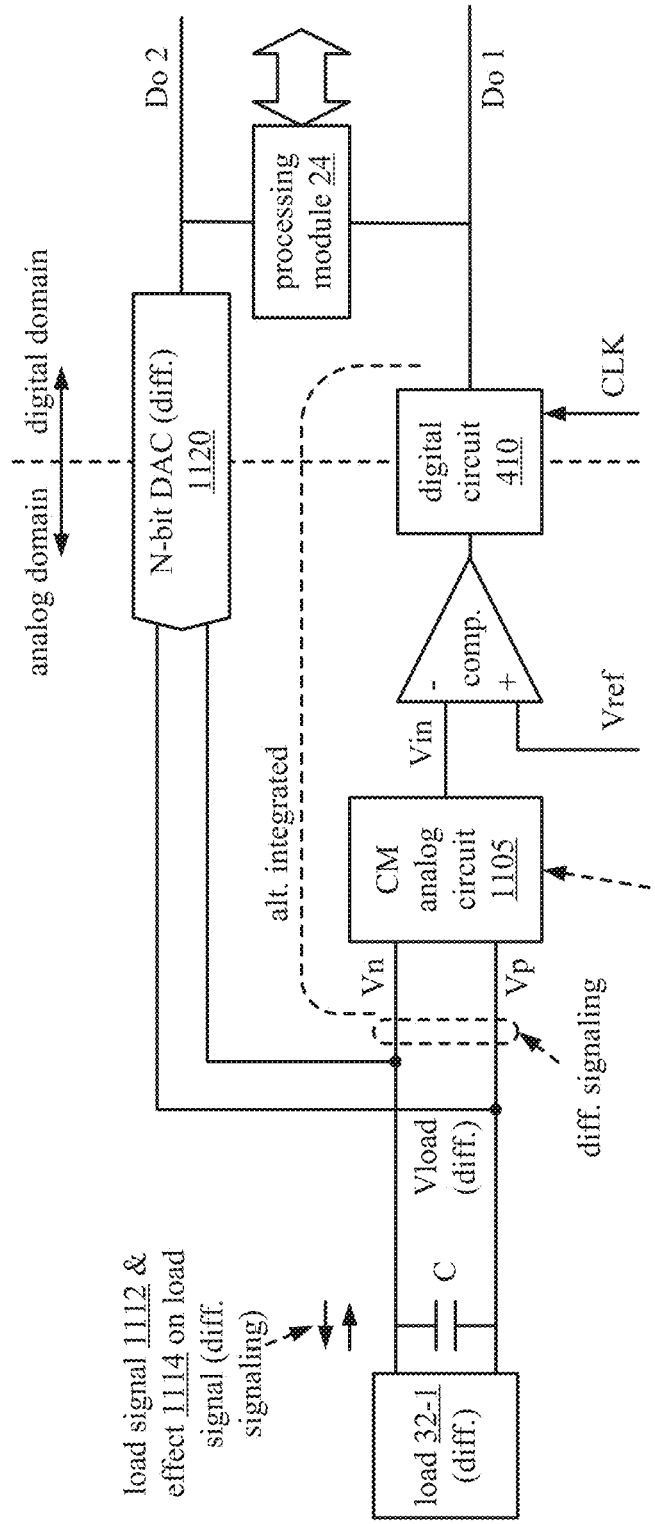
FIG. 11 is a schematic block diagram of an embodiment of an ADC that is operative to process an analog differential signal in accordance with the present invention.

FIG. 11 is a schematic block diagram of an embodiment 1100 of an ADC that is operative to process an analog differential signal in accordance with the present invention. This diagram shows an implementation of an ADC operating on a differential load 32-1 such that the ADC provides a load signal 1112 to the differential load 32-1 and also detects any effect 1114 on that load signal. In this diagram, a capacitor, C, is connected to the differential lead lines of the differential load 32-1. Also, the N of the N-bit DAC 420 is replaced with a differential N-bit DAC 1120, wherein N is a positive integer. The N of the N-bit DAC 420 is operative to generate a differential output current signal that is provided to the differential load 32-1 based on the Do 2.

A differential signal may be viewed as being composed of two respective voltages corresponding to the two differential signal lines, Vp and Vn (e.g., sometimes referred to as a positive voltage, Vp, is a negative voltage, Vn). In this diagram, a common mode (CM) analog circuit 1105 is implemented to convert the differential signal to a single-ended signal. For example, the CM analog circuit 1105 is operative to generate an input voltage, Vin, such that Vin=(Vn+Vp)/2. In some examples, note that the CM analog circuit 1105, the comparator, and the digital circuit 410 are all be implemented within a singular component or device that is operative to process a differential signal and to generate the Do 1 based thereon.

Figure 12:
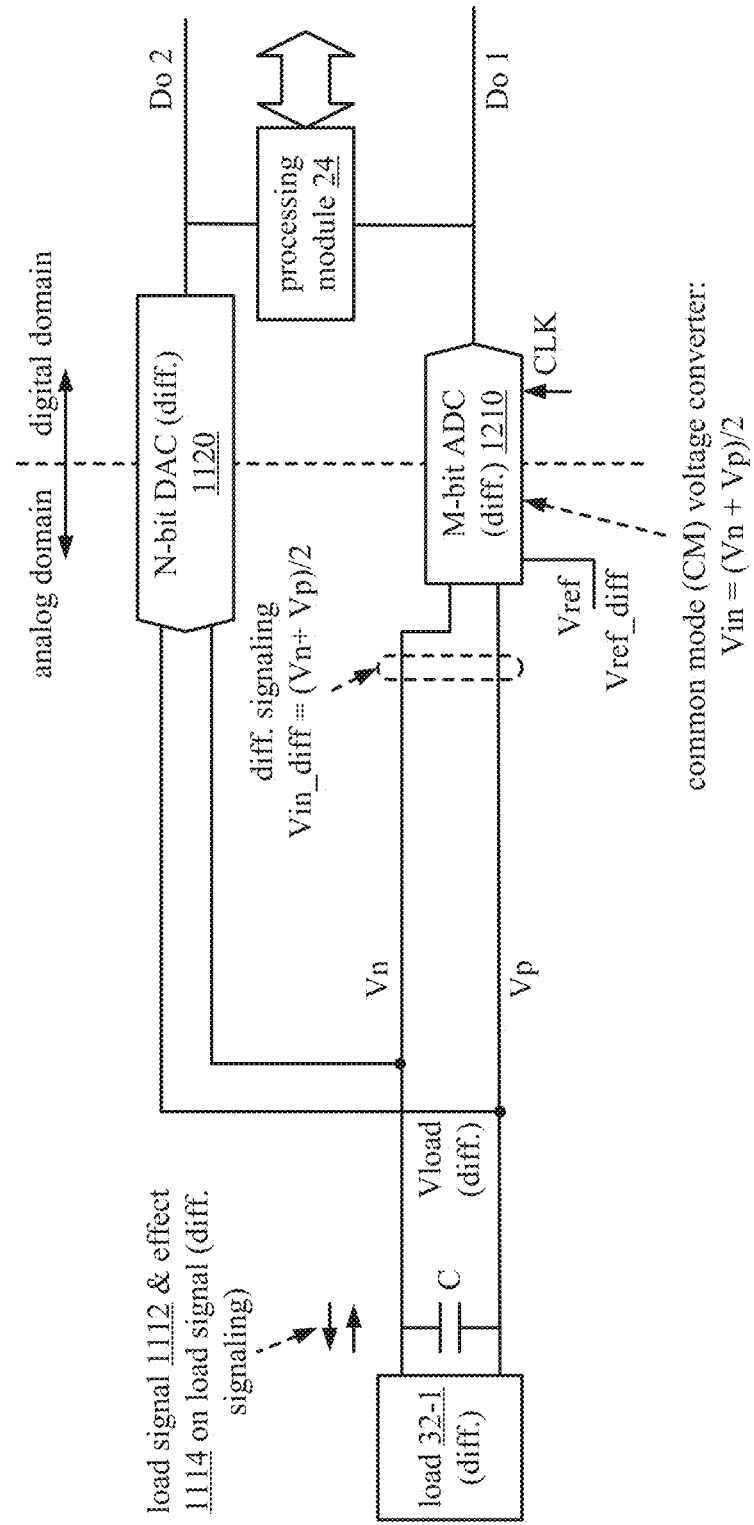
FIG. 12 is a schematic block diagram of another embodiment of an ADC that is operative to process an analog differential signal in accordance with the present invention.

FIG. 12 is a schematic block diagram of another embodiment 1200 of an ADC that is operative to process an analog differential signal in accordance with the present invention. This diagram has certain similarities with the previous diagram with at least one difference being that the CM analog circuit 1105, the comparator, and the digital circuit 410, or a functionally equivalent component to CM analog circuit 1105, the comparator, and the digital circuit 410, is replaced by a low resolution analog to digital converter (ADC), specifically, a differential M-bit ADC 1210, where M is a positive integer greater than or equal to 1. In certain particular examples, M is a positive integer within the range of 1-4 (e.g., 1, 2, 3, or 4).

Also, in certain particular examples, N of the differential N-bit DAC 1120 is less than or equal to M. In certain specific examples, N<8 bit resolution. For example, if N=4, then M=3, 2, or 1. The Do 2 may be viewed as a high-resolution digital signal (N bit resolution) compared to the Do 1 (M bit resolution), such that M<N. In addition, in some examples, the Do 2 is a modified version of the Do 1 after having undergone any desired digital signal processing within the processing module 24.

In certain examples, note that the differential M-bit ADC 1210 is operative to generate the Do 1 as being an error signal that corresponds to a difference between Vin (such that Vin=(Nv+Vp)/2) and Vref and having a resolution of M bits and that is output based on the clocking rate, CLK. For example, the Do 1 is a digital signal that corresponds to corresponds to an error signal, Ve, such that Ve=Vref−Vin or Vin−Vref.

In other examples, note that the differential M-bit ADC 1210 is operative to generate the Do 1 as being an error signal that corresponds to a difference between the differential input voltage signal, Vin_diff, that is composed of Vn and Vp and a differential reference signal, Vref_diff (e.g., Vref_diff being a differential signal that is composed two different reference voltages, such as Vref1 and Vref2, and having a resolution of M bits and that is output based on the clocking rate, CLK. For example, the Do 1 is a digital signal that corresponds to corresponds to an error signal, Ve_diff, that corresponds to the difference between the two differential signals, Ve_diff=Vref_diff−Vin_diff or Vin_diff−Vref_diff.

The use of such a differential M-bit ADC 1210 provides many performance improvements for certain applications including a reduction of quantization noise and an increase of the output resolution of the ADC, particularly with respect to the Do 1. For example, instead of Do 1 being a single bit resolution digital signal (e.g., a digital stream of 1s and/or 0s), the Do 1 in this diagram is a digital signal having a higher resolution (e.g., of 2, 3, or 4 bits). In some examples, the Do 1 is then provided to the processing module 24, and the processing module 24 is configured to perform any desired digital signal processing operation on the Do 1 to generate the Do 2 (e.g., increase the output resolution and lower the sampling rate, perform low pass filtering, perform bandpass filtering, etc.).

In this diagram, note that the Do 1 may be passed directly to the differential N-bit DAC 1120 such that the Do 1 is used to drive the differential N-bit DAC 1120. However, in certain examples, the Do 2 is used to drive the differential N-bit DAC 1120 such as when it is a filtered and/or digital signal processed version of the Do 1.

Figure 13:
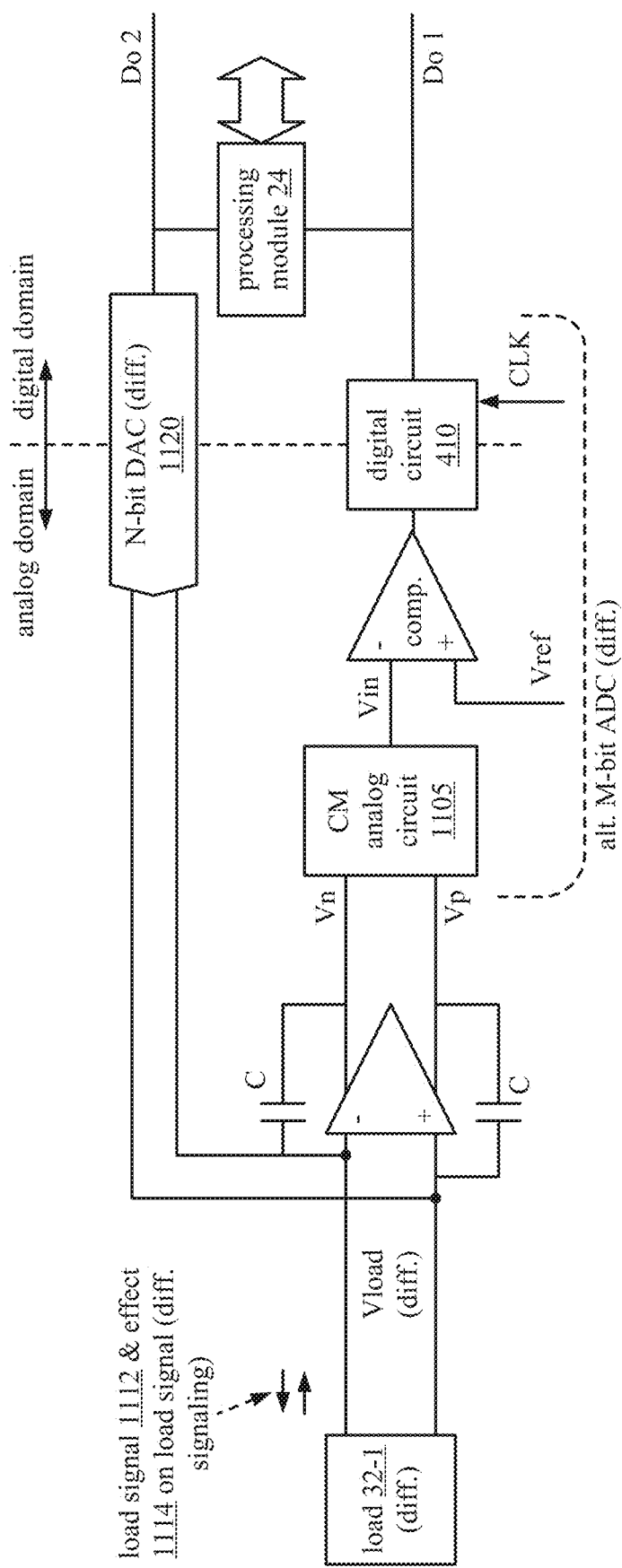
FIG. 13 is a schematic block diagram of another embodiment of an ADC that is operative to process an analog differential signal in accordance with the present invention.

FIG. 13 is a schematic block diagram of another embodiment 1300 of an ADC that is operative to process an analog differential signal in accordance with the present invention. This diagram has certain similarities to certain of the previous diagrams that operate based on differential signaling with at least one difference being that the capacitor, C, that was connected between the differential signal lines of the load 32-1 is replaced by a differential integrator with two respective feedback capacitors, C. The differential integrator is implemented as an operational amplifier with two respective feedback capacitors, C, and is operative to generate a differential input signal is based on Vn and Vp. The use of the operational amplifier in place of only the capacitor, C, two respective feedback capacitors, C may be used for applications that are tailored to serve greater power than that of the previous diagram. Generally speaking, the two respective feedback capacitors, C, implemented in cooperation with the differential operational amplifier serve a similar purpose of the capacitor, C, that was connected between the differential signal lines of the load 32-1 in the previous diagram of being charged based on the differential load current and the differential output current from the differential N-bit DAC 1120 thereby generating the Vin to be provided to the comparator and compared with Vref.

Note that the CM analog circuit 1105, the comparator, and the digital circuit 410 may alternatively be replaced with a differential M-bit ADC 1210 such as in accordance with the previous diagram.

Figure 14A:
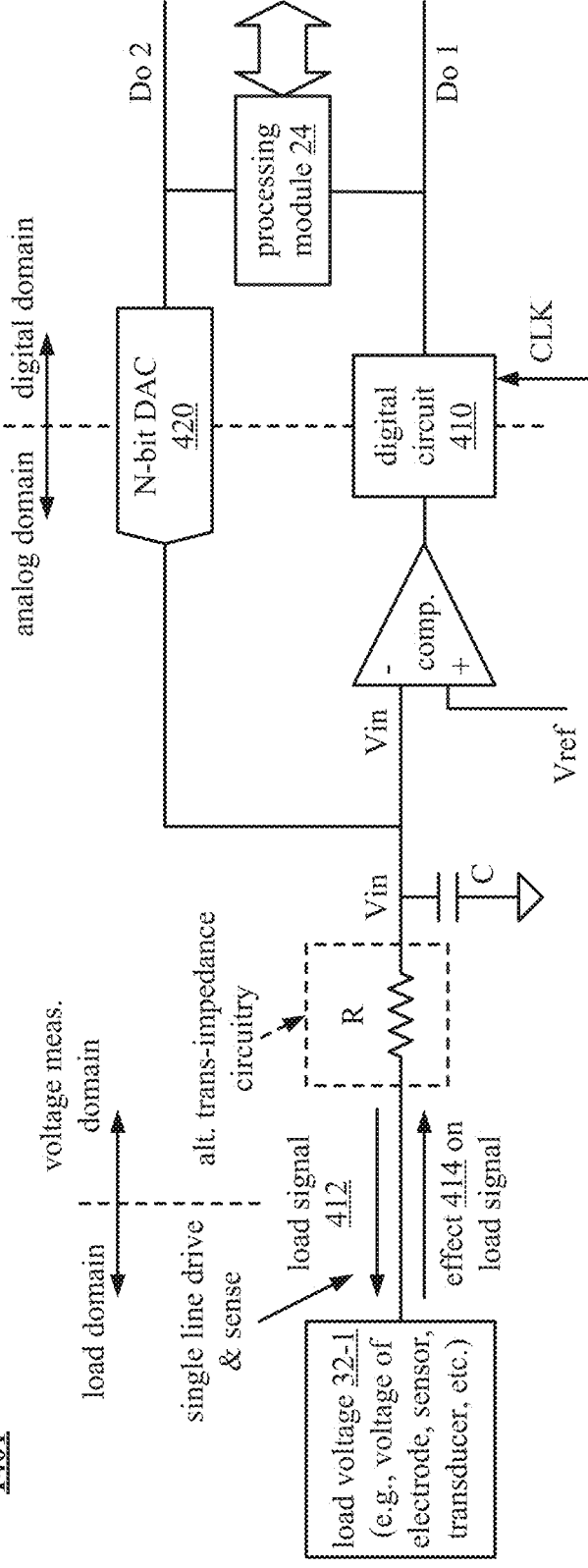
FIG. 14A is a schematic block diagram of an embodiment an ADC that is operative to perform voltage measurement in accordance with the present invention.

FIG. 14A is a schematic block diagram of an embodiment 1401 an ADC that is operative to perform voltage measurement in accordance with the present invention. This diagram has some similarities with the previous diagrams with at least one difference being that the load 32 is replaced by the load voltage 32-1, which may be a voltage of any of a number of devices including the load 32. Examples of such a load voltage 32-1 include any of the voltage of an electrode, sensor, transducer, etc. Another difference within this diagram is that a resistor, R, is placed in line with the single line that connects her couples the ADC that is operative to perform voltage measurement and the load voltage 32-1. For example, the load voltage 32-1, when dropping across the resistor, R, to generate the input voltage, Vin, will provide a current signal that will charge the capacitor, C, that is provided to one of the inputs of the comparator. Generally speaking, a load voltage 32-1 can be measured by inserting a resistor, R, between the load voltage 32-1 and the ADC so as to facilitate conversion of the load voltage 32-1 to a current, Iin, that is equal to the difference between the load voltage 32-1, Vload, and Vin, such that Iin=(Vload−Vin)/R. note also that a prince impedance circuitry may alternatively be implemented that is operative to convert a voltage to a current signal such that the current signal may be sensed by an ADC as described herein.

Figure 14B:
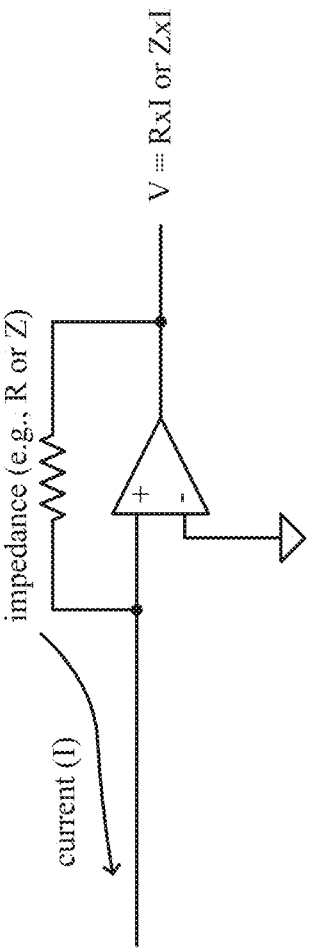
FIG. 14B is a schematic block diagram of an embodiment an transimpedance amplifier that may be implemented within an ADC that is operative to perform voltage measurement in accordance with the present invention.

FIG. 14B is a schematic block diagram of an embodiment 1402 an transimpedance amplifier that may be implemented within an ADC that is operative to perform voltage measurement in accordance with the present invention. The trans-impedance circuitry includes a buffer, operational amplifier, etc. having a first input coupled to the ground potential, and a second input coupled to a node that is sourcing or sinking current, such as the node connected to the N-bit DAC 420. An impedance (shown as an R or generically a Z, which may have inductive and/or capacitive reactants components) is also coupled from the second input to the output of the buffer, operational amplifier, etc. A current, I, that flows through the impedance generates an output voltage, V, that is based on the impedance times the current, I (e.g., V=RxI or ZxI). Such a trend impedance amplifier, or any appropriate circuit or component that is operative to perform voltage to current signal conversion, or vice versa, may be used in place of the resistor shown within the previous diagram.

FIG. 15 is a schematic block diagram showing an embodiment 1500 of digital domain filtering within an ADC in accordance with the present invention. This diagram shows an alternative implementation to having a processing module 24 implemented to receive him perform any desired digital signal processing on the Do 1 and to generate the Do 2. Specifically, a filter 1510 is implemented to process the Do 1 to generate the Do 2. Note that the filter 1510 may be of any desired type of digital filter. In certain examples, bandpass filtering or low pass filtering is performed by the filter 1510 to filter out high-frequency quantization noise within the Do 1 in accordance with generating the Do 2. Possible examples of a low pass filter or low pass filter operation may be implemented based on an accumulator or in integrator. For example, consider an application tailored for detecting a DC analog signal, or for detecting an analog signal having a frequency within the voice frequency bands such as 20 kHz to 100 kHz, then appropriate low pass filtering or bandpass filtering is performed by the filter 1510 to filter out high-frequency quantization noise within the Do 1 in accordance with generating the Do 2.

In certain examples, note that a processing module 24 may be in communication with the filter 1510 such that the particular filtering to be performed by the filter 1510 is configurable based on control signaling from the processing module 24. For example, consider the filter 1510 to be a configurable or selectable filter that includes one or more options of bandpass filtering or low pass filtering. The processing module 24 is configured to select a first type of filtering to be performed at or during a first time and a second type of filtering to be performed at or during a second time, and so on.

FIG. 16 is a schematic block diagram showing an embodiment 1600 of digital domain filtering using cascaded filters within an ADC in accordance with the present invention. This diagram shows digital signal processing based on a cascade of N and pass filters or N low pass filters. In a particular example, N=10. The gain elements, K1 through KN, are amplification constants that are used to stabilize the feedback loop from any digital output signal that is generated by the respective cascade of N filter (e.g., filter 1 through filter N) that provide the digital input control signal to the N-bit DAC 420. The different respective game factors operate to stabilize the feedback that is provided to the N-bit DAC 420. Note that this implementation is operative to provide a number of different respective digital output signals, shown as Do 1, Do 2 through Do N as corresponding to the respective outputs from the respective cascade of N filter (e.g., filter 1 through filter N). Note that any one or more decimation filters may also be implemented to perform decimation filtering of the digital output signals, shown as Do 1, Do 2 through Do N as corresponding to the respective outputs from the respective cascade of N filter (e.g., filter 1 through filter N).

Figure 17:
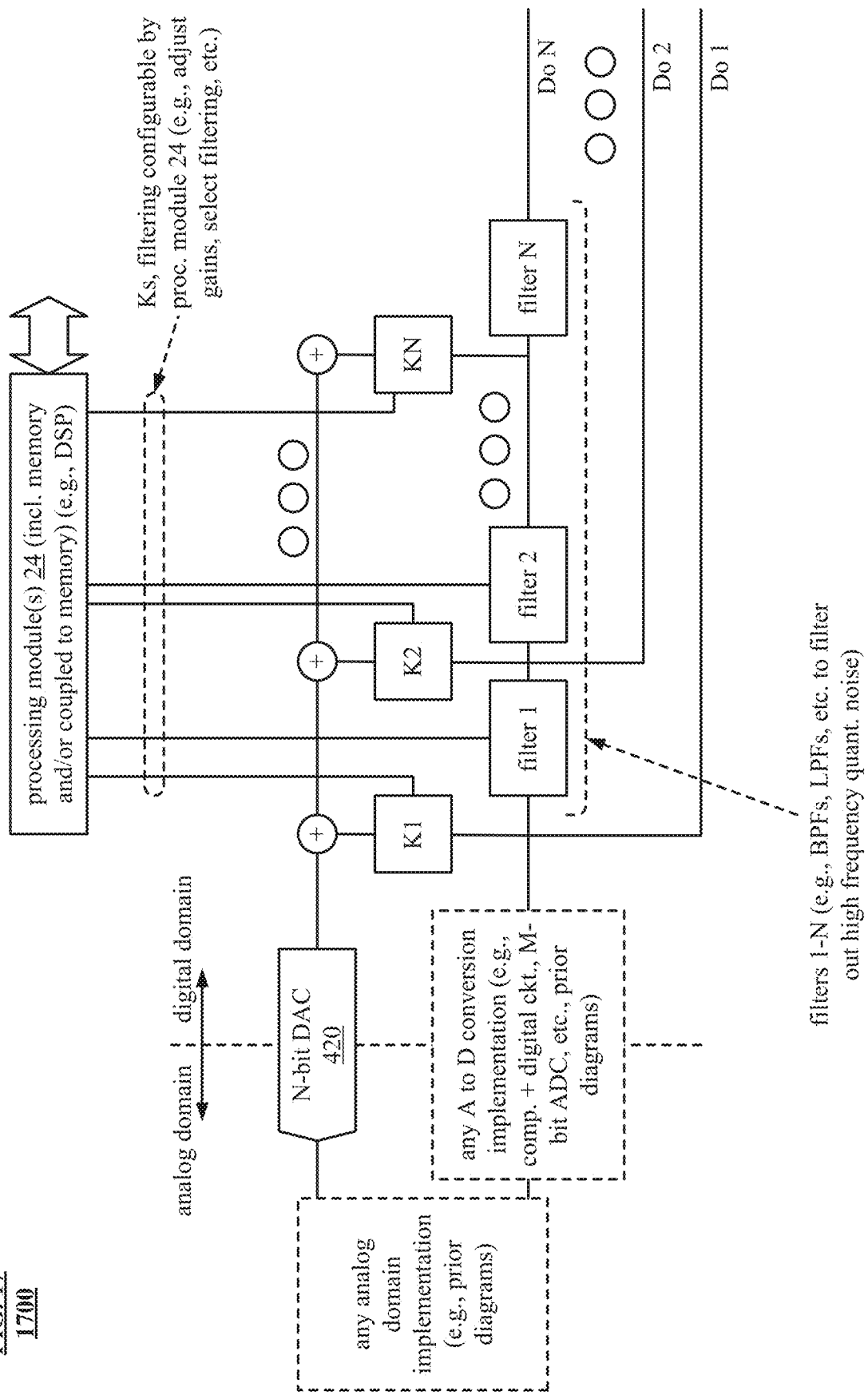
FIG. 17 is a schematic block diagram showing another embodiment of digital domain filtering using configurable/adjustable cascaded filters within an ADC in accordance with the present invention.

FIG. 17 is a schematic block diagram showing another embodiment 1700 of digital domain filtering using configurable/adjustable cascaded filters within an ADC in accordance with the present invention. This diagram is similar to the previous diagram with at least one difference being that one or more processing modules 24 is coupled or connected to each of the respective gain elements (K1 through KN) and the respective cascade of N filter (e.g., filter 1 through filter N). The one or more processing modules 24 is configured to adjust a gains of the respective gain elements (K1 through KN) and mean particular characteristics by which filtering is performed by the respective cascade of N filter (e.g., filter 1 through filter N).

For example, the one or more processing modules 24 is configured to select a first set of gains for the respective gain elements (K1 through KN) and a first type of filtering to be performed by the respective cascade of N filter (e.g., filter 1 through filter N) at or during a first time and a second set of gains for the respective gain elements (K1 through KN) and a second type of filtering to be performed by the respective cascade of N filter (e.g., filter 1 through filter N) at or during a second time.

Figure 18:
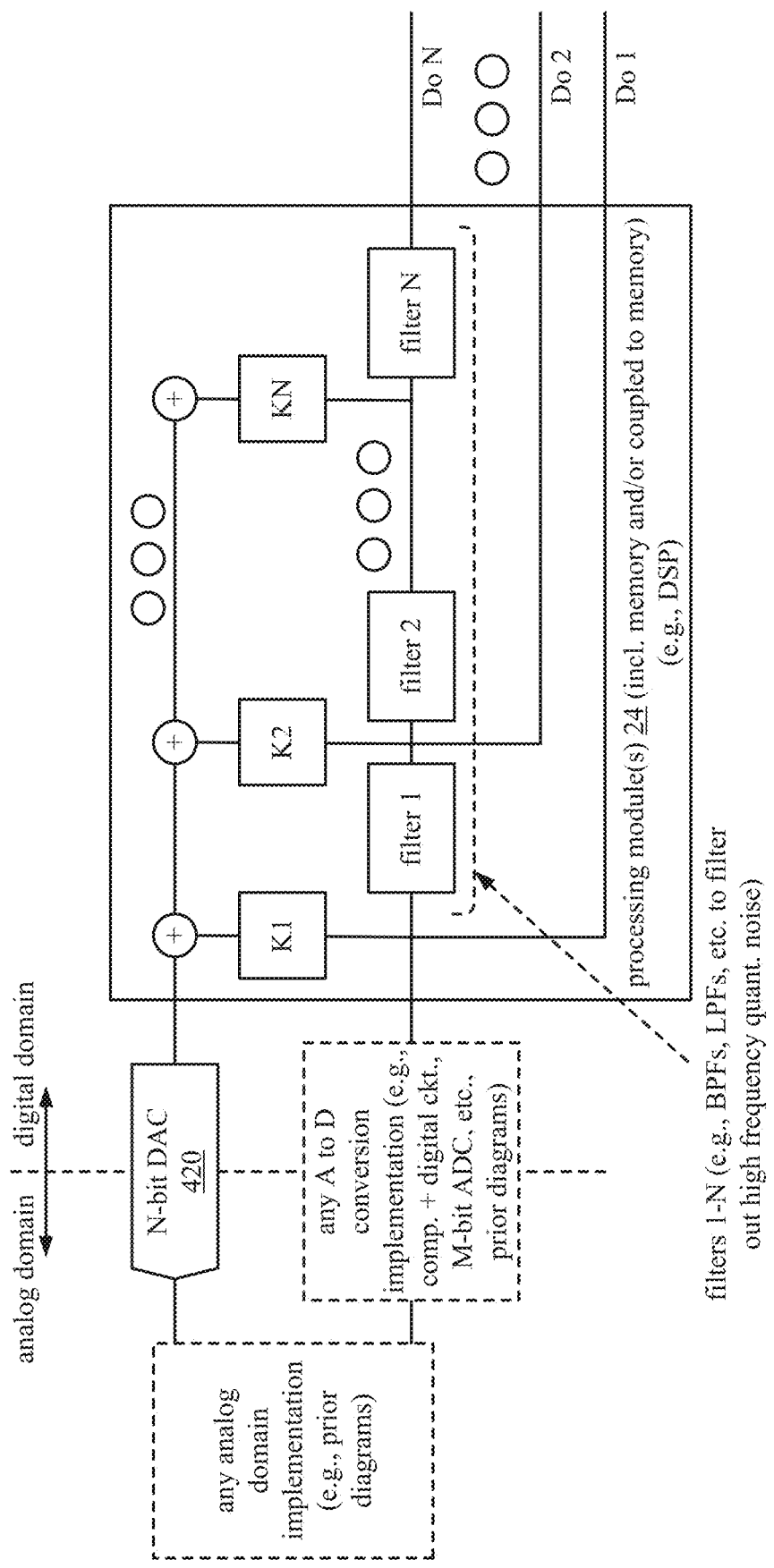
FIG. 18 is a schematic block diagram showing an embodiment of one or more processing modules implemented to perform digital domain filtering within an ADC in accordance with the present invention.

FIG. 18 is a schematic block diagram showing an embodiment 1800 of one or more processing modules implemented to perform digital domain filtering within an ADC in accordance with the present invention. This diagram includes one or more processing modules 24 that is operative to perform the filtering pictorially illustrated within the previous diagram. For example, one or more processing modules 24 may be implemented perform any desired digital signal processing of any of the respective digital output signals, shown as Do 1, Do 2 through Do N including the digital signal processing pictorially described with respect to the previous diagram. In this diagram, the one or more processing modules 24 itself for themselves performs the digital signal processing. In the previous diagram, separate and distinct digital signal processing components are implemented, ending one or more processing modules 24 of that diagram are operative to control and configure the manner in which those digital signal processing components operate.

In addition, alternative examples of an ADC may be implemented using a non-linear N-bit DAC that operates based on a non-linear function. For example, a non-linear N-bit DAC is operative to provide an output current based on the non-linear function of the digital input signal provided to it. Such a non-linear function may be described also as a non-linear companding function such that companding corresponds to a non-linear response of the ADC based on the signal it receives and/or senses. In such a non-linear N-bit DAC, the output current is a non-linear function of the input.

Considering one possible example of an ADC that includes a non-linear N-bit DAC, the digital output signal (e.g., the Do 1 and/or the Do 2 signal) that is generated by such an ADC is a non-linear function of the analog signal that it is sensing. Consider an ADC that includes a non-linear N-bit DAC and operates based on a logarithmic function when sensing a current signal, then the digital output signal (e.g., the Do 1 and/or the Do 2 signal) is a logarithmic function of the input current. Such an ADC that includes a non-linear N-bit DAC may be referred to as a companding ADC. Generally speaking, such an ADC that provides for a non-linear response when generating a digital output signal based on the analog signal that it is sensing may be referred to as a companding ADC.

Note that such a companding ADC may also be implemented to perform simultaneous driving and sensing of a signal via that single line that connects or couples to the load. For example, such an ADC is operative to drive an analog signal (e.g., current and/or voltage) of a load 32. With respect to implementations that operate in accordance with sensing analog current signals, such a companding ADC is also operative to sense current signals within an extremely broad range including very low currents (e.g., currents below the 1 pico-amp range, within the 10s of pico-amps range, below the 1 nano-amp range, within the 10s of nano-amps range, below the 1 micro-amp range, within the 10s of micro-amps range, etc.) and also up to relatively much larger currents (e.g., currents in the 10s milli-amps range, 100s milli-amps range, or even higher values of amps range, etc.). In some examples, such as with respect to detecting currents that are provided from a photodetection or photodiode component, such a companding ADC is also operative to sense current signals below the 1 pico-amp range, currents within the 100s of micro-amps range, etc.

Also, in some examples, when using appropriately provisioned components (e.g., higher current, higher power, etc.), much higher currents can also be sensed using architectures and topologies in accordance with a companding ADC as described herein. For example, such a companding ADC implemented based on architectures and topologies, as described herein, using appropriately provisioned components are be operative to sense even higher currents (e.g., is of amps, 10s of amps, or even higher values of amps range, etc.).

In addition, note that various implementations of such a companding ADC may be implemented to cover a number of decades orders of magnitude. For example, consider a companding ADC that is implemented to detect current signals radiating from the 10s of pico-amps to ones of milli-amps. Such a companding ADC would cover a dynamic range of 7-8 decades or 7-8 orders of magnitude. Within such an example, such a very broad dynamic range may be divided using a log scale into the 7-8 decades, such that there are a few data points within each particular decade. Note also that there is a trade-off regarding the resolution of the digital output signal (e.g., the Do 1 and/or the Do 2 signal) that is generated by such a companding ADC and range of current signals that may be sensed. For example, when the dynamic range of signals to be sensed by such a companding ADC is relatively large, then there can be limitations on sensing very low currents with a high degree of accuracy.

Generally speaking, the broader the dynamic range of signals to be sensed, then a higher resolution of the digital output signal (e.g., the Do 1 and/or the Do 2 signal) provides for a higher degree of accuracy, particularly when sensing very low currents. Consider an example in which currents within a dynamic range of 10s of pico-amps to 100s of micro-amps is to be sensed (e.g., within a photodetection or photodiode component), then generating a digital output signal using a certain number of bits (e.g., a resolution of 12 bits) may be insufficient to cover the entire range. Within such a particular example, increasingly resolution of the digital output signal (e.g., to a resolution of 16 bits) can help facilitate sensing of signals with higher resolution and also assist sensing very low currents with a high degree of accuracy.

Several the following diagrams have similarities to the prior diagrams with at least one difference being that a non-linear N-bit DAC 1920 is implemented to generate the current that is output to a load that matches or tracks the current of the load. Similarly, as described with respect to other examples of an ADC, the companding ADCs of these subsequent diagrams also operate by providing an output current to the load 32 to cancel out the load current. This may be viewed as providing an output current that is equal to and opposite polarity to the load current. Note also that such a companding ADC may be implemented not only to sense an analog signal associated with the load 32 but also to provide power and/or energy to the load 32 within implementations where the load 32 is not energized via another source. In some examples, this providing of power and/or energy from the companding ADC to the load 32 is performed simultaneously via a single line via which the companding ADC senses and analog signal associated with the load 32. Also, such a companding ADC may be implemented to perform sensing only of an analog signal associated with the load 32 without providing power and/or energy to the load 32.

Generally speaking, with respect to such non-linear N-bit DACs, such as the non-linear N-bit DAC 1920, the output current provided there from is a non-linear function of the Do 2. Therefore, the Do 2 itself is also an inverse function of the load current, given that the output current from the non-linear N-bit DAC 1920 is operative to match or track the current of the load (e.g., being equal and opposite of the current of the load thereby minimizing the error signal that is based on the difference between Vref and Vin).

Figure 19:
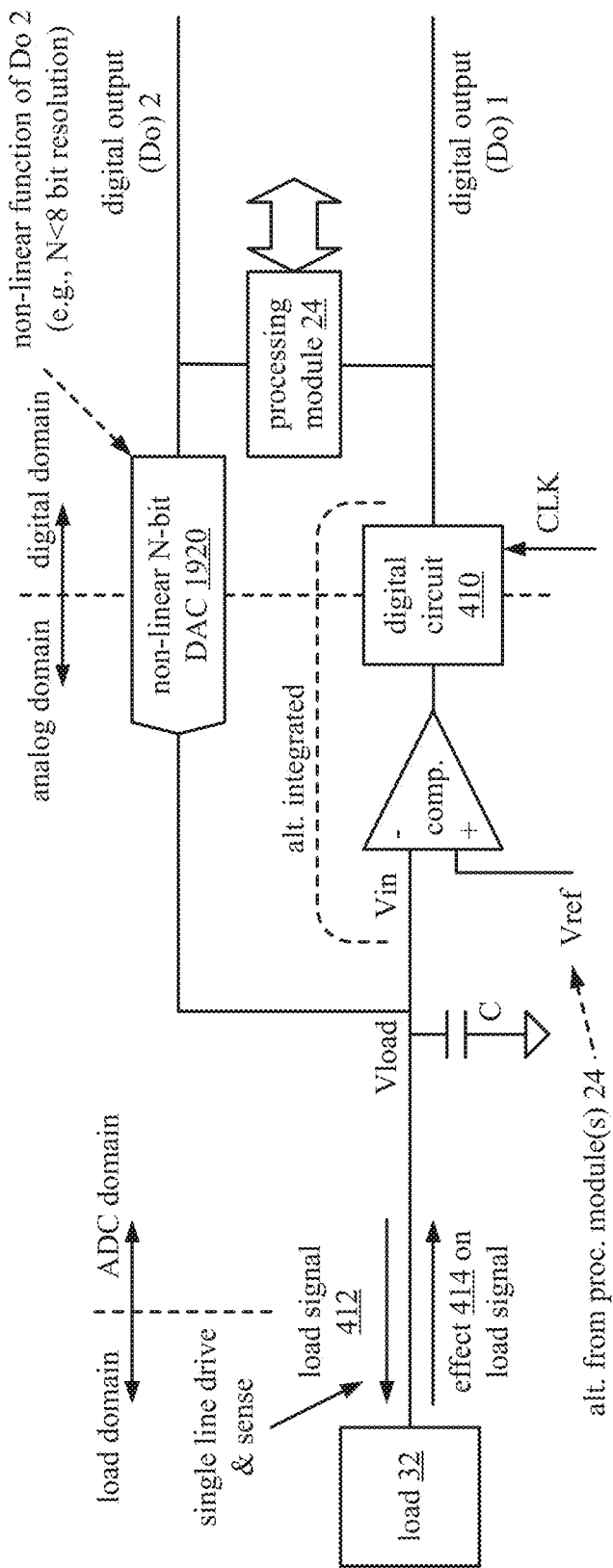
FIG. 19 is a schematic block diagram of an embodiment of an ADC that includes a non-linear N-bit digital to analog converter (DAC) in accordance with the present invention.

FIG. 19 is a schematic block diagram of an embodiment 1900 of an ADC that includes a non-linear N-bit digital to analog converter (DAC) in accordance with the present invention. This diagram is similar to certain of the previous diagrams (e.g., FIG. 4) that include a comparator and a digital circuit 410 that generates the Do 1 that is provided to the processing module 24. The processing module 24 processes the Do 1 to generate the Do 2. Also, an analog capacitor, C, is connected to a node that couples the load 32 to the companding ADC (e.g., an ADC that includes a non-linear N-bit digital to DAC, an ADC that provides for a non-linear response when generating a digital output signal based on the analog signal that it is sensing).

However, in this diagram, a non-linear N-bit DAC 1920 is implemented to generate the current signal that is provided to the node that connects or couples the companding ADC to the load 32 to match and track the current signal of the load.

Many of the subsequent diagrams include similar components and operate similarly with at least one difference being that they operate as companding ADCs such that they provide for a non-linear response when generating a digital output signal based on the analog signal that it is sensing. Many of the diagrams include a non-linear N-bit DAC 1920 is implemented in place of the N-bit DAC 420.

Figure 20:
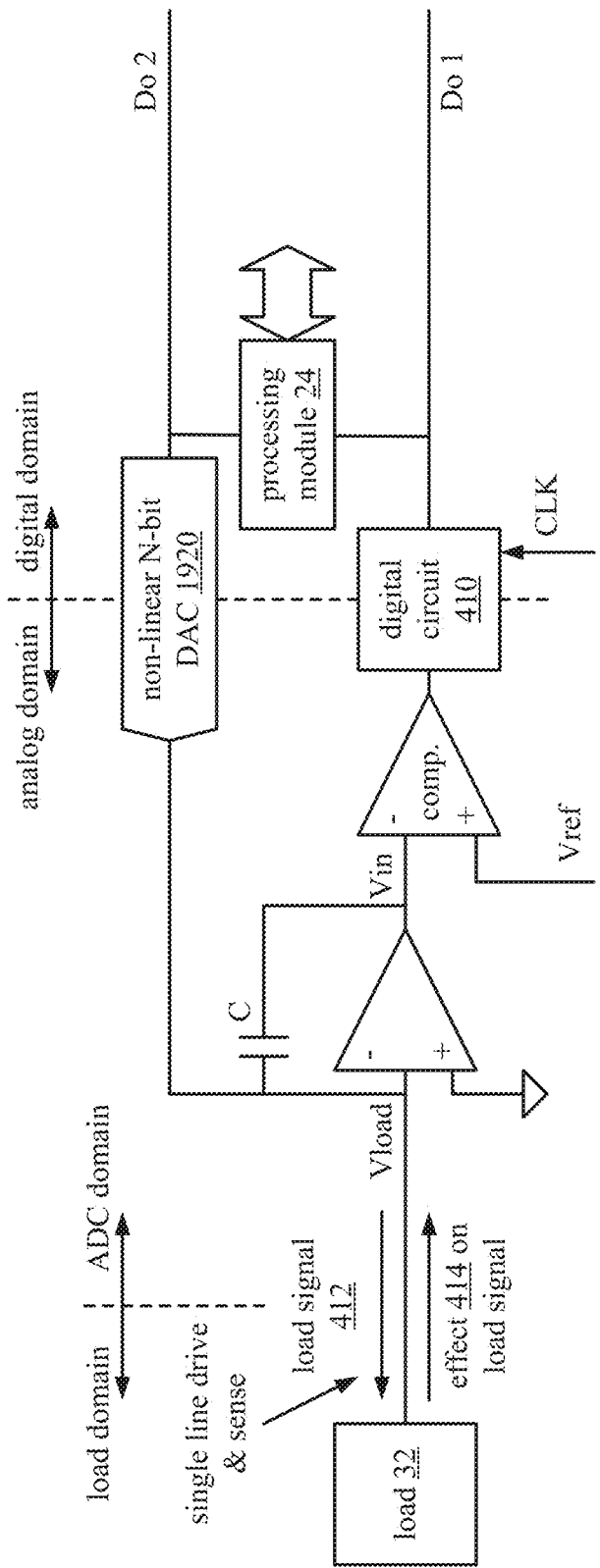
FIG. 20 is a schematic block diagram of another embodiment of an ADC that includes a non-linear N-bit DAC in accordance with the present invention.

FIG. 20 is a schematic block diagram of another embodiment 2000 of an ADC that includes a non-linear N-bit DAC in accordance with the present invention. This diagram is similar to FIG. 8 with a difference being that a non-linear N-bit DAC 1920 is implemented in place of the N-bit DAC 420.

Figure 21:
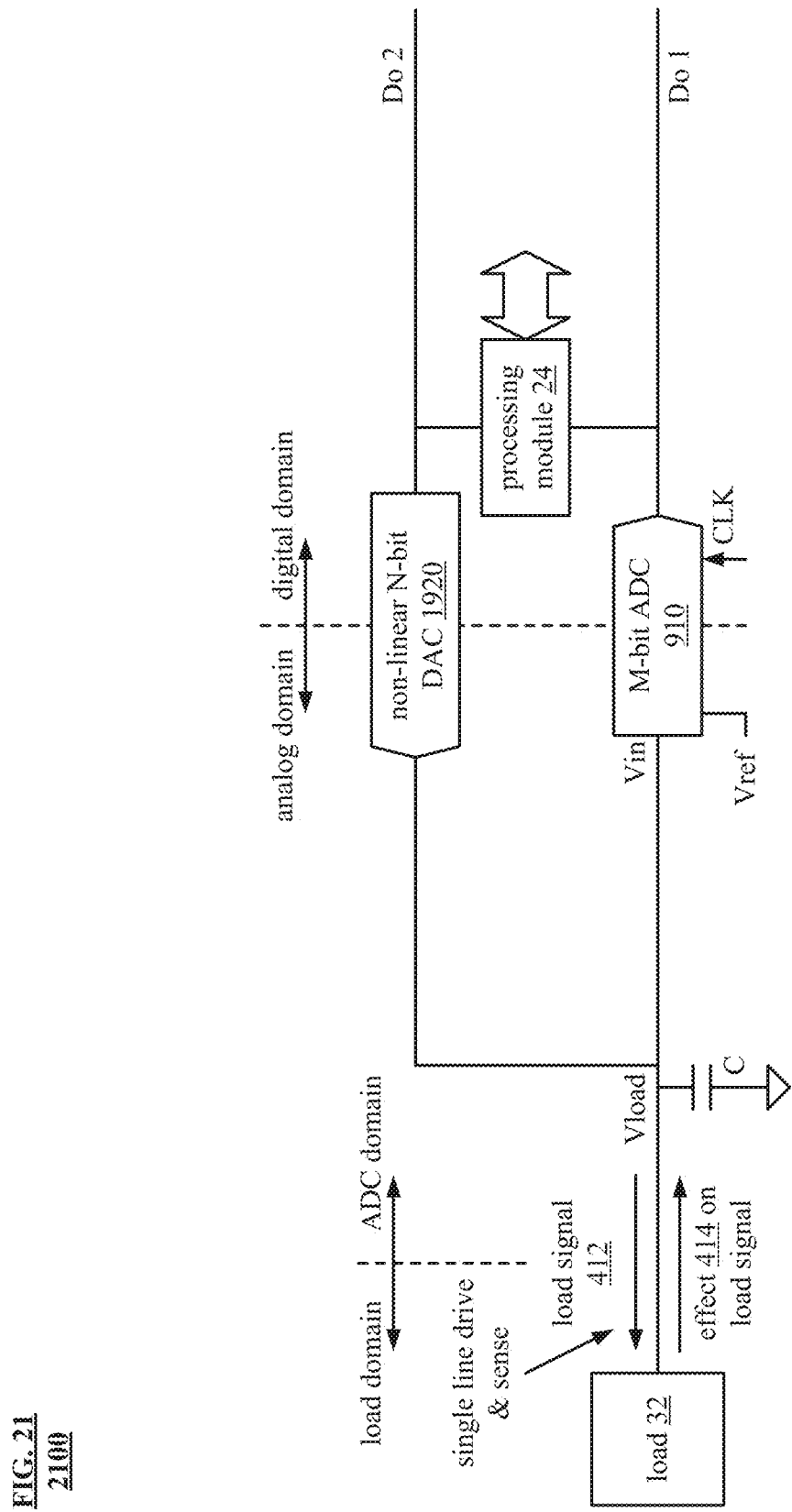
FIG. 21 is a schematic block diagram of another embodiment of an ADC that includes a non-linear N-bit DAC in accordance with the present invention.

FIG. 21 is a schematic block diagram of another embodiment 2100 of an ADC that includes a non-linear N-bit DAC in accordance with the present invention. This diagram is similar to FIG. 9 with a difference being that a non-linear N-bit DAC 1920 is implemented in place of the N-bit DAC 420.

Figure 22:
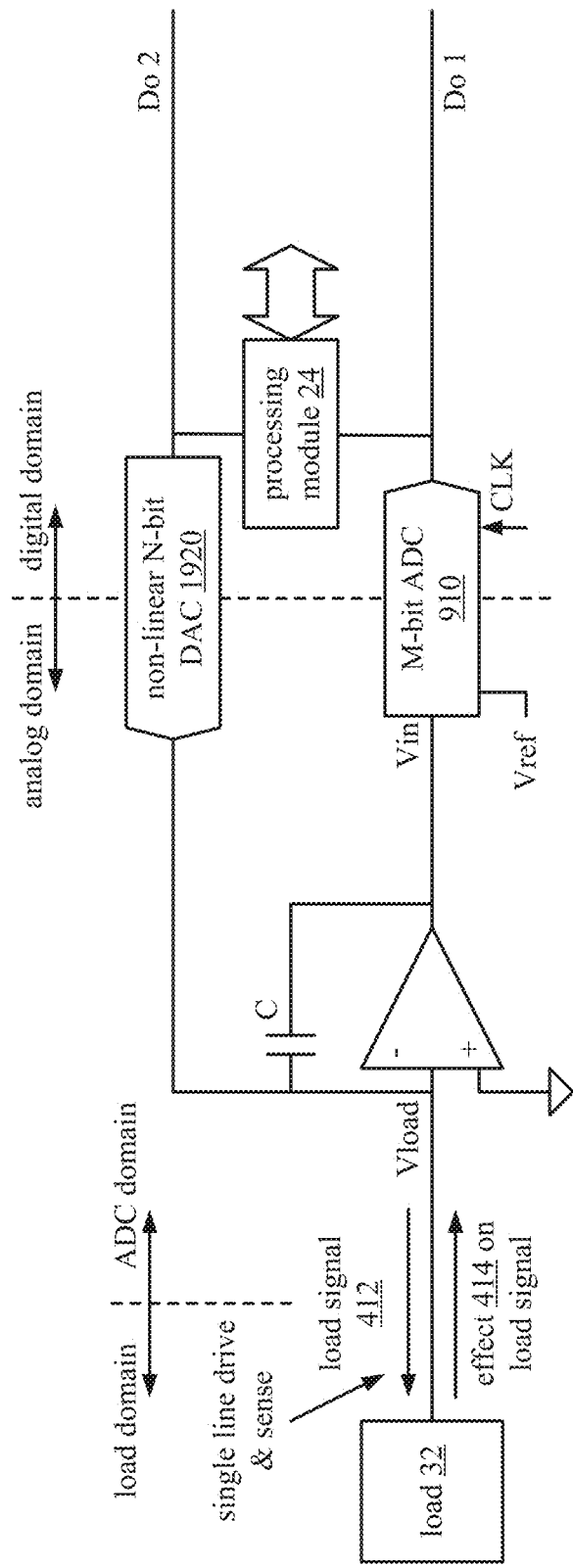
FIG. 22 is a schematic block diagram of another embodiment of an ADC that includes a non-linear N-bit DAC in accordance with the present invention.

FIG. 22 is a schematic block diagram of another embodiment 2200 of an ADC that includes a non-linear N-bit DAC in accordance with the present invention. This diagram is similar to FIG. 10 with a difference being that a non-linear N-bit DAC 1920 is implemented in place of the N-bit DAC 420.

Figure 23:
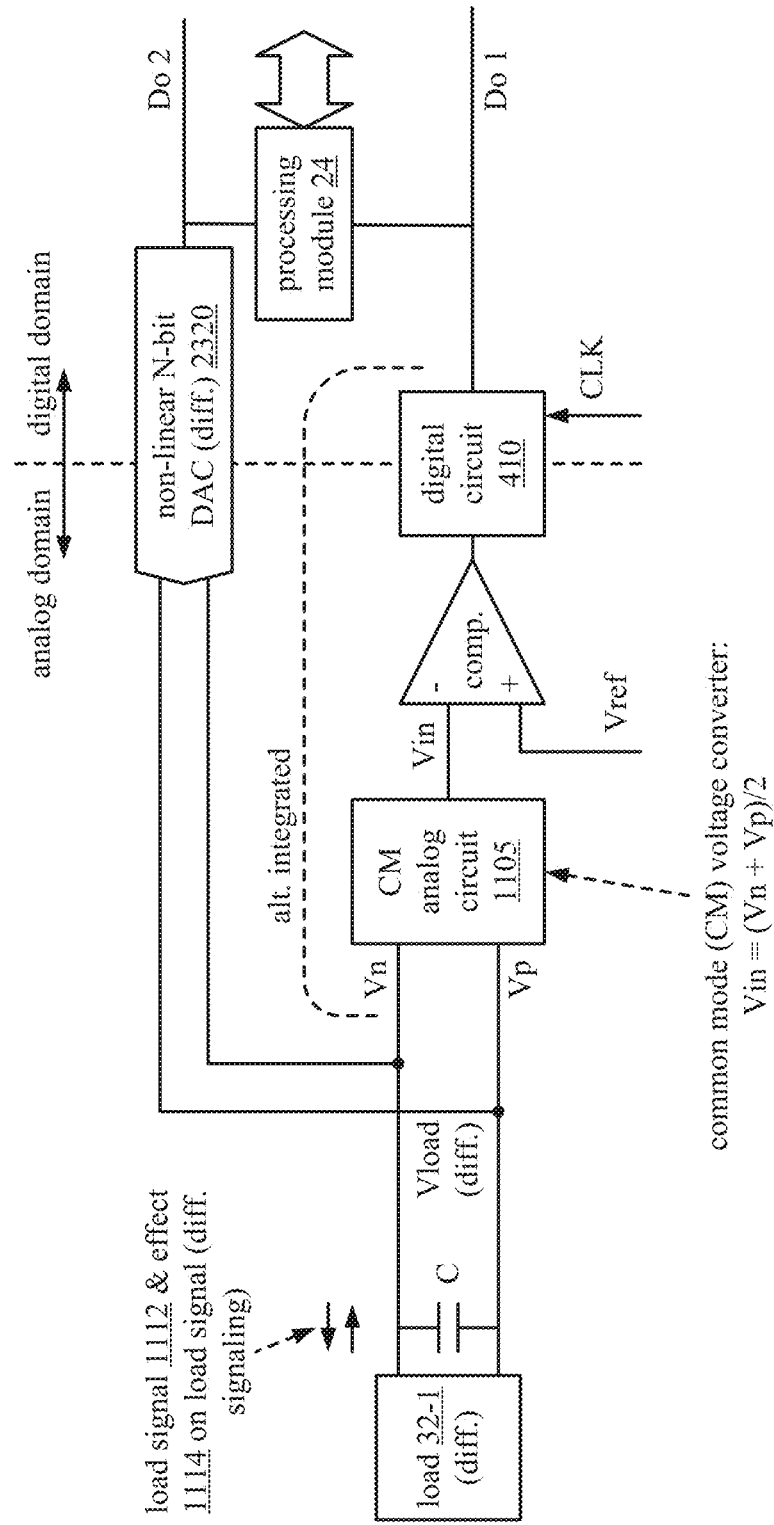
FIG. 23 is a schematic block diagram of an embodiment of an ADC that includes a non-linear N-bit DAC that is operative to process an analog differential signal in accordance with the present invention.

FIG. 23 is a schematic block diagram of an embodiment 2300 of an ADC that includes a non-linear N-bit DAC that is operative to process an analog differential signal in accordance with the present invention. This diagram is similar to FIG. 11 with a difference being that a differential non-linear N-bit DAC 2320 is implemented in place of the differential N-bit DAC 1120.

Figure 24:
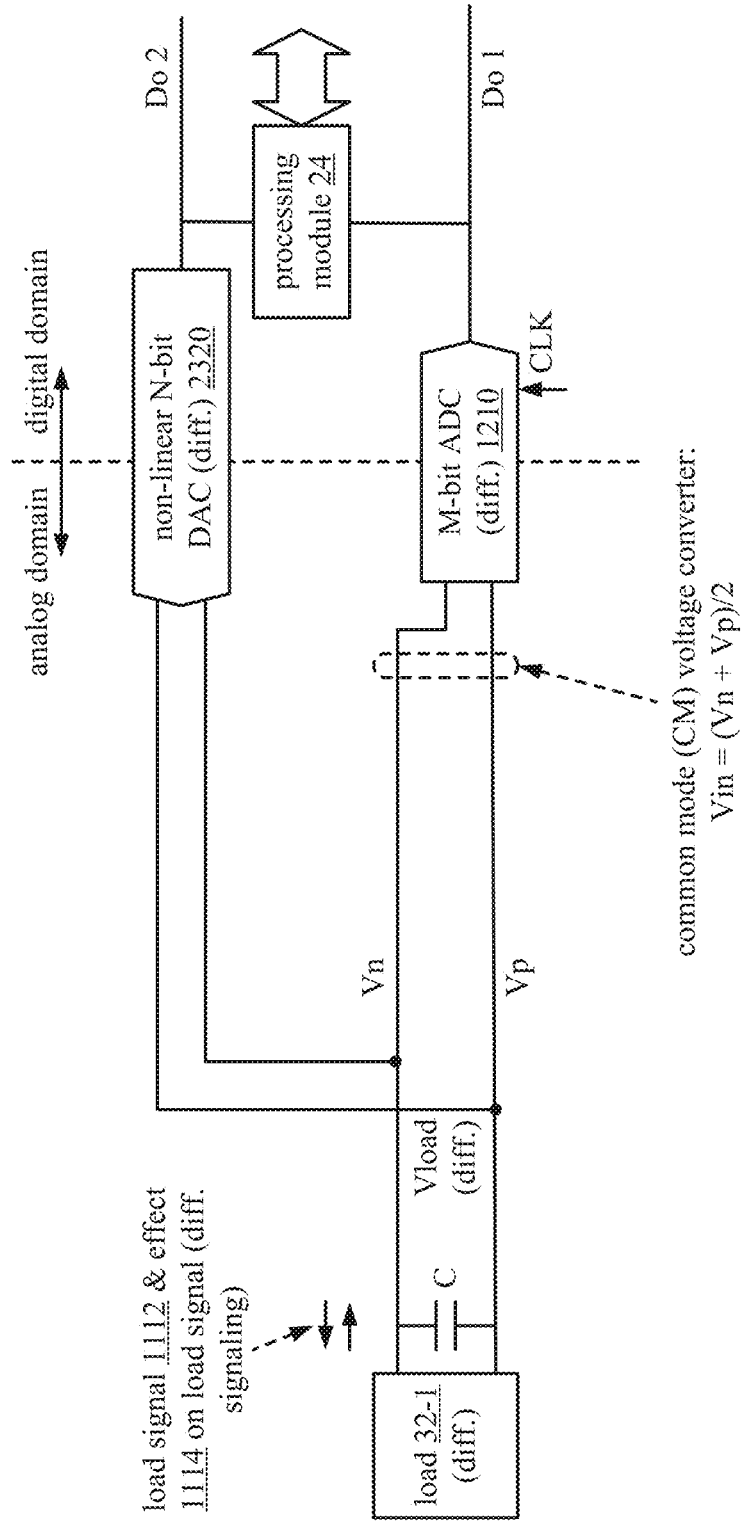
FIG. 24 is a schematic block diagram of another embodiment of an ADC that includes a non-linear N-bit DAC that is operative to process an analog differential signal in accordance with the present invention.

FIG. 24 is a schematic block diagram of another embodiment 2400 of an ADC that includes a non-linear N-bit DAC that is operative to process an analog differential signal in accordance with the present invention. This diagram is similar to FIG. 12 with a difference being that a differential non-linear N-bit DAC 2320 is implemented in place of the differential N-bit DAC 1120.

Figure 25:
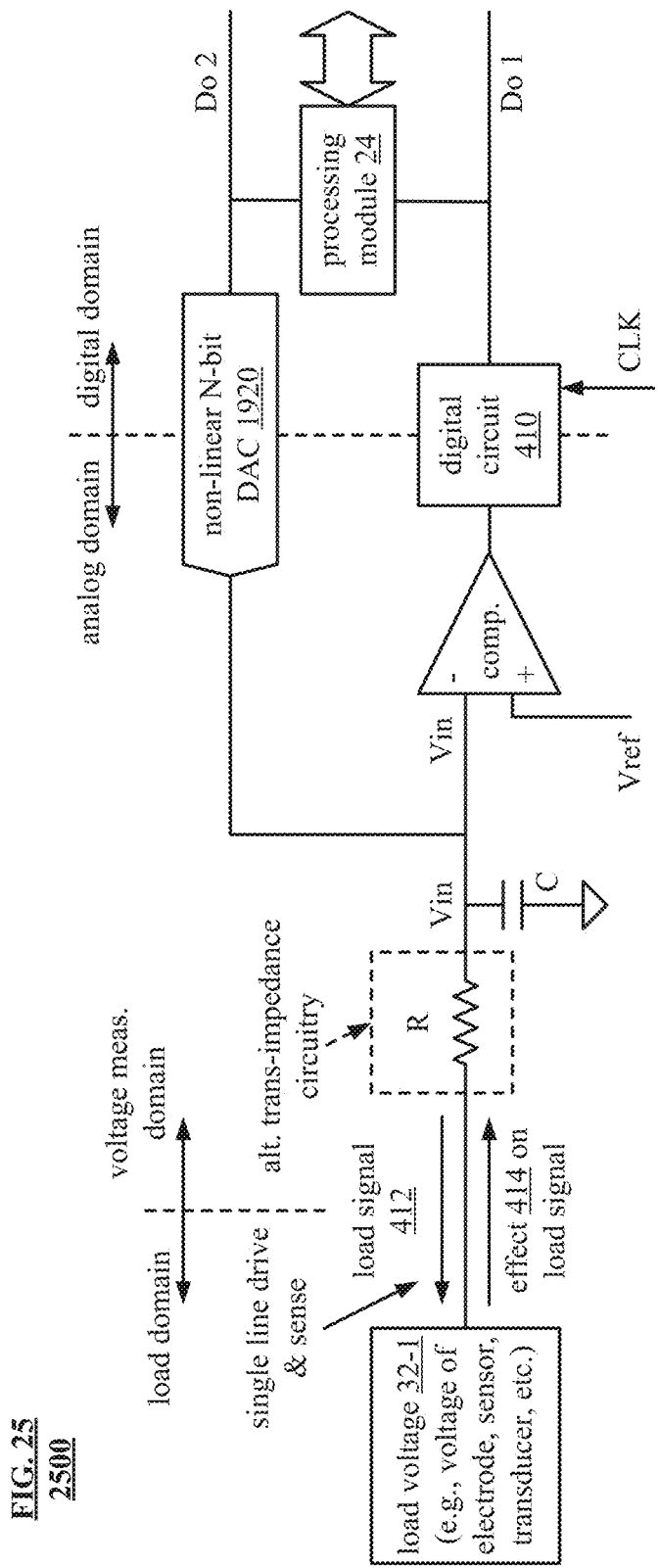
FIG. 25 is a schematic block diagram of an embodiment an ADC that includes a non-linear N-bit DAC and that is operative to perform voltage measurement in accordance with the present invention.

FIG. 25 is a schematic block diagram of an embodiment 2500 an ADC that includes a non-linear N-bit DAC and that is operative to perform voltage measurement in accordance with the present invention. This diagram is similar to FIG. 14A with a difference being that a non-linear N-bit DAC 1920 is implemented in place of the N-bit DAC 420. For example, implementing an appropriate element in-line between the companding ADC and a load voltage 32-1 (e.g., a resistor, R, a trans-impedance circuitry, and/or any appropriate complement to convert voltage to current, etc.) facilitates the conversion of the load voltage 32-1 to a load current that may be detected using such a companding ADC. In such an example, the non-linear N-bit DAC 1920 within the companding ADC operates based on a function of Do 2. In an example that includes a resistor, R, implemented non-linear N-bit DAC 1920, the Do 2 itself is an inverse function of the load voltage 32-1 divided by R (e.g., function of Vload/R).

Certain of the following diagrams show the use of one or both of a PNP transistor (alternatively, Positive-Negative-Positive Bipolar Junction Transistor (BJT)) or an NPN transistor (alternatively, Negative-Positive-Positive BJT) to implement the non-linear conversion function. For example, the use of one or both of a PNP transistor or NPN transistor may be used to implement a logarithmic conversion function.

In addition, certain of the following diagrams operate using a N-bit DAC 420-1 that provides an output voltage signal to be received by the base of an NPN transistor or a PNP transistor. In such examples, one or more of an NPN transistor or a PNP transistor is implemented to provide the current that matches or tracks the load current. Certain examples operate by sourcing current, and others operate by sinking current. Even other examples operate by providing both functionality of sourcing current and sinking current as may be required to match or track the load current.

FIG. 26A is a schematic block diagram of an embodiment 2601 an ADC that includes a PNP transistor (alternatively, Positive-Negative-Positive Bipolar Junction Transistor (BJT)) implemented to source current in accordance with the present invention.

Generally speaking, a BJT is a type of transistor including three terminals, a base (B), a collector (C), and an emitter (E). Such a BJT includes two semiconductor junctions that share a thin doped region in between them. Considering an NPN transistor, a thin p-doped region is implemented in between two n-type semiconductor regions thereby forming the two semiconductor junctions. Considering an PNP transistor, a thin n-doped region is implemented in between two p-type semiconductor regions thereby forming the two semiconductor junctions.

With respect to such a transistor, the collector current, $I_c$, as a function of the voltage between the base (B) and emitter (E) is as follows:

$$I_C = I_S \left( e^{\frac{qV_{BE}}{kT}} - 1 \right),$$

where, based on the Shockley diode equation or the diode law,
 $I_s$ is the reverse bias saturation current (alternatively referred to as scale current);
 $V_{BE}$ is the voltage across the semiconductor junction;
 $V_T$ is the thermal voltage, kT/q, which is the Boltzmann constant, k, times temperature, T, divided by electron charge, q.

As such, the value of $V_{BE}$ is the output voltage of the N-bit DAC 420-1, which operates based on a full-scale voltage shown as Vfull_scale, such that the N-bit DAC 420-1 is operative to provide an output voltage up to and including the full-scale voltage shown as Vfull_scale.

Given that $V_{BE}$ is the output voltage of the N-bit DAC 420-1, then it is also the conversion of the Do 2 to an analog signal.

Therefore, the Do 2 is a an inverse function of the above equation showing the collector current, $I_c$, as follows:

$$Do2 = V_{BE} \approx \frac{kT}{q} \ln\left(\frac{I_C}{I_S}\right)$$

The full-scale voltage shown as Vfull_scale is a reference voltage for the N-bit DAC 420-1, which also operates to control the full-scale output current. FIG. 28B and FIG. 28C show examples by which a temperature independent full-scale reference circuit may be implemented.

Referring again to FIG. 26A, this diagram shows a PNP transistor implemented to source current to a node that connects to the load 32 to match and track the load current.

FIG. 26B is a schematic block diagram of an embodiment 2602 an ADC that includes an NPN transistor (alternatively, Negative-Positive-Positive BJT) implemented to sink current in accordance with the present invention. This diagram shows an NPN transistor implemented to sink current from a node that connects to the load 32 to match and track the load current.

Figure 27:
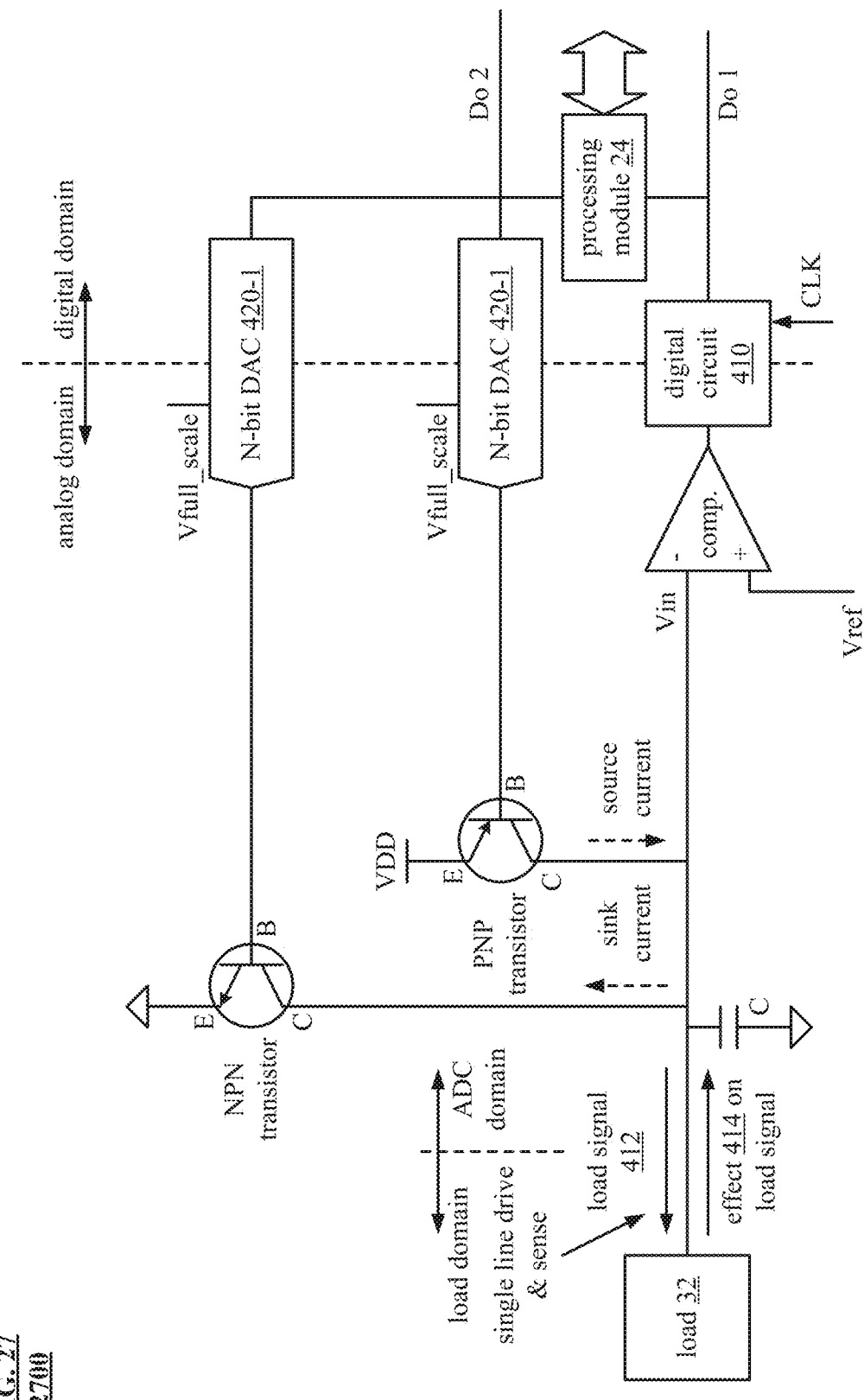
FIG. 27 is a schematic block diagram of an embodiment an ADC that includes both a PNP transistor implemented to source current and an NPN transistor implemented to sink current in accordance with the present invention.

FIG. 27 is a schematic block diagram of an embodiment 2700 an ADC that includes both a PNP transistor implemented to source current and an NPN transistor implemented to sink current in accordance with the present invention. This diagram shows both a PNP transistor implemented to source current to a node that connects to the load 32 to match and track the load current and also an NPN transistor implemented to sink current from a node that connects to the load 32 to match and track the load current. In cooperation with one another, both the PNP transistor and the NPN transistor can operate either to sink or source current as may be needed to match and track the load current.

Figure 28A:
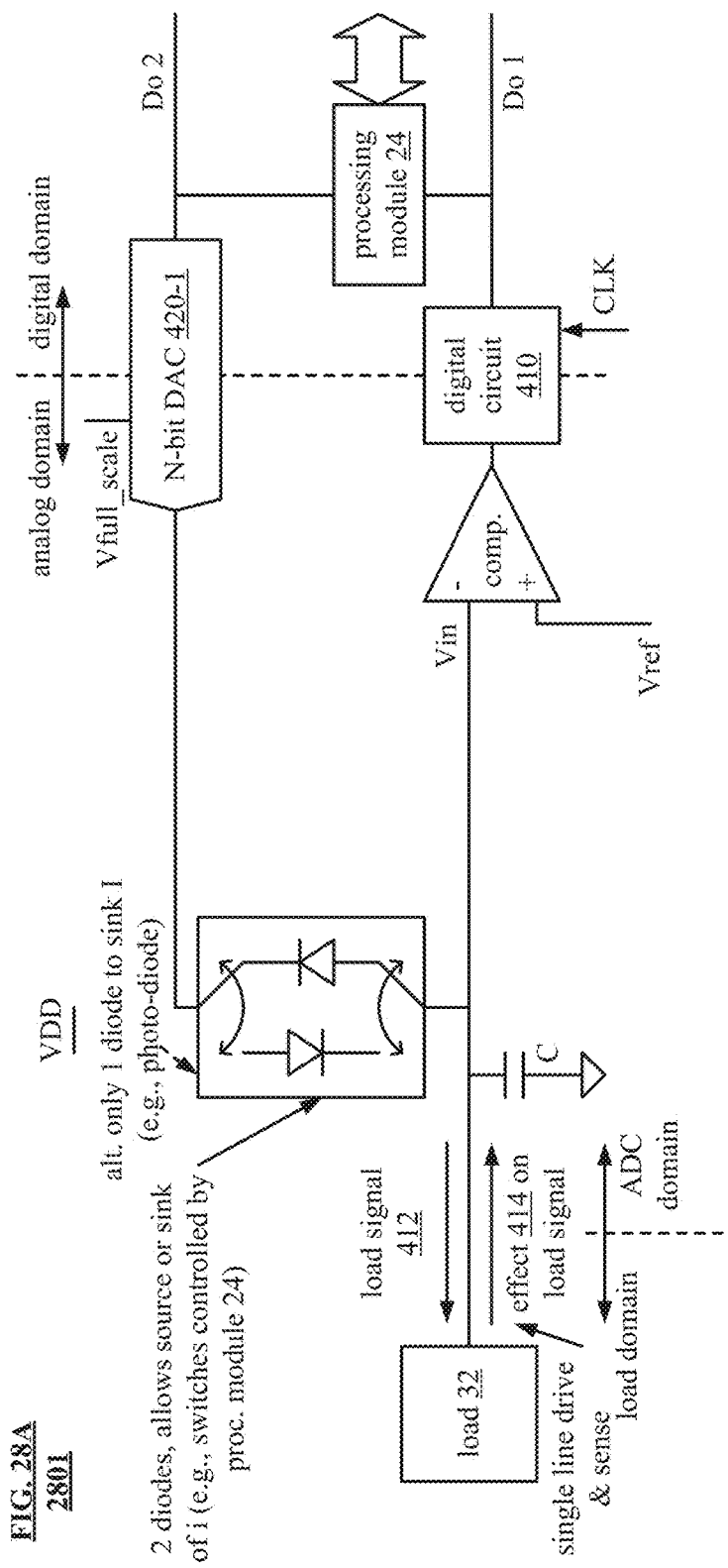
FIG. 28A is a schematic block diagram of an embodiment an ADC that includes diodes implemented to source and/or sink current in accordance with the present invention.
Figure 28C:
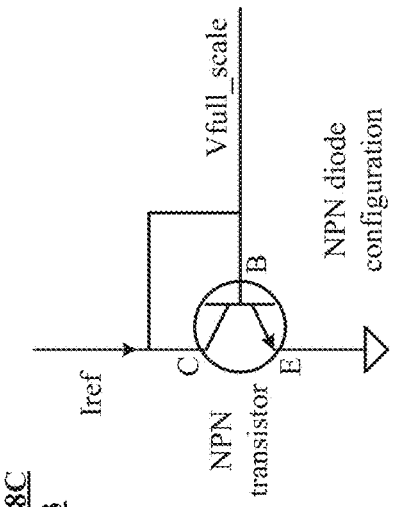
FIG. 28C is a schematic block diagram of an embodiment an NPN transistor diode configuration operative to generate a full scale voltage signal in accordance with the present invention.
Figure 28B:
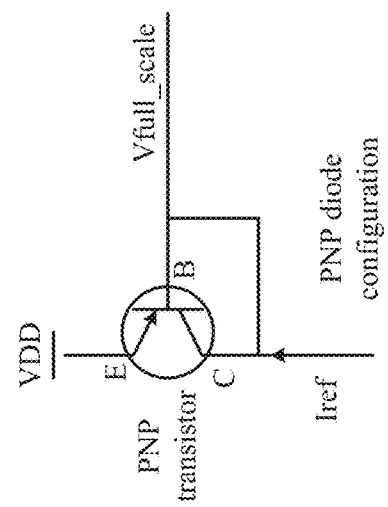
FIG. 28B is a schematic block diagram of an embodiment a PNP transistor diode configuration operative to generate a full scale voltage signal in accordance with the present invention.

FIG. 28A is a schematic block diagram of an embodiment 2801 an ADC that includes diodes implemented to source and/or sink current in accordance with the present invention. This diagram shows the two diodes implemented and controlled using switches, such as being controlled by the processing module 24, to provide for sinking or sourcing current to or from the node that connects to the load 32 to match and track the load current.

FIG. 28B is a schematic block diagram of an embodiment 2802 a PNP transistor diode configuration operative to generate a full scale voltage signal in accordance with the present invention. In addition, note that one way to have a temperature independent full-scale reference current is to use a PNP or NPN diode configuration to generate the full-scale voltage (Vfull_scale) based on an applied reference current Iref. This is to form a current mirror. The output bipolar transistor current to the load is a mirror copy of the reference current, Iref, which is scaled by the voltage value provided by the N-bit DAC 420-1. The reference current is applied to the collector of the PNP (or NPN) and the base is connected to the collector to form a diode configuration. The base voltage of the PNP is the full-scale voltage (Vfull_scale) that is applied to the N-bit DAC. Such a configuration for a PNP transistor is shown with respect to FIG. 28B. Such a configuration for an NPN transistor is shown with respect to FIG. 28B.

FIG. 28C is a schematic block diagram of an embodiment 2803 an NPN transistor diode configuration operative to generate a full scale voltage signal in accordance with the present invention.

Such implementations of a companding ADC using one or more NPN transistors, PNP transistors, and/or diodes provide a number of advantages over prior art ADCs. For example, they may be operated using extremely low power. Also, they operate to provide direct conversion of a digital output (e.g., Do 2) that is logarithmically proportional to the input current. Moreover, using an appropriate implementation, such as that described to provide a temperature independent full-scale reference current, such a companding ADC is temperature independent as opposed to the prior art ADCs, which are temperature dependent. Also, the accuracy and operation of such a companding ADC is independent of the $I_s$ current of the bipolar transistor [reverse bias saturation current (alternatively referred to as scale current)], which can have very wide tolerance across components.

Certain of the following diagrams show the use of one or both of a P-channel or P-type metal-oxide-semiconductor field-effect transistor (MOSFET) (alternatively, PMOS transistor) or an N-channel or N-type metal-oxide-semiconductor field-effect transistor (MOSFET) (alternatively, NMOS transistor) to implement the non-linear conversion function. For example, the use of one or both of a PMOS transistor or an NMOS transistor may be used to implement a logarithmic conversion function.

In addition, certain of the following diagrams operate using a N-bit DAC 420-1 that provides an output voltage signal to be received by the gate of an NMOS transistor or a PMOS transistor. In such examples, one or more of an NMOS transistor or a PMOS transistor is implemented to provide the current that matches or tracks the load current. Certain examples operate by sourcing current, and others operate by sinking current. Even other examples operate by providing both functionality of sourcing current and sinking current as may be required to match or track the load current.

FIG. 29A is a schematic block diagram of an embodiment 2901 an ADC that includes a P-channel or P-type metal-oxide-semiconductor field-effect transistor (MOSFET) (alternatively, PMOS transistor) implemented to source current in accordance with the present invention.

For example, the use of one or both of an NMOS transistor or a PMOS transistor operates as a square root conversion function. For example, the drain current, ID, of a MOSFET is as follows:

$$I_D = \frac{\mu C_{OX}}{2} \frac{W}{L}(V_{GS} - V_T)^2,$$

where $V_{GS}$ is the voltage across the gate (G) to source (S) junction of the MOSFET;

$V_T$ is the thermal voltage, kT/q, which is the Boltzmann constant, k, times temperature, T, divided by electron charge, q;

W is gate width;

L is gate length;

$\mu C_{ox}$ is a process transconductance parameter; and $\mu C_{ox}$ (W/L) is a MOSFET transconductance parameter.

As such, the voltage across the gate (G) to source (S) junction of the MOSFET, $V_{GS}$, is the output voltage of the N-bit DAC 420-1. As such, the value of $V_{GS}$ is the output voltage of the N-bit DAC 420-1.

Given that $V_{GS}$ is the output voltage of the N-bit DAC 420-1, then it is also the conversion of the Do 2 to an analog signal.

Therefore, the Do 2 (shown as Do in the equation below) is an inverse function of the above equation showing the drain current, ID, as follows:

$$Do = V_{GS} = \sqrt{\frac{2L}{\mu C_{OX} W} I_D} - V_T$$

As can be seen, this shows the Do 2 (shown as Do in the equation above) as being a square root function of the input current, which is the drain current, ID.

Also, note that parallel measurement similar to the log ratio-metric measurement may be used to remove the dependence on $V_T$, which is the thermal voltage, kT/q, and which varies as a function of temperature. For example, a similar diode configuration and Iref current mirror as in the bipolar transistor variant can be applied here with respect to MOSFET devices.

For example, consider generating a first digital output signal, shown as Do1 below, and also a first digital output signal, shown as Do2 below:

$$Do_1 = V_{GS} = \sqrt{\frac{2L}{\mu C_{OX} W} I_{D1}} - V_T, \text{ and}$$

$$Do_2 = V_{GS} = \sqrt{\frac{2L}{\mu C_{OX} W} I_{D2}} - V_T,$$

then the difference between them is as follows:

$$Do_1 - Do_2 = \sqrt{\frac{2L}{\mu C_{OX} W} I_{D1}} - \sqrt{\frac{2L}{\mu C_{OX} W} I_{D2}},$$

which is temperature independent and has no dependence on $V_T$, which is the thermal voltage, kT/q.

Referring again to FIG. 29A, this diagram shows a PMOS transistor implemented to source current to a node that connects to the load 32 to match and track the load current.

FIG. 29B is a schematic block diagram of an embodiment 2902 an ADC that includes an N-channel or N-type metal-oxide-semiconductor field-effect transistor (MOSFET) (alternatively, NMOS transistor) implemented to sink current in accordance with the present invention. This diagram shows an NMOS transistor implemented to sink current from a node that connects to the load 32 to match and track the load current.

Figure 30:
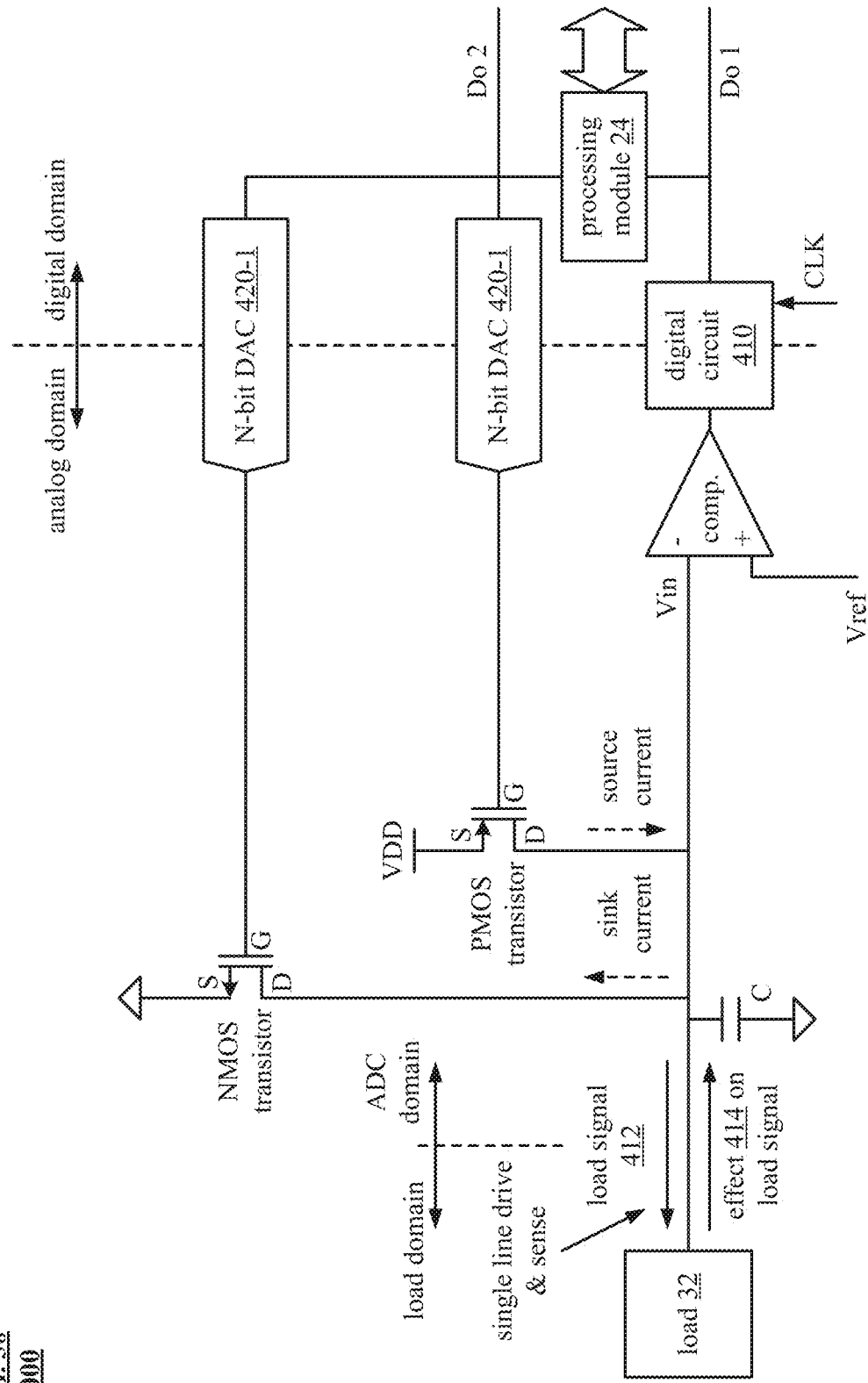
FIG. 30 is a schematic block diagram of an embodiment an ADC that includes both a PMOS transistor implemented to source current and an NMOS transistor implemented to sink current in accordance with the present invention.

FIG. 30 is a schematic block diagram of an embodiment 3000 an ADC that includes both a PMOS transistor implemented to source current and an NMOS transistor implemented to sink current in accordance with the present invention. This diagram shows both a PMOS transistor implemented to source current to a node that connects to the load 32 to match and track the load current and also an NMOS transistor implemented to sink current from a node that connects to the load 32 to match and track the load current. In cooperation with one another, both the PMOS transistor and the NMOS transistor can operate either to sink or source current as may be needed to match and track the load current.

Figure 31:
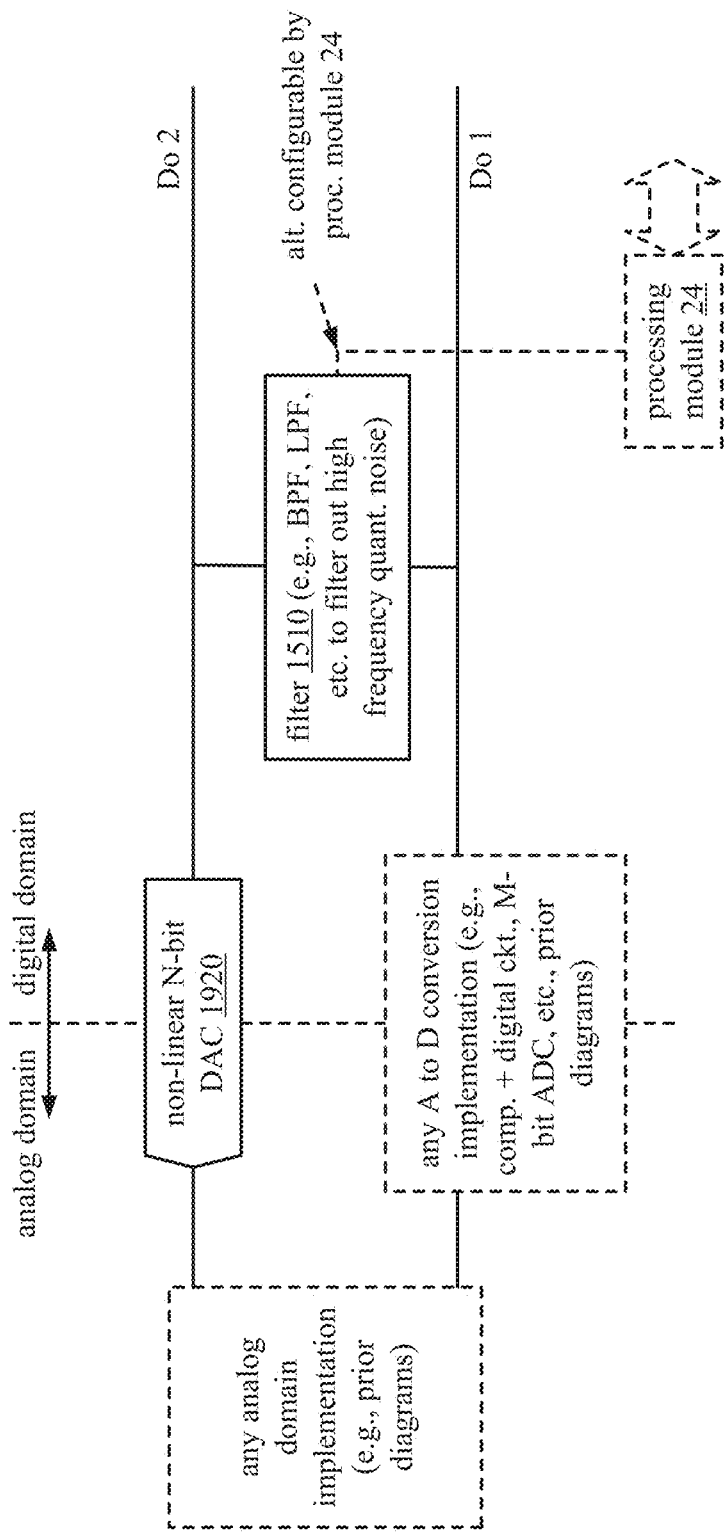
FIG. 31 is a schematic block diagram showing an embodiment of digital domain filtering within an ADC that includes a non-linear N-bit DAC in accordance with the present invention.

FIG. 31 is a schematic block diagram showing an embodiment 3100 of digital domain filtering within an ADC that includes a non-linear N-bit DAC in accordance with the present invention. This diagram is similar to FIG. 15 with a difference being that a non-linear N-bit DAC 1920 is implemented in place of the N-bit DAC 420.

Figure 32:
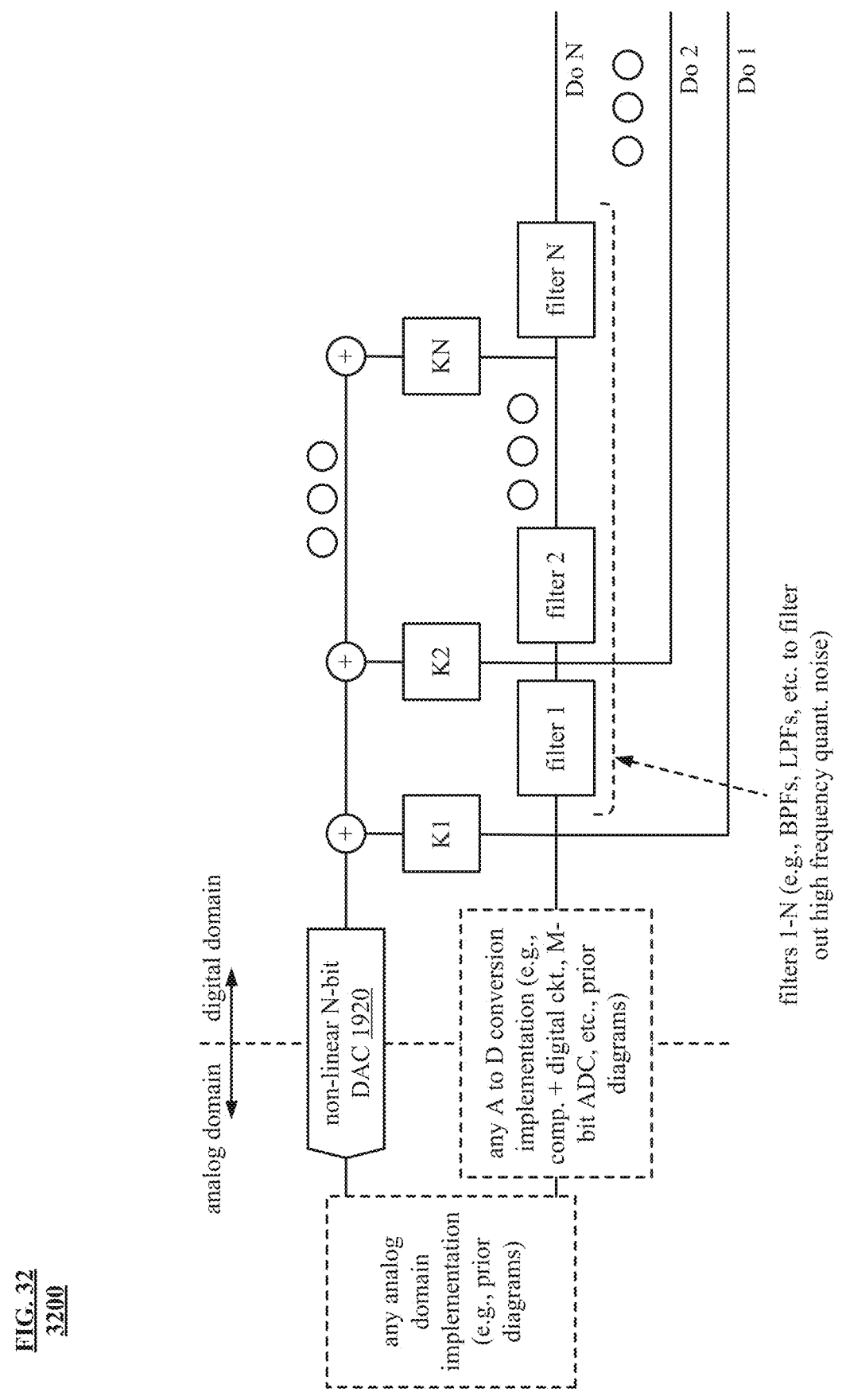

FIG. 32 is a schematic block diagram showing an embodiment 3200 of digital domain filtering using cascaded filters within an ADC that includes a non-linear N-bit DAC in accordance with the present invention. This diagram is similar to FIG. 16 with a difference being that a non-linear N-bit DAC 1920 is implemented in place of the N-bit DAC 420.

FIG. 33 is a schematic block diagram showing another embodiment 3300 of digital domain filtering using configurable/adjustable cascaded filters within an ADC that includes a non-linear N-bit DAC in accordance with the present invention. This diagram is similar to FIG. 17 with a difference being that a non-linear N-bit DAC 1920 is implemented in place of the N-bit DAC 420.

FIG. 34 is a schematic block diagram showing an embodiment 3400 of one or more processing modules implemented to perform digital domain filtering within an ADC that includes a non-linear N-bit DAC in accordance with the present invention. This diagram is similar to FIG. 18 with a difference being that a non-linear N-bit DAC 1920 is implemented in place of the N-bit DAC 420.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A companding analog to digital converter (ADC) comprising:
  a capacitor that is operably coupled to a load and configured to produce a load voltage based on charging by a load current and a digital to analog converter (DAC) output current, wherein the ADC is coupled to the load via a single line;
  a comparator, wherein, when enabled, the comparator operably coupled and configured to generate a comparator output signal based on the load voltage and a reference voltage;
  a digital circuit that is operably coupled to the comparator, wherein, when enabled, the digital circuit configured to process the comparator output signal to generate a first digital output signal that is representative of a difference between the load voltage and the reference voltage;
  memory that stores operational instructions;
  one or more processing modules operably coupled to the digital circuit and the memory, wherein, when enabled, the one or more processing modules is configured to execute the operational instructions to process the first digital output signal to generate a second digital output signal that is representative of the difference between the load voltage and the reference voltage; and
  a non-linear N-bit digital to analog converter (DAC) that is operably coupled to the one or more processing modules, wherein, when enabled, the non-linear N-bit DAC configured to generate the DAC output current based on a non-linear function of the second digital output signal, wherein N is a positive integer, the DAC output current tracks the load current, and the load voltage tracks the reference voltage.

2. The companding ADC of claim 1, wherein the comparator is further configured to:
receive the load voltage via a first input of the comparator;
receive a reference voltage via a second input of the comparator; and
compare the load voltage to the reference voltage to generate a comparator output signal.

3. The companding ADC of claim 1, wherein the one or more processing modules, when enabled, is further configured to process the first digital output signal in accordance with performing band pass filtering or low pass filtering to generate the second digital output signal that is representative of the difference between the load voltage and the reference voltage.

4. The companding ADC of claim 1, wherein a digital comparator includes both the comparator and the digital circuit, wherein when enabled, the digital comparator operably coupled and configured to:
receive the load voltage via a first input of the digital comparator;
receive a reference voltage via a second input of the digital comparator; and
compare the load voltage to the reference voltage to generate the first digital output signal that is representative of the difference between the load voltage and the reference voltage.

5. The companding ADC of claim 1 further comprising:
a decimation filter coupled to the one or more processing modules, wherein, when enabled, the decimation filter operably coupled and configured to process the second digital output signal to generate another digital output signal having a lower sampling rate and a higher resolution than the second digital output signal.

6. The companding ADC of claim 1 further comprising:
a decimation filter coupled to the digital circuit, wherein, when enabled, the decimation filter operably coupled and configured to process the first digital output signal to generate another digital output signal having a lower sampling rate and a higher resolution than the first digital output signal.

7. The companding ADC of claim 1, wherein the companding ADC configured to sense values of the load current across a dynamic range of 7 or 8 decades or 7 or 8 orders of magnitude.

8. The companding ADC of claim 1, wherein the companding ADC configured to sense values of the load current ranging from 10s of pico-amps to 1s of milli-amps.

9. The companding ADC of claim 1, wherein the load includes an electrode, a sensor, or a transducer.

10. The companding ADC of claim 1, wherein the second digital output signal includes a higher resolution than the first digital output signal.

11. The companding ADC of claim 1, wherein the non-linear N-bit DAC configured to generate the DAC output current based on the non-linear function of the second digital output signal to minimize the difference between the load voltage and the reference voltage.

12. A companding analog to digital converter (ADC) comprising:
a capacitor that is operably coupled to a load and configured to produce a load voltage based on charging by a load current and a digital to analog converter (DAC) output current, wherein the ADC is coupled to the load via a single line;
an M-bit analog to digital converter (ADC), wherein when enabled, the M-bit ADC configured to generate a first digital output signal that is representative of a difference between the load voltage and a reference voltage;
memory that stores operational instructions;
one or more processing modules operably coupled to the M-bit ADC and the memory, wherein, when enabled, the one or more processing modules is configured to execute the operational instructions to process the first digital output signal to generate a second digital output signal that is representative of the difference between the load voltage and the reference voltage, wherein the second digital output signal includes a higher resolution than the first digital output signal; and
a non-linear N-bit digital to analog converter (DAC) that is operably coupled to the one or more processing modules, wherein, when enabled, the non-linear N-bit DAC operably coupled and configured to generate the DAC output current based on a non-linear function of the second digital output signal, the DAC output current tracks the load current, and the load voltage tracks the reference voltage, wherein:
N is a first positive integer;
M is a second positive integer greater than or equal to 1; and
N is greater than M.

13. The companding ADC of claim 12, wherein the M-bit ADC is further configured to:
receive the load voltage;
receive a reference voltage; and
compare the load voltage to the reference voltage and generate a first digital output signal that is representative of a difference between the load voltage and the reference voltage.

14. The companding ADC of claim 12, wherein:
N is the first positive integer that is less than or equal to 8; and
M is the second positive integer that is greater than or equal to 1 and less than or equal to 4.

15. The companding ADC of claim 12, wherein the one or more processing modules, when enabled, is further configured to process the first digital output signal in accordance with performing band pass filtering or low pass filtering to generate the second digital output signal that is representative of the load voltage.

16. The companding ADC of claim 12 further comprising:
a decimation filter coupled to the one or more processing modules, wherein, when enabled, the decimation filter operably coupled and configured to process the second digital output signal to generate another digital output signal having a lower sampling rate and a higher resolution than the second digital output signal.

17. The companding ADC of claim 12 further comprising:
a decimation filter coupled to the M-bit ADC, wherein, when enabled, the decimation filter operably coupled and configured to process the first digital output signal to generate another digital output signal having a lower sampling rate and a higher resolution than the first digital output signal.

18. The companding ADC of claim 12, wherein the companding ADC configured to sense values of the load current across a dynamic range of 7 or 12 decades or 7 or 12 orders of magnitude.

19. The companding ADC of claim 12, wherein the load includes an electrode, a sensor, or a transducer.

20. The companding ADC of claim 12, wherein the non-linear N-bit DAC configured to generate the DAC output current based on the non-linear function of the second digital output signal to minimize the difference between the load voltage and the reference voltage.

* * * * *